(12) United States Patent
Harada et al.

(10) Patent No.: US 8,420,292 B2
(45) Date of Patent: Apr. 16, 2013

(54) POLYMER, RESIST COMPOSITION, AND PATTERNING PROCESS

(75) Inventors: Yuji Harada, Joetsu (JP); Takeru Watanabe, Joetsu (JP); Takeshi Sasami, Joetsu (JP); Yuuki Suka, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 184 days.

(21) Appl. No.: 13/006,598

(22) Filed: Jan. 14, 2011

(65) Prior Publication Data

US 2011/0177455 A1    Jul. 21, 2011

(30) Foreign Application Priority Data

Jan. 18, 2010   (JP) ................. 2010-007945

(51) Int. Cl.
- G03F 7/039   (2006.01)
- G03F 7/20   (2006.01)
- G03F 7/30   (2006.01)
- G03F 7/38   (2006.01)

(52) U.S. Cl.
USPC ........ 430/270.1; 430/311; 430/326; 430/330; 430/907; 430/910; 526/242; 526/245; 526/328; 526/329.4

(58) Field of Classification Search ............... None
See application file for complete search history.

(56) References Cited

U.S. PATENT DOCUMENTS

| | | | |
|---|---|---|---|
| 6,312,867 B1 | 11/2001 | Kinsho et al. | |
| 7,244,545 B2 | 7/2007 | Takebe et al. | |
| 7,537,880 B2 | 5/2009 | Harada et al. | |
| 7,771,914 B2 | 8/2010 | Hatakeyama et al. | |
| 2005/0147920 A1* | 7/2005 | Lin et al. | 430/311 |
| 2009/0047602 A1* | 2/2009 | Furuya et al. | 430/285.1 |
| 2009/0053650 A1 | 2/2009 | Irie | |
| 2009/0130592 A1 | 5/2009 | Wang | |
| 2009/0181323 A1 | 7/2009 | Kanda et al. | |
| 2011/0255061 A1* | 10/2011 | Wang et al. | 355/27 |

FOREIGN PATENT DOCUMENTS

| | | |
|---|---|---|
| JP | 9-246173 A | 9/1997 |
| JP | 2000-336121 A | 12/2000 |
| JP | 2006-48029 A | 2/2006 |
| JP | 2006-309245 A | 11/2006 |
| JP | 2007-187887 A | 7/2007 |
| JP | 2007-284381 A | 11/2007 |
| JP | 2008-111103 A | 5/2008 |
| JP | 2008-122932 A | 5/2008 |
| WO | WO 2005/042453 A1 | 5/2005 |

OTHER PUBLICATIONS

Hirayama, "Resist and Cover Material Investigation for Immersion Lithography", 2nd Immersion Workshop, Jul. 11, 2003 (16 pages).
Ito et al., "Aliphatic platforms for the design of 157 nm chemically amplified resists", Proc. SPIE vol. 4690, pp. 18-28, 2002.
Owa et al., "Immersion lithography; its potential performance and issues", Proc. of SPIE, vol. 5040, pp. 724-733, 2003.
Shirota et al., "Development of non-topcoat resist polymers for 193-nm immersion lithography", Proc. of SPIE, vol. 6519, pp. 651905-1 to 651905-11, 2007.

* cited by examiner

*Primary Examiner* — Sin J. Lee
(74) *Attorney, Agent, or Firm* — Birch, Stewart, Kolasch & Birch, LLP

(57) ABSTRACT

A polymer comprising recurring units of formula (1) and having a solubility in alkaline developer which increases under the action of an alkaline developer is provided. The polymer has transparency to radiation of up to 200 nm and improved water repellency, water slip, acid lability and hydrolysis and is useful as an additive polymer to formulate a resist composition. $R^1$ is H, F, methyl, or trifluoromethyl, $R^2$ is a monovalent fluorinated hydrocarbon group, $A_n$ is a (n+1)-valent hydrocarbon or fluorinated hydrocarbon group, and n is 1, 2 or 3.

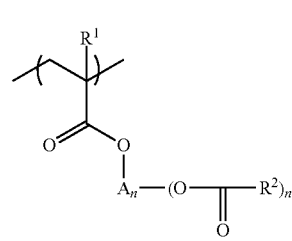

(1)

24 Claims, No Drawings

POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2010-007945 filed in Japan on Jan. 18, 2010, the entire contents of which are hereby incorporated by reference.

TECHNICAL FIELD

This invention generally relates a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. Specifically the invention relates to a polymer useful in formulating a resist composition, a resist composition comprising the polymer, and a process for forming a pattern using the resist composition.

BACKGROUND ART

In the recent drive for higher integration and operating speeds in LSI devices, the pattern rule is made drastically finer. The background supporting such a rapid advance is a reduced wavelength of the light source for exposure. As the light source wavelength has been shortened from i-line (365 nm) of a mercury lamp to KrF excimer laser (248 nm) and further to ArF excimer laser (193 nm), the fabrication of 65-nm node devices is under practical investigation. Additionally, a study is started on the ArF immersion lithography wherein ArF excimer laser is irradiated through water held between the projection lens and the wafer. A combination of a lens having NA of at least 1.2 with ultra-high resolution technology suggests a way to the 45-nm node and forward (see Proc. SPIE Vol. 5040, p 724, 2003).

The ArF immersion lithography has a possibility that water-soluble components in the resist film be leached in immersion water during exposure. Specifically an acid generated during exposure and a basic compound previously added to the resist material can be leached in immersion water. As a result, pattern profile changes and pattern collapse can occur. It is also pointed out that water droplets remaining on the resist film after scanning, though in a minute volume, can penetrate into the resist film to generate defects. It was then proposed to provide a protective coating between the resist film and water to prevent resist components from being leached out and water from penetrating into the resist film, which process is known as topcoat process (see 2nd Immersion Workshop: Resist and Cover Material Investigation for Immersion Lithography, 2003).

In the ArF immersion lithography using a topcoat, a protective coating material which is soluble in alkaline developer is advantageous. This eliminates the step of stripping off the protective coating, offering great cost and process merits. Thus, great efforts have been devoted to develop water-insoluble resist protective coating materials, for example, resins having alkali-soluble units such as fluorinated alcohol, carboxyl or sulfo groups. See WO 2005/42453.

On the other hand, a process for preventing resist components from being leached out and water from penetrating into the resist film without a need for a protective coating material has also been developed, the process being referred to as "topcoatless process". See JP-A 2006-48029 and JP-A 2006-309245. In the topcoatless process, an alkali-soluble hydrophobic polymer is added to the resist material, whereupon the hydrophobic compound is segregated at the resist surface during resist film formation. The process is thus expected to achieve equivalent effects to the topcoat process, and is more cost effective because steps of forming and removing the protective film are unnecessary.

In either of the topcoat and topcoatless processes, the ArF immersion lithography requires a scanning speed of about 300 to 700 mm/sec in order to gain higher throughputs. In the event of such high-speed scanning, if the water repellency of the resist or protective film is insufficient, water droplets may be left on the film surface after scanning. Residual droplets may cause defects. To eliminate such defects, it is necessary to improve the water repellency of the relevant coating film and the flow or mobility of water, i.e., water slip (expressed in terms of receding contact angle) on the film.

One exemplary material known to have excellent water repellency and water slip on film surface is a copolymer of α-trifluoromethylacrylate and norbornene derivative (Proc. SPIE Vol. 4690, p 18, 2002). Another example of the highly water repellent/water slippery material is a fluorinated ring-closing polymerization polymer having hexafluoroalcohol groups on side chains. This polymer is further improved in water slip by protecting hydroxyl groups on side chains with acid labile groups, as reported in Proc. SPIE Vol. 6519, p 651905 (2007).

Although the introduction of fluorine into a polymer structure is effective for improving water repellency and water slip, the introduction of extra fluorine can induce new defects known as "blob defects". Blob defects are likely to form during spin drying after development, particularly when the film has a high surface contact angle after development. One approach for suppressing blob defects is by introducing highly hydrophilic substituent groups (e.g., carboxyl or sulfo groups) into a resin to reduce the surface contact angle after development. However, since these groups serve to reduce the water repellency and water slip of the resin, this approach is not applicable to high-speed scanning. There is a desire to have a resin material which can minimize blob defects while maintaining highly water repellent and water slip properties during immersion lithography.

The highly water repellent/water slippery materials discussed above are expected to be applied not only to the ArF immersion lithography, but also to the resist material for mask blanks. Resist materials for mask blanks are subject to long-term exposure in vacuum. It is pointed out that sensitivity variations or profile changes can occur as an amine component in the resist material is adsorbed to the resist film surface during the long-term exposure. It was then proposed to add a compound having surface active effect to modify the surface of a resist film for preventing adsorption of amine to the resist film.

CITATION LIST

Patent Document 1: WO 2005/42453
Patent Document 2: JP-A 2006-048029
Patent Document 3: JP-A 2006-309245
Patent Document 4: JP-A 2007-187887
Non-Patent Document 1: Proc. SPIE Vol. 5040, p 724, 2003
Non-Patent Document 2: 2nd Immersion Workshop: Resist and Cover Material Investigation for Immersion Lithography (2003)
Non-Patent Document 3: Proc. SPIE Vol. 4690, p 18 (2002)
Non-Patent Document 4: Proc. SPIE Vol. 6519, p 651905 (2007)

SUMMARY OF INVENTION

An object of the invention is to provide a polymer suited as an additive polymer in resist compositions; a resist composition comprising the additive polymer which composition exhibits excellent water repellency and water slip and can be processed by the immersion lithography to form a resist pattern of satisfactory profile after development, the pattern having few development defects; and a pattern forming process using the composition. The additive polymer used herein is highly transparent to radiation with wavelength of up to 200 nm. Various properties of the polymer including water repellency, water slip, fat solubility, acid lability, and hydrolysis may be adjusted by a choice of polymer structure.

The polymer can be prepared from reactants which are readily available and easy to handle.

The inventors have found that when a polymer having fluorinated alkylcarbonyloxy groups in recurring units is used as an additive to formulate a resist composition, the resist composition forms a resist film which has sufficient water repellency and water slip to withstand high-speed scanning without a need for a resist protective film. Since the polymer is susceptible to hydrolysis in alkaline developer, the resist film surface after development is modified hydrophilic, which is effective for substantially reducing blob defects.

Accordingly, the present invention provides a polymer, a resist composition, and a pattern forming process, as defined below.

In one aspect, the invention provides a polymer comprising recurring units having the general formula (1):

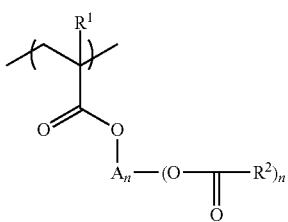

(1)

wherein $R^1$ is hydrogen, fluorine, methyl, or trifluoromethyl, $R^2$ is a straight, branched or cyclic $C_1$-$C_{10}$ monovalent fluorinated hydrocarbon group, $A_n$ is a straight, branched or cyclic $C_1$-$C_{15}$ (n+1)-valent hydrocarbon or fluorinated hydrocarbon group, and n is an integer of 1 to 3, the polymer having a solubility in alkaline developer which increases under the action of an alkaline developer.

In a preferred embodiment, the polymer comprises recurring units having the general formula (1-1):

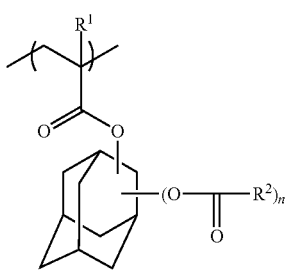

(1-1)

wherein $R^1$, $R^2$ and n are as defined above.

In another preferred embodiment, the polymer comprises recurring units having the general formula (1-2):

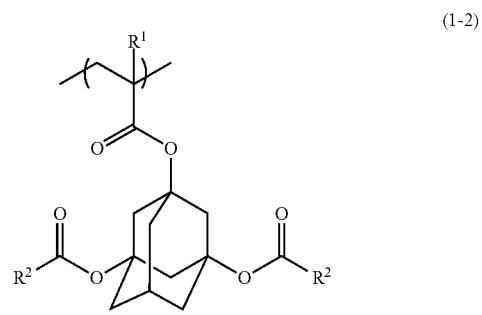

(1-2)

wherein $R^1$ and $R^2$ are as defined above.

Also provided is a polymer comprising recurring units having the general formula (1), (1-1) or (1-2) defined above and recurring units of one or more type selected from the general formulae (2a) to (2h):

(2a)

(2b)

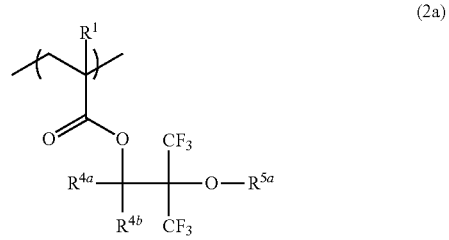

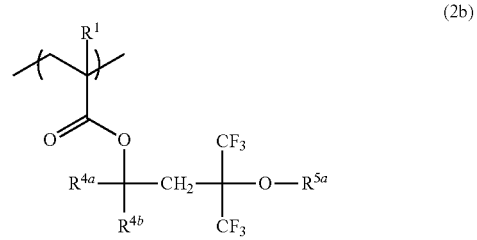

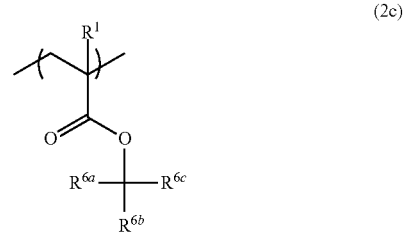

(2c)

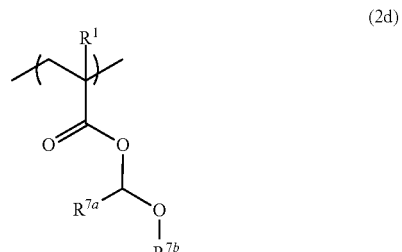

(2d)

(2e)
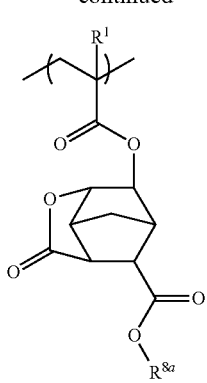

(2f)
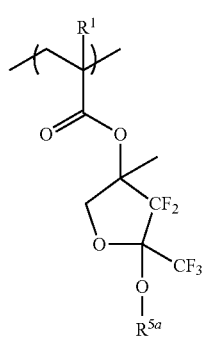

(2g)
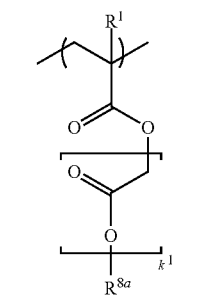

(2h)
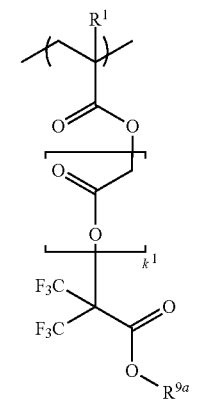

wherein $R^1$ is as defined above, $R^{4a}$ and $R^{4b}$ each are hydrogen or a straight, branched or cyclic $C_1$-$C_{15}$ monovalent hydrocarbon group, $R^{4a}$ and $R^{4b}$ may bond together to form a $C_3$-$C_8$ non-aromatic ring with the carbon atom to which they are attached, $R^{5a}$ is hydrogen, a straight, branched or cyclic $C_1$-$C_{15}$ monovalent hydrocarbon or fluorinated hydrocarbon group in which a —$CH_2$— moiety may be replaced by —O— or —C(=O)—, or an acid labile group, $R^{6a}$, $R^{6b}$ and $R^{6c}$ each are hydrogen or a straight, branched or cyclic $C_1$-$C_{15}$ monovalent hydrocarbon group, $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ monovalent hydrocarbon group, $R^{7b}$ is a straight, branched or cyclic $C_1$-$C_{15}$ monovalent hydrocarbon group, $R^{7a}$ and $R^{7b}$ may bond together to form a $C_3$-$C_8$ non-aromatic ring with the carbon atom to which they are attached, $R^{8a}$ is a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^1$ is an integer of 0 to 6.

In a second aspect, the invention provides a resist composition comprising (A) the polymer defined above, (B) a polymer having a lactone ring-derived structure, hydroxyl-containing structure and/or maleic anhydride-derived structure as a base resin, said polymer becoming soluble in alkaline developer under the action of acid, (C) a compound capable of generating an acid upon exposure to high-energy radiation, and (D) an organic solvent.

In one preferred embodiment, the polymer (B) is selected from the group consisting of (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

In another preferred embodiment, the polymer (B) comprises recurring units of one or more type selected from the general formulae (B)-1 to (B)-6:

(B)-1
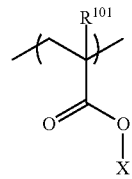

(B)-2
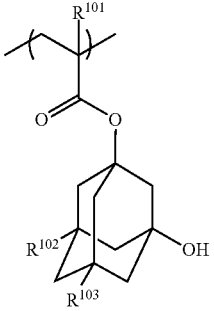

(B)-3
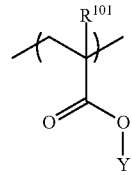

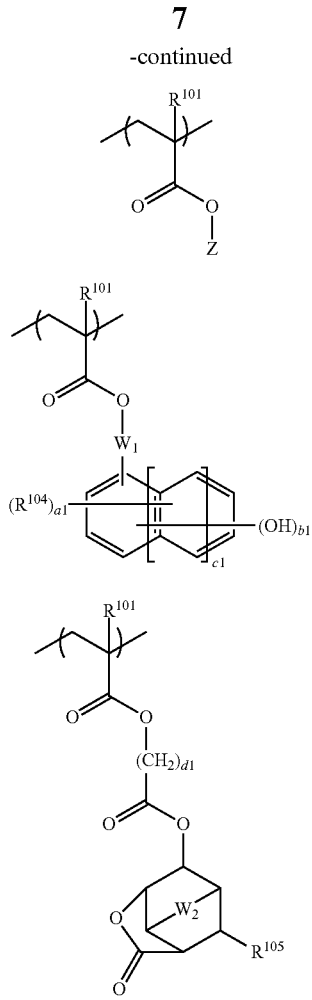

wherein $R^{101}$ is hydrogen, fluorine, methyl or trifluoromethyl, $R^{102}$ and $R^{103}$ are each independently hydrogen or hydroxyl, $R^{104}$ is hydrogen or a straight, branched or cyclic $C_1$-$C_{10}$ monovalent hydrocarbon group, $R^{105}$ is hydrogen or $CO_2R^{106}$, $R^{106}$ is hydrogen or a straight, branched or cyclic $C_1$-$C_{15}$ monovalent hydrocarbon group which may have a halogen or oxygen atom, X is an acid labile group, Y is a substituent group having a lactone structure, Z is hydrogen or a $C_1$-$C_{15}$ monovalent fluorinated hydrocarbon group, or a $C_1$-$C_{15}$ fluoroalcohol-containing substituent group, $W_1$ is a $C_1$-$C_{10}$ divalent organic group which may be substituted with oxygen, $W_2$ is $CH_2$, $CH_2CH_2$, or oxygen, a1 is an integer of 0 to 3, b1 is an integer of 1 to 3, c1 is an integer of 0 to 2, and d1 is an integer of 1 to 3.

In a preferred embodiment, the polymer (A) is added in an amount of 0.1 to 50 parts by weight per 100 parts by weight of the polymer (B).

The resist composition may further comprise (E) a basic compound and (F) a dissolution regulator.

In a third aspect, the invention provides a pattern forming process comprising the steps of (1) applying the resist composition defined above onto a substrate to form a resist coating, (2) heat treating the resist coating and exposing it to high-energy radiation through a photomask, and (3) developing the exposed coating with a developer;

a pattern forming process comprising the steps of (1) applying the resist composition defined above onto a substrate to form a resist coating, (2) heat treating the resist coating and exposing it to high-energy radiation from a projection lens through a photomask while holding a liquid between the substrate and the projection lens, and (3) developing the exposed coating with a developer; or a pattern forming process comprising the steps of (1) applying the resist composition defined above onto a substrate to form a resist coating, (2) forming a protective coating on the resist coating, (3) heat treating the resist coating and exposing it to high-energy radiation from a projection lens through a photomask while holding a liquid between the substrate and the projection lens, and (4) developing with a developer.

Typically the liquid is water. Often the high-energy radiation has a wavelength in the range of 180 to 200 nm.

In a fourth aspect, the invention provides a pattern forming process comprising the steps of (1) applying the resist composition defined above onto a mask blank to form a resist coating, (2) heat treating the resist coating and exposing it in vacuum to electron beam, and (3) developing with a developer.

ADVANTAGEOUS EFFECTS OF INVENTION

The polymer having fluorinated alkylcarbonyloxy groups in recurring units and having a solubility in alkaline developer which increases under the action of an alkaline developer is useful as an additive polymer to formulate a resist composition. The polymer has high transparency to radiation having a wavelength of up to 200 nm and is designed such that any of its properties including water repellency, water slip, fat solubility, acid lability and hydrolysis may be tailored by a choice of a proper structure. The polymer can be prepared from reactants which are readily available and easy to handle.

DESCRIPTION OF EMBODIMENTS

The singular forms "a", "an" and "the" include plural references unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The abbreviation "phr" is parts by weight per 100 parts by weight of the base resin.

Additive Polymer

One embodiment of the invention is a polymer or high-molecular-weight compound comprising recurring units having the general formula (1), (1-1) or (1-2) and having a solubility in alkaline developer which increases under the action of an alkaline developer. For convenience of description, the polymer comprising recurring units of formula (1), (1-1) or (1-2) is referred as "polymer P1," hereinafter.

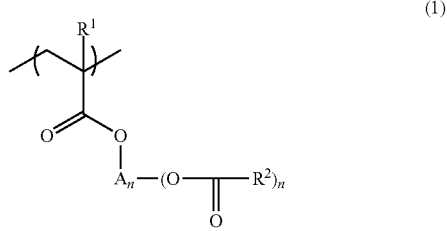

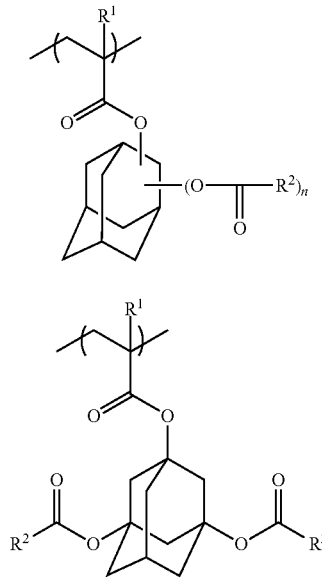

(1-1)

(1-2)

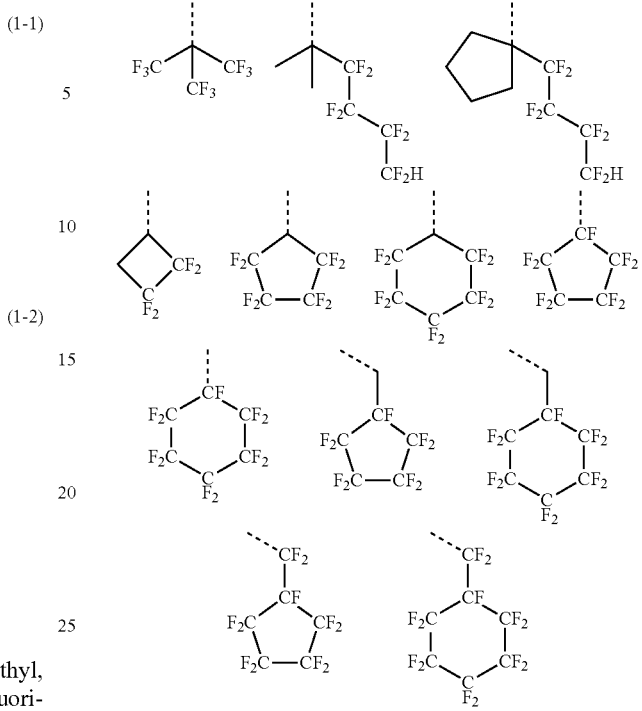

Herein R¹ is hydrogen, fluorine, methyl, or trifluoromethyl, R² is a straight, branched or cyclic $C_1$-$C_{10}$ monovalent fluorinated hydrocarbon group, $A_n$ is a straight, branched or cyclic $C_1$-$C_{15}$ (n+1)-valent hydrocarbon or fluorinated hydrocarbon group, and n is an integer of 1 to 3.

Preferred examples of the straight, branched or cyclic $C_1$-$C_{10}$ monovalent fluorinated hydrocarbon group represented by R² in formula (1), (1-1) or (1-2) are substituted forms of monovalent hydrocarbon groups in which some or all hydrogen atoms are replaced by fluorine atoms. Examples of such monovalent hydrocarbon groups include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

Illustrative non-limiting examples of R² are given below.

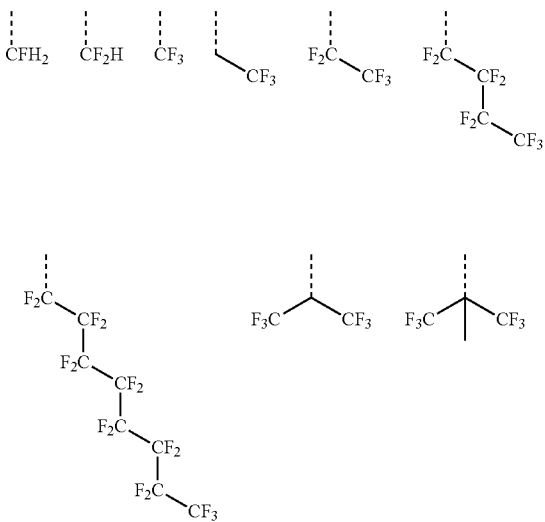

Herein, the broken line designates a valence bond.

Examples of the group represented by $A_n$ in formula (1) are the foregoing monovalent hydrocarbon groups or monovalent fluorinated hydrocarbon groups from which a number "n" of hydrogen atoms have been withdrawn, preferably adamantyl groups from which a number "n" of hydrogen atoms have been withdrawn wherein n is an integer of 1 to 3.

Polymer P1 is characterized in that the recurring units of formula (1), (1-1) or (1-2) each contain fluorine atom. Once polymer P1 is added to a resist composition, polymer P1 itself functions as a surfactant to provide a distribution at the time when a resist film is formed, that polymer P1 is segregated at the resist film surface.

In general, fluorinated polymers exert excellent functions of water repellency and water slip. When polymer P1 is used as a resist additive, it is possible to form a resist film having a surface exerting excellent water repellency and water slip at the same time as its formation. An effect equivalent to the use of resist protective coating material is expectable. This approach is also advantageous in cost because it eliminates the steps of forming and removing a resist protective coating.

Since the recurring unit of formula (1), (1-1) or (1-2) contains a fluorinated ester susceptible to alkaline hydrolysis, the polymer P1 is readily hydrolyzed in an alkaline developer. Then, when polymer P1 is used as a resist additive, the surface of a resist film becomes more hydrophilic after alkaline development and the surface contact angle thereof is significantly reduced. As a result, the occurrence of blob defects may be inhibited.

It is noted that with respect to a polymer comprising an adamantane structure having an alkylcarbonyloxy group, analogous examples are described in JP-A 2007-284381. These polymers are developed as the base resin for resist compositions. In contrast, the polymer comprising units of formula (1), (1-1) or (1-2) according to the invention is characterized by the inclusion of fluorine atoms in an alkylcarbonyloxy group and distinguished from JP-A 2007-284381 in that the polymer functions as an additive, especially surfactant for resist compositions. The introduction of fluorine into an alkylcarbonyloxy group endows a polymer with the desired properties such as surface segregation ability, high water repellency, high water slip, and high alkaline hydrolysis. Since the polymer is easy to control its structure by changing the carbon count, branching coefficient, and fluorine count in $R^2$, the number of fluorinated alkylcarbonyloxy groups, or the like, a polymer having appropriate water repellency, water slip and blob resistance as the resist additive can be prepared.

Examples of the recurring units having formula (1), (1-1) or (1-2) are given below, but not limited thereto.

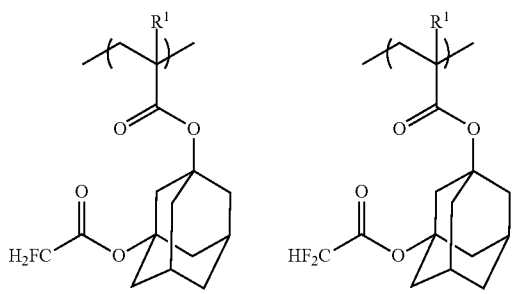

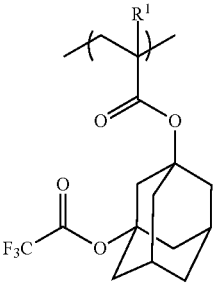

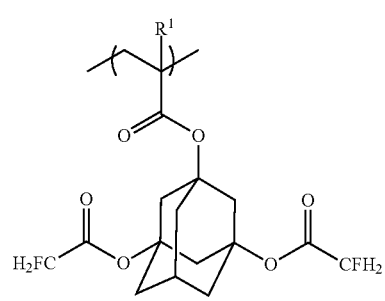

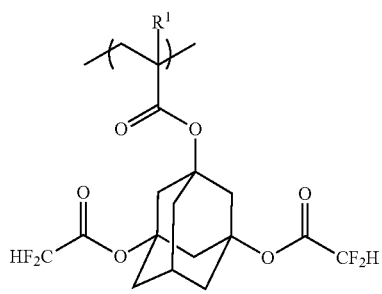

-continued

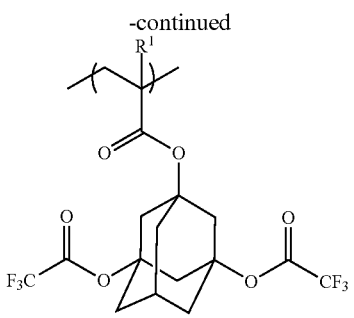

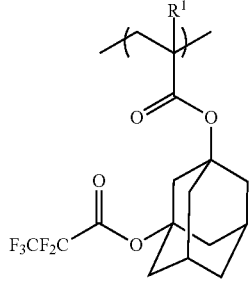

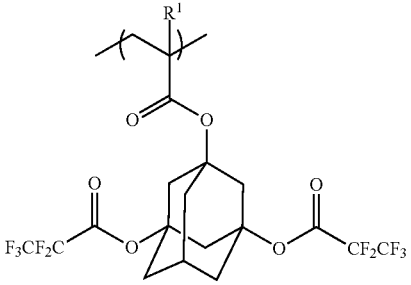

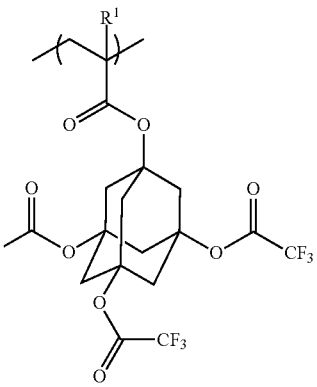

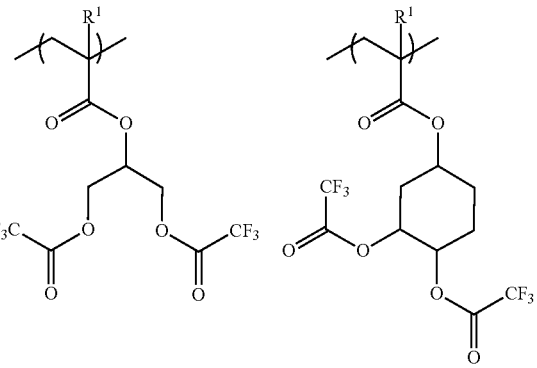

-continued
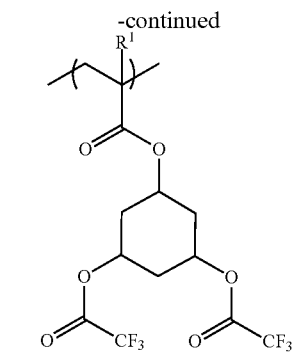
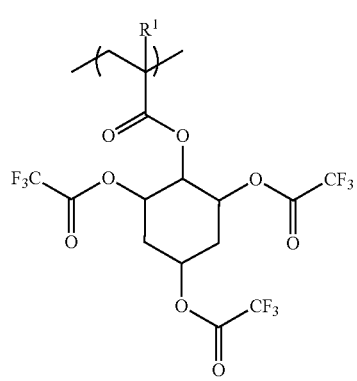
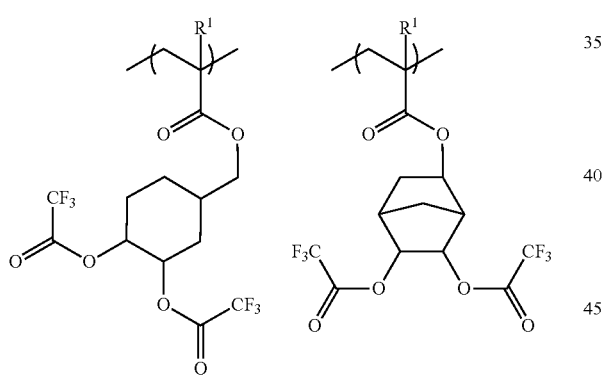
Herein $R^1$ is as defined above.
Polymer P1 may be further improved in water repellency, water slip, alkaline dissolution, and contact angle after development, by incorporating recurring units of one or more type selected from the general formulae (2a) to (2h) in addition to the recurring units of formula (1), (1-1) or (1-2).
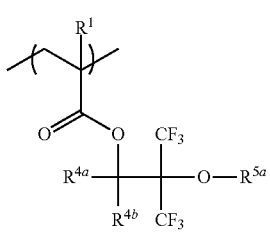
(2a)
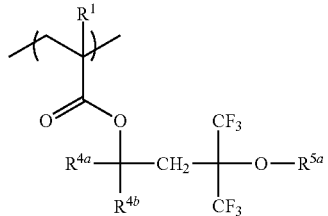
(2b)
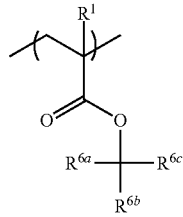
(2c)
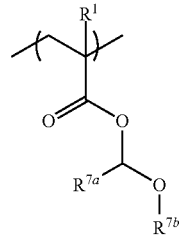
(2d)
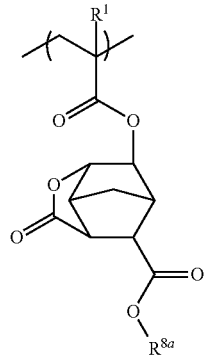
(2e)
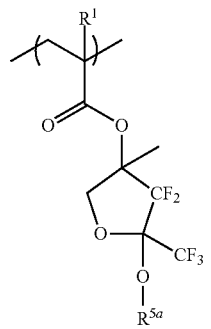
(2f)

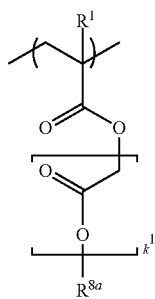

(2g)

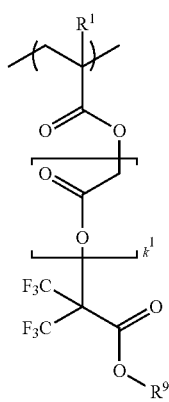

(2h)

Herein $R^1$ is as defined above. $R^{4a}$ and $R^{4b}$ each are hydrogen or a straight, branched or cyclic $C_1$-$C_{15}$ monovalent hydrocarbon group, or $R^{4a}$ and $R^{4b}$ may bond together to form a non-aromatic ring of 3 to 8 carbon atoms with the carbon atom to which they are attached. $R^{5a}$ is hydrogen, a straight, branched or cyclic $C_1$-$C_{15}$ monovalent hydrocarbon or is fluorinated hydrocarbon group, or an acid labile group, and in the case of hydrocarbon group, any constituent moiety —$CH_2$— may be replaced by —O— or —C(=O)—. $R^{6a}$, $R^{6b}$ and $R^{6c}$ each are hydrogen, or a straight, branched or cyclic $C_1$-$C_{15}$ monovalent hydrocarbon group, a pair of $R^{6a}$ and $R^{6b}$, $R^{6a}$ and $R^{6c}$, or $R^{6b}$ and $R^{6c}$ may bond together to form a non-aromatic ring of 3 to 8 carbon atoms with the carbon atom to which they are attached. $R^{7a}$ is hydrogen, or a straight, branched or cyclic $C_1$-$C_{15}$ monovalent hydrocarbon group, $R^{7b}$ is a straight, branched or cyclic $C_1$-$C_{15}$ monovalent hydrocarbon group, a pair of $R^{7a}$ and $R^{7b}$ may bond together to form a non-aromatic ring of 3 to 8 carbon atoms with the carbon atom to which they are attached. $R^{8a}$ is a straight, branched or cyclic $C_1$-$C_{15}$ monovalent fluorinated hydrocarbon group. $R^{9a}$ is a straight, branched or cyclic $C_1$-$C_{15}$ monovalent hydrocarbon or fluorinated hydrocarbon group. Subscript $k^1$ is an integer of 0 to 6.

In formulae (2a) to (2h), examples of the straight, branched or cyclic $C_1$-$C_{15}$ monovalent hydrocarbon groups represented by $R^{4a}$, $R^{4b}$, $R^{5a}$, $R^{6a}$, $R^{6b}$, $R^{6c}$, $R^{7a}$, $R^{8a}$, and $R^{9a}$ include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. A pair of $R^{4a}$ and $R^{4b}$, $R^{6a}$ and $R^{6b}$, $R^{6a}$ and $R^{6c}$, $R^{6b}$ and $R^{6c}$, or $R^{7a}$ and $R^{7b}$ may bond together to form a non-aromatic ring of 3 to 8 carbon atoms with the carbon atom to which they are attached. In this case, these groups each are an alkylene group, examples of which are the foregoing monovalent hydrocarbon groups with one hydrogen atom eliminated, and exemplary rings include cyclopentyl and cyclohexyl.

The straight, branched or cyclic $C_1$-$C_{15}$ monovalent fluorinated hydrocarbon groups represented by $R^{5a}$, $R^{8a}$ and $R^{9a}$ are the foregoing monovalent hydrocarbon groups in which some or all hydrogen atoms are replaced by fluorine atoms. Examples include trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl.

The acid labile group represented by $R^{5a}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

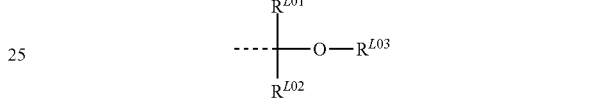

(L1)

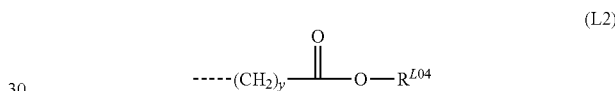

(L2)

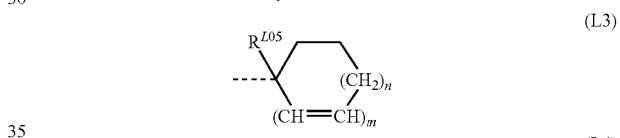

(L3)

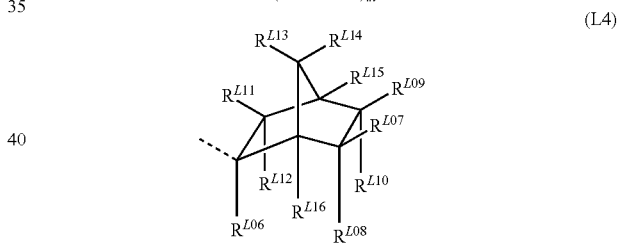

(L4)

Herein $R^{L01}$ and $R^{L02}$ are hydrogen or straight, branched or cyclic alkyl groups of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or an optionally substituted monovalent hydrocarbon group of 1 to 15 carbon atoms. Letter y is an integer of 0 to 6, m is equal to 0 or 1, n is equal to 0, 1, 2 or 3, and 2 m+n is equal to 2 or 3. The broken line denotes a valence bond.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

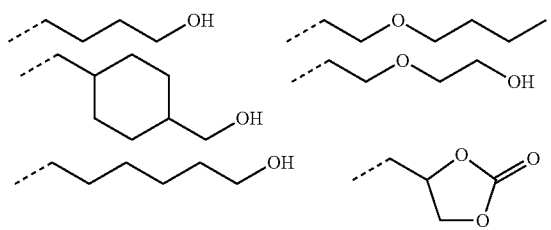

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted $C_1$-$C_{10}$ alkyl groups of $R^{L05}$ include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which one or more methylene moiety is replaced by an oxygen or sulfur atom. Examples of optionally substituted $C_6$-$C_{20}$ aryl groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary $C_1$-$C_{15}$ monovalent hydrocarbon groups of $R^{L07}$ to $R^{L16}$ are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group (typically alkylene) when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

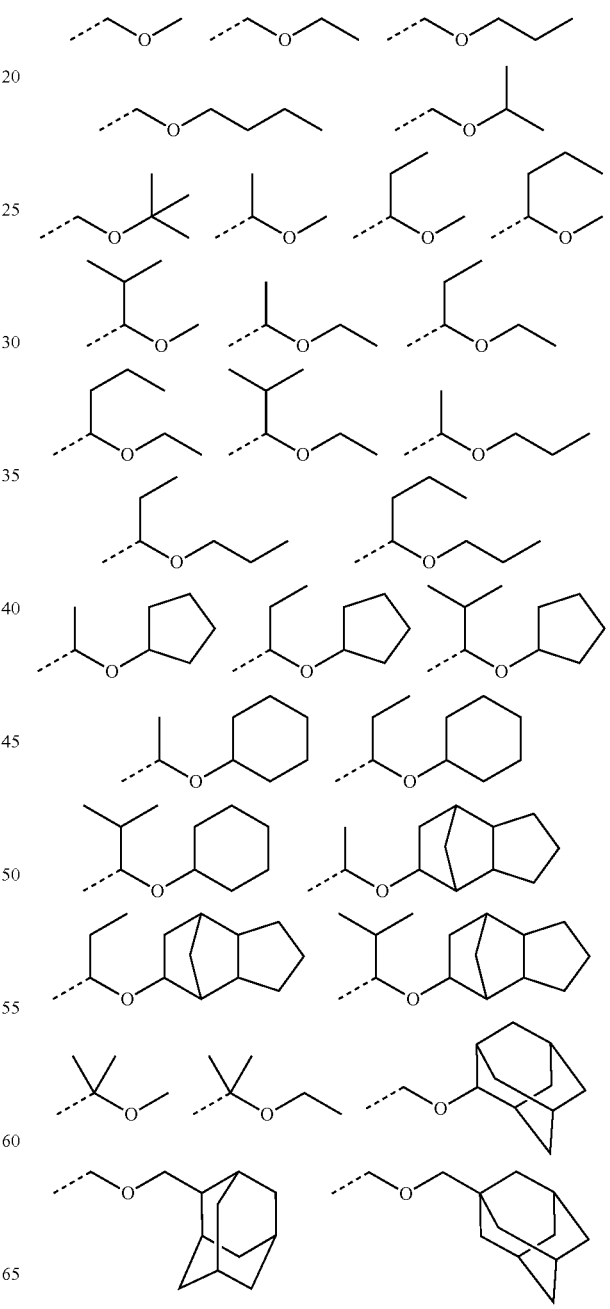

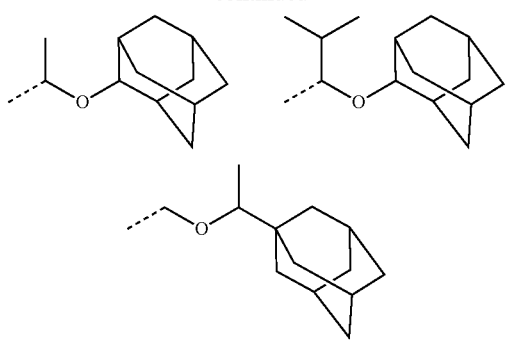

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

(L4-1)

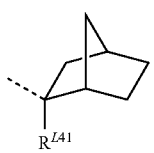

(L4-2)

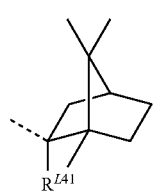

(L4-3)

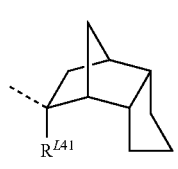

(L4-4)

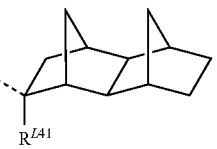

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

(L4-3-2)

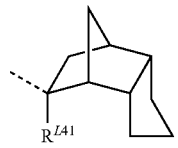

Note that $R^{L41}$ is as defined above.

Similarly, the general formula (L4-4) represents one or a mixture of two or more selected from groups having the following general formulas (L4-4-1) to (L4-4-4).

(L4-4-1)

(L4-4-2)

(L4-4-3)

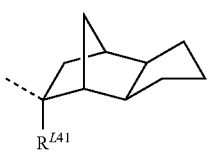

(L4-4-4)

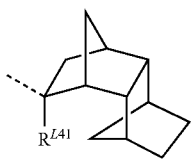

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

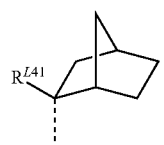

(L4-2-endo)

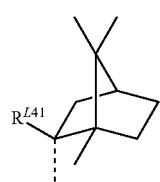

(L4-3-endo)

(L4-4-endo)

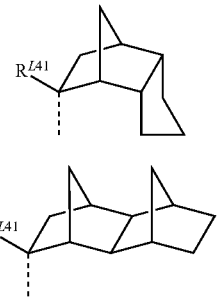

Note that $R^{L41}$ is as defined above.

Illustrative examples of the acid labile group of formula (L4) are given below.

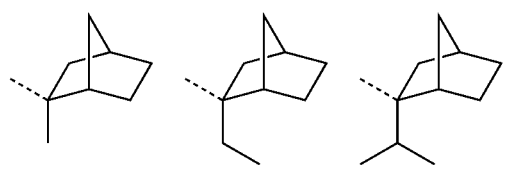

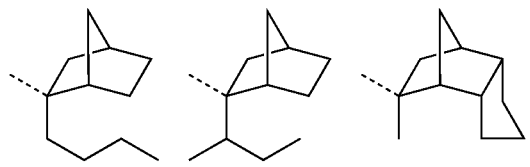
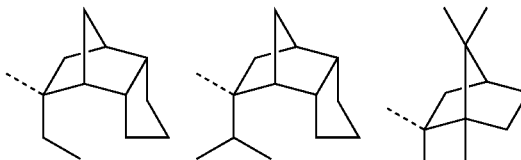
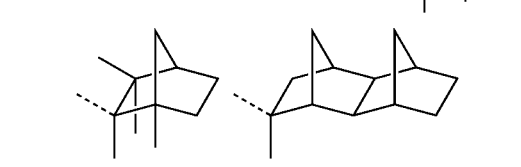
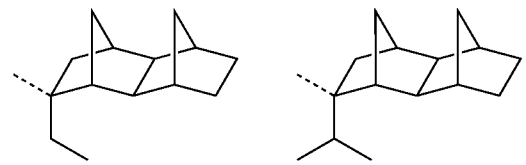

Of the acid labile groups of $R^{5a}$, suitable tertiary $C_4$-$C_{20}$ alkyl groups include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl; suitable trialkylsilyl groups include trimethylsilyl, triethylsilyl, and dimethyl-tert-butylsilyl; and suitable oxoalkyl groups include 3-oxocyclohexyl, 4-methyl-2-oxooxan-4-yl, and 5-methyl-2-oxooxolan-5-yl.

Illustrative examples of the recurring units of formulae (2a) to (2h) are given below, but not limited thereto.

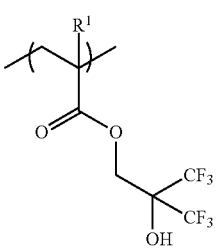
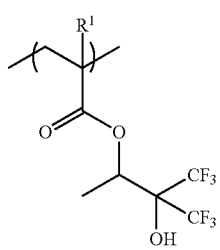

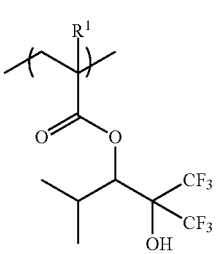
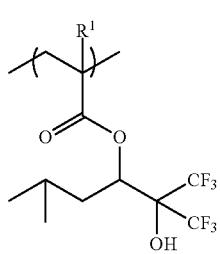

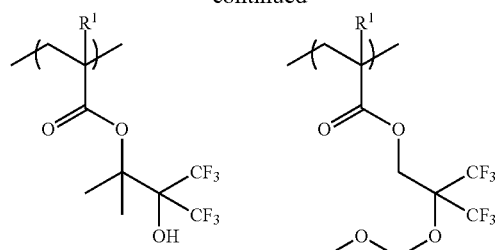
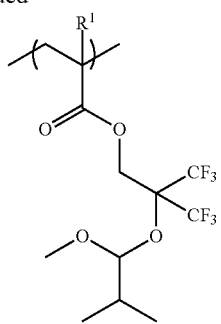
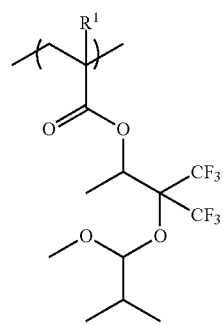
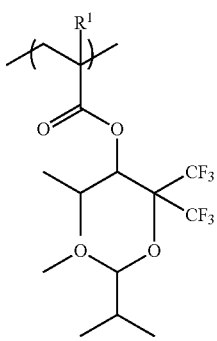
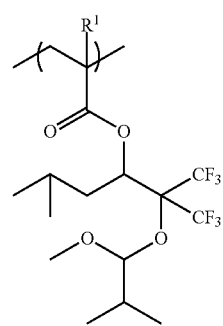
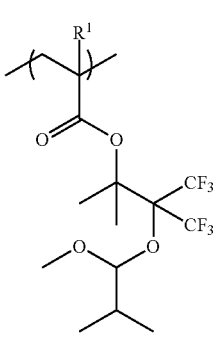
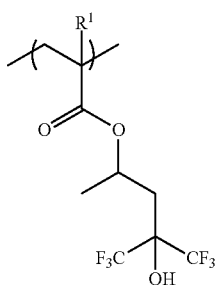
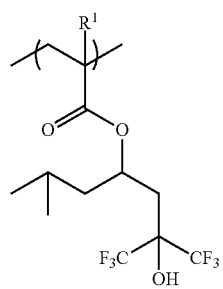
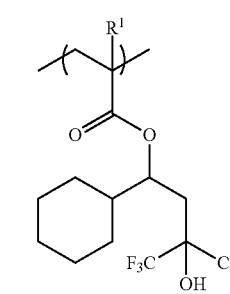
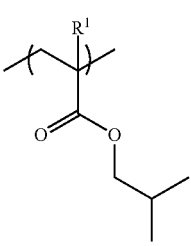
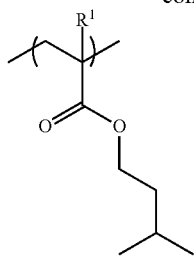
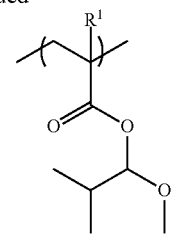
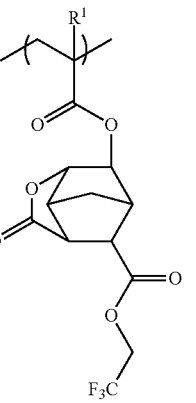
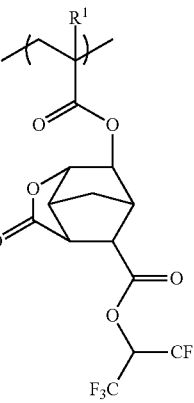
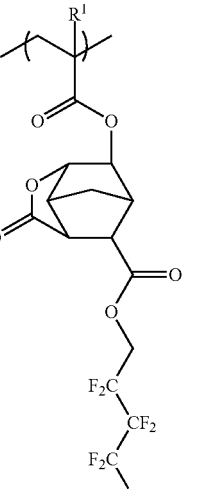
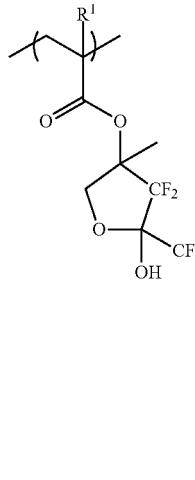
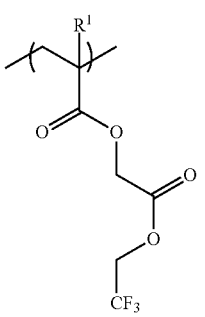
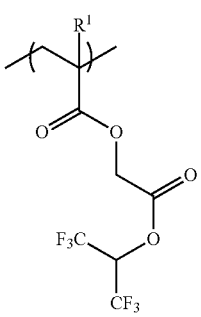

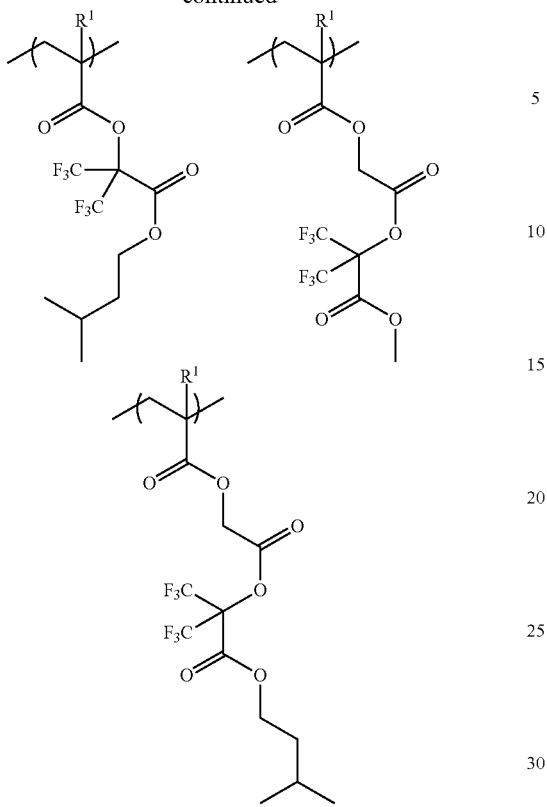

Herein R¹ is as defined above.

Although polymer P1 comprising recurring units of formula (1), (1-1) or (1-2) in combination with recurring units of formulae (2a) to (2h) exerts satisfactory performance, recurring units of one or more types selected from formulae (3a) to (3e), (4a) to (4e), (5a) to (5c), and (6a) to (6c) may be further incorporated therein for the purposes of imparting further water repellency and water slip, and controlling alkaline solubility and developer affinity.

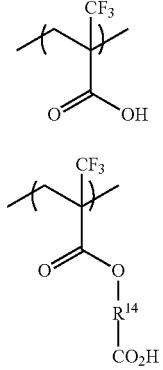

(3a)
(3b)
(3c)

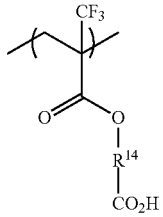

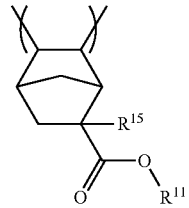

(3d)

(3e)

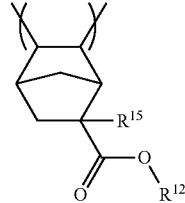

(4a)

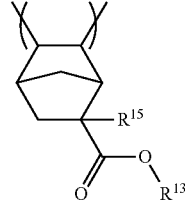

(4b)

(4c)

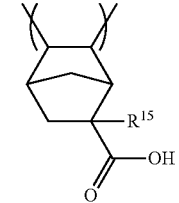

(4d)

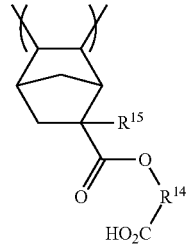

(4e)

-continued (5a) 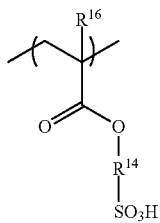

(5b) 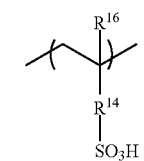

(5c) 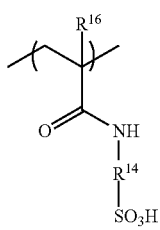

(6a) 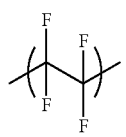

(6b) 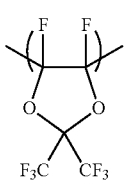

(6c) 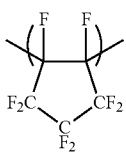

Herein $R^{11}$ is a $C_1$-$C_{15}$ monovalent hydrocarbon or fluorinated hydrocarbon group, $R^{12}$ is an adhesive group, $R^{13}$ is an acid labile group, $R^{14}$ is a single bond or a $C_1$-$C_{15}$ divalent organic group, and $R^{15}$ and $R^{16}$ each are hydrogen, methyl or trifluoromethyl.

Examples of the $C_1$-$C_{15}$ monovalent hydrocarbon or fluorinated hydrocarbon group represented by $R^{11}$ are the same as illustrated for $R^{5a}$ and $R^{8a}$.

The adhesive group represented by $R^{12}$ may be selected from a variety of such groups, typically those groups shown below.

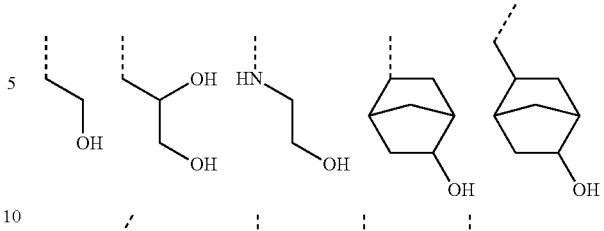

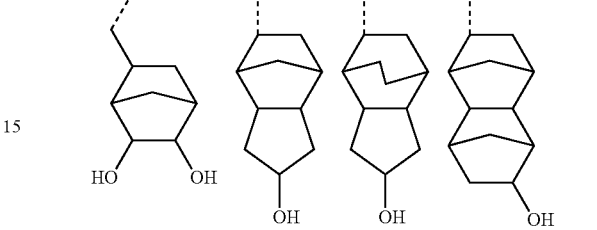

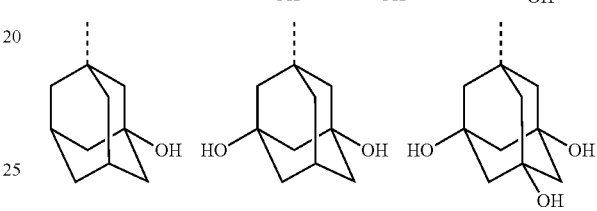

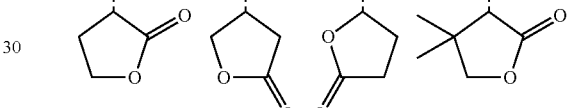

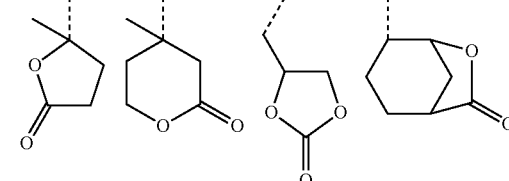

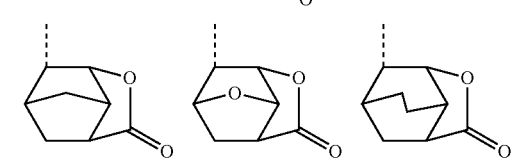

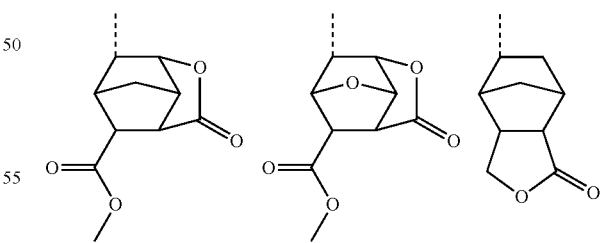

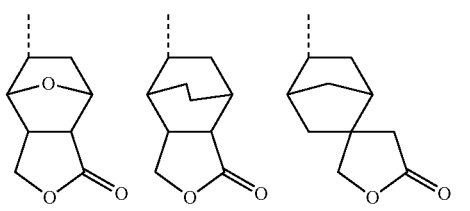

-continued

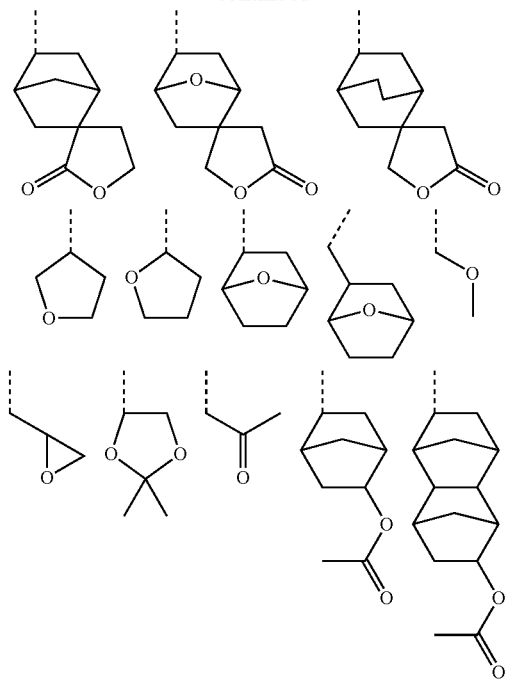

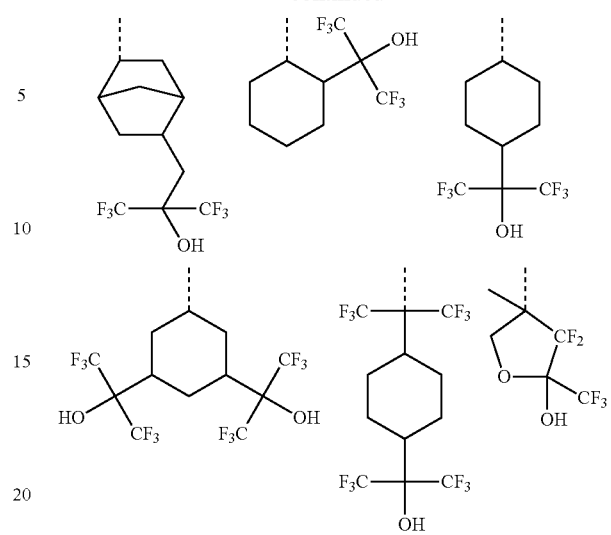

Herein, the broken line designates a valence bond.

The acid labile group represented by $R^{13}$ may be selected from those groups illustrated for $R^{5a}$.

Suitable $C_1$-$C_{15}$ divalent organic groups represented by $R^{14}$ include the above-illustrated monovalent hydrocarbon groups with one hydrogen atom eliminated (e.g., methylene and ethylene) and groups of the following formulae.

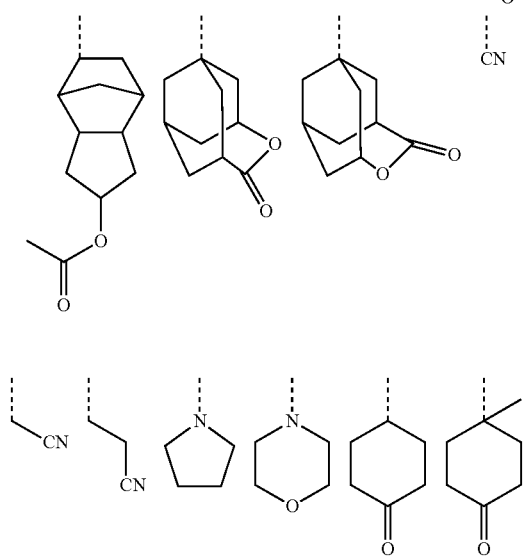

Herein, the broken line designates a valence bond.

Monomer Synthesis

The polymer P1 used herein is characterized by comprising recurring units of formula (1), (1-1) or (1-2) as essential units. Monomers from which these recurring units are derived are may be prepared by any known methods, for example, the method described in JP-A 2007-284381, that is, according to the reaction scheme shown below although the preparation method is not limited thereto.

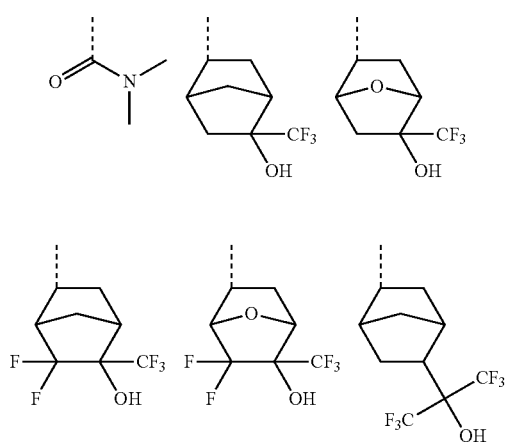

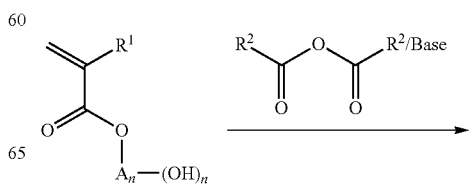

-continued

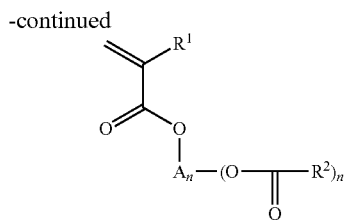

Herein $R^1$, $R^2$, $A_n$ and n are as defined above.

In this exemplary reaction scheme, the reactant is reacted with an acid anhydride containing $R^2$ in the presence of a base. Suitable bases include potassium carbonate, sodium carbonate, sodium hydride, sodium methoxide, sodium ethoxide, potassium t-butoxide, triethylamine, pyridine, and 4-dimethylaminopyridine. The amount of the base used depends on its structure and is typically 0.01 to 10 moles, preferably 1 to 6 moles per mole of hydroxyl group in the reactant.

The reaction may be carried out in a solvent. Examples of the solvent include hydrocarbons such as n-hexane, n-heptane, benzene, toluene, xylene, and cumene, ethers such as tetrahydrofuran, diethyl ether, di-n-butyl ether, and 1,4-dioxane, dimethyl sulfoxide (DMSO), N,N-dimethylformamide (DMF), acetonitrile, and the like, which may be used alone or in admixture.

An appropriate reaction temperature may be selected depending on other reaction conditions, although the reaction is typically carried out at room temperature or under water cooling or ice cooling. The reaction time is determined as appropriate by monitoring the reaction process by thin-layer chromatography (TLC) or gas chromatography (GC) because it is desirable from the yield aspect to drive the reaction to completion. Usually the reaction time is about 0.1 to about 240 hours.

The desired polymerizable ester compound may be obtained from the reaction mixture by ordinary post-treatment such as aqueous work-up or concentration. If necessary, the compound may be purified by standard techniques like recrystallization, chromatography and distillation.

Polymer Synthesis

The polymer P1 used herein may be synthesized by general polymerization processes including radical polymerization using initiators such as 2,2'-azobisisobutyronitrile (AIBN), and ionic (or anionic) polymerization using alkyllithium or the like. The polymerization may be carried out by a standard technique. Preferably polymer P1 is synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of polymer P1, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Polymer P1 may be synthesized by combining suitable monomers selected from polymerizable monomers corresponding to recurring units of formulae (1), (1-1) or (1-2), (2a) to (2h), (3a) to (3e), (4a) to (4e), (5a) to (5c), and (6a) to (6c), adding an initiator and chain transfer agent to the monomer mixture, and effecting polymerization.

In polymer P1 wherein U1 stands for a total molar number of a monomer or monomers corresponding to units of formula (1), (1-1) or (1-2), U2 stands for a total molar number of a monomer or monomers corresponding to units of formulae (2a) to (2h), and U3 stands for a total molar number of a monomer or monomers corresponding to units of formulae (3a) to (3e), (4a) to (4e), (5a) to (5c), and (6a) to (6c), with the proviso that U1+U2+U3=U (=100 mol %), values of U1, U2, and U3 are preferably determined so as to meet:

$0<U1/U<1$, more preferably $0.1 \leq U1/U \leq 0.9$, even more preferably $0.2 \leq U1/U \leq 0.8$, $0 \leq U2/U<1$, more preferably $0.1 \leq U2/U \leq 0.9$, even more preferably $0.2 \leq U2/U \leq 0.8$, and $0 \leq U3/U<1$, more preferably $1 \leq U3/U \leq 0.4$, even more preferably $0 \leq U3/U \leq 0.2$.

In conducting polymerization, a solvent may be used if necessary. Any solvent may be used as long as it does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably polymer P1 has a weight average molecular weight (Mw) of 1,000 to 500,000, and especially 2,000 to 30,000, as determined by gel permeation chromatography (GPC) using polystyrene standards. This is because a polymer with too low a Mw may be dissolvable in water whereas too high a Mw may lead to a decline of alkali solubility or cause coating defectives during spin coating.

In polymer P1, $R^{5a}$ in formula (2a), (2b) and (2f) and $R^{13}$ in formula (3c) and (4c) may be introduced by post-protection reaction. Specifically, a polymer may be synthesized by polymerizing a monomer wherein $R^{5a}$ and $R^{13}$ are hydrogen to synthesize an intermediate polymer, then effecting post-protection reaction to substitute $R^{5a}$ and $R^{13}$ for some or all hydroxyl groups in the intermediate polymer as shown below.

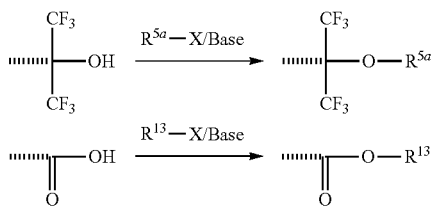

Herein $R^{5a}$ and $R^{13}$ are as defined above, and X is chlorine, bromine or iodine.

The desired (post-protected) polymer is obtainable through post-protection reaction by reacting the intermediate polymer with a base in an amount of 1 to 2 equivalents relative to the desired degree of substitution of hydroxyl groups, and then with $R^{5a}$—X or $R^{13}$—X in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

Resist Composition

When polymer P1 is added to a resist composition, a total amount of polymer(s) P1 is preferably 0.1 to 50 parts, and more preferably 0.5 to 10 parts by weight per 100 parts by weight of a base resin (B). At least 0.1 phr of polymer P1 is effective for improving the receding contact angle with water of a resist film at its surface. When the amount of polymer P1 is up to 50 phr, a resist film has a sufficiently low rate of dissolution in alkaline developer to maintain the height of a resultant fine size pattern.

In the resist composition of the invention, polymer P1 is used in admixture with a base resin (B) to be described below. Since polymer P1 contains a plurality of fluorine atoms, overall polymer P1 functions as a surfactant so that it may segregate in an upper layer of a resist film being spin coated. The resulting resist film displays improved water repellency and water slip on its surface and prevents water-soluble components from being leached out of the resist material. Also, polymer P1 which contains an alkaline hydrolysis-susceptible structure as mentioned above may enhance the hydrophilic property of the resist film surface after development, inhibiting the occurrence of blob defects.

The resist composition contains (B) a base resin or polymer having a lactone ring-derived structure and/or hydroxyl group-containing structure and/or maleic anhydride-derived structure which becomes soluble in alkaline developer under the action of acid. The polymers which can serve as the base resin (B) include (meth)acrylate polymers, (α-trifluoromethyl)acrylate-maleic anhydride copolymers, cycloolefin-maleic anhydride alternating copolymers, polynorbornene, cycloolefin ring-opening metathesis polymerization (ROMP) polymers, hydrogenated cycloolefin ROMP polymers, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, and norbornadiene derivatives, and novolac resins. Examples of these polymers are described in U.S. Pat. No. 7,537,880 or JP-A 2008-111103, paragraphs [0072] to [0120].

The preferred base resin (B) is a polymer comprising recurring units of one or more type selected from the general formulae (B)-1 to (B)-6.

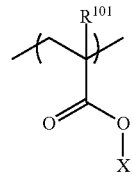 (B)-1

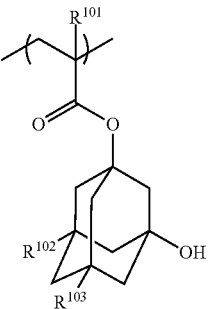 (B)-2

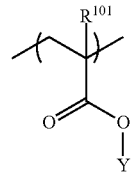 (B)-3

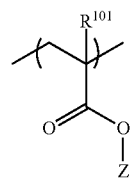 (B)-4

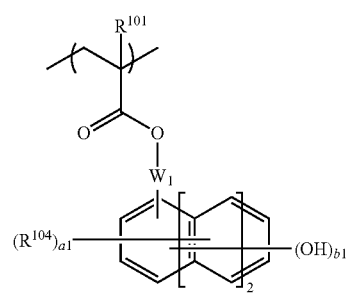 (B)-5

(B)-6

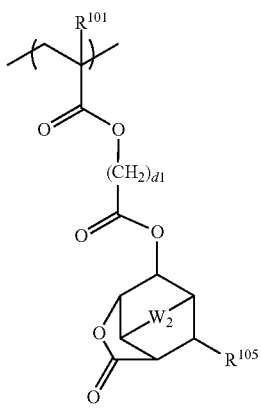

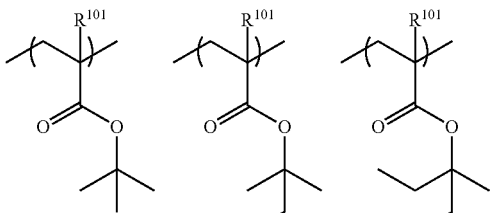

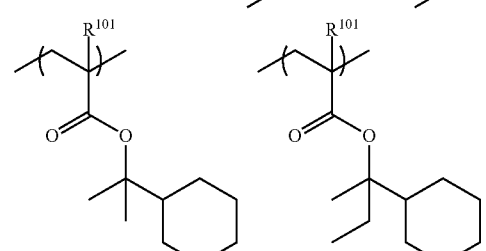

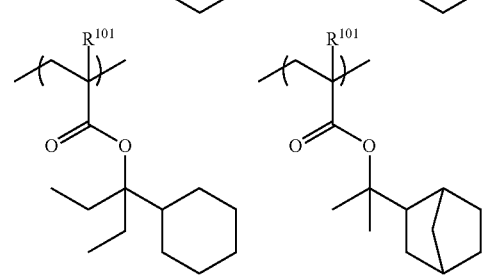

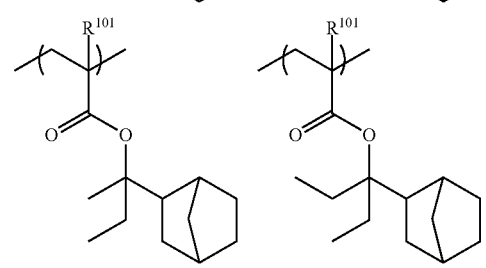

Herein $R^{101}$ is hydrogen, fluorine, methyl or trifluoromethyl, $R^{102}$ and $R^{103}$ are each independently hydrogen or hydroxyl, $R^{104}$ is hydrogen or a straight, branched or cyclic $C_1$-$C_{10}$ monovalent hydrocarbon group, $R^{105}$ is hydrogen or $CO_2R^{106}$, $R^{106}$ is hydrogen or a straight, branched or cyclic $C_1$-$C_{15}$ monovalent hydrocarbon group which may have a halogen or oxygen atom, X is an acid labile group, Y is a substituent group having a lactone structure, Z is hydrogen or a monovalent fluorinated hydrocarbon group, or a $C_1$-$C_{15}$ fluoroalcohol-containing substituent group, $W_1$ is a $C_1$-$C_{10}$ divalent organic group which may be substituted with an oxygen atom, $W_2$ is $CH_2$, $CH_2CH_2$, or oxygen, a1 is an integer of 0 to 3, b1 is an integer of 1 to 3, c1 is an integer of 0 to 2, and d1 is an integer of 1 to 3.

In formula (B)-1, the acid labile group X may be selected from a variety of such groups as exemplified above for $R^{5a}$.

In formula (B)-5, examples of the straight, branched or cyclic $C_1$-$C_{10}$ monovalent hydrocarbon group represented by $R^{104}$ include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

In formula (B)-6, examples of the straight, branched or cyclic $C_1$-$C_{15}$ monovalent hydrocarbon group which may have a halogen or oxygen atom, represented by $R^{106}$, include methyl, ethyl, n-propyl, isopropyl, n-butyl, sec-butyl, isobutyl, tert-butyl, cyclopentyl, cyclohexyl, 1-methylcyclopentyl, 1-ethylcyclopentyl, 1-methylcyclohexyl, 1-ethylcyclohexyl, 2-ethylhexyl, n-octyl, 2-methylbicyclo[2.2.1]heptan-2-yl, 2-ethylbicyclo[2.2.1]heptan-2-yl, 2-methyladamantan-2-yl, 2-ethyladamantan-2-yl, 8-methyltricyclo[5.2.1.0$^{2,6}$]decan-8-yl, 8-ethyltricyclo[5.2.1.0$^{2,6}$]decan-8-yl, 4-methyltetracyclo[6.2.1.1$^{3,6}$.0$^{2,7}$]dodecan-4-yl, 4-ethyltetracyclo[6.2.1.1$^{3,6}$.0$^{2,7}$]dodecan-4-yl, methoxymethyl, ethoxymethyl, methoxyethyl, ethoxyethyl, and methoxyethoxyethyl, exemplary monovalent fluorinated hydrocarbon groups described for $R^2$, and exemplary adhesive groups described for $R^{12}$.

Examples of recurring units of formula (B)-1 are given below, but not limited thereto.

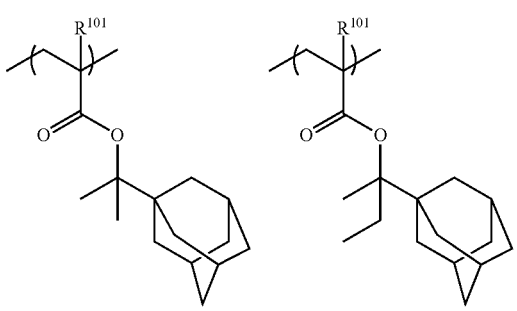

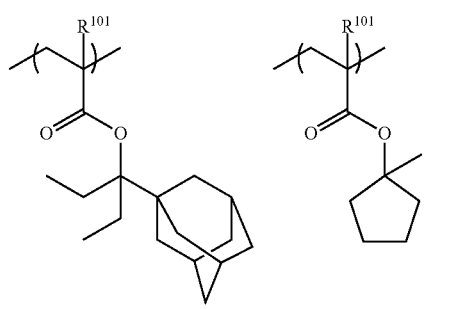

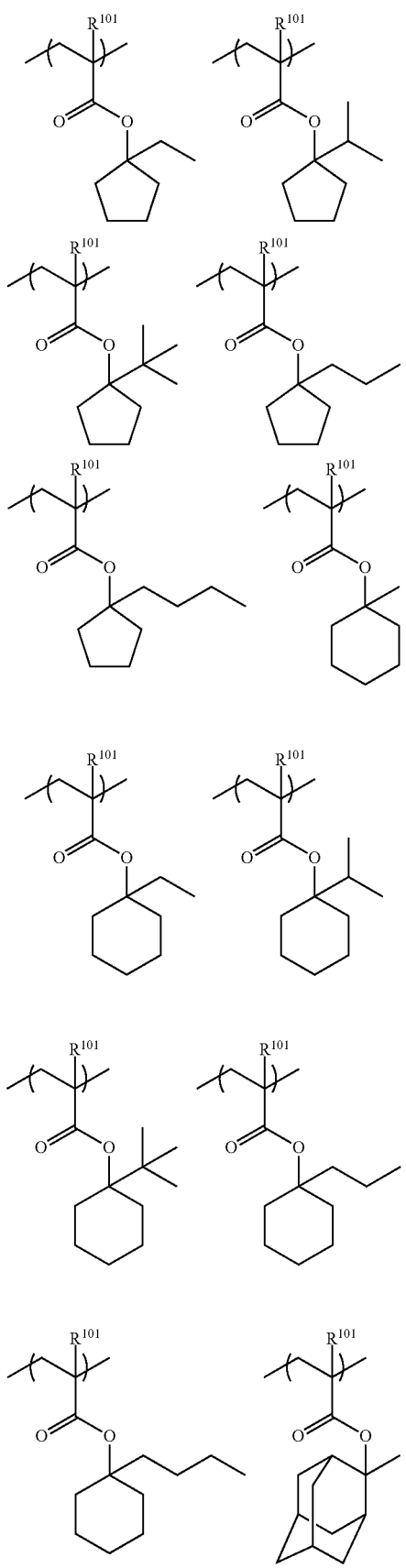
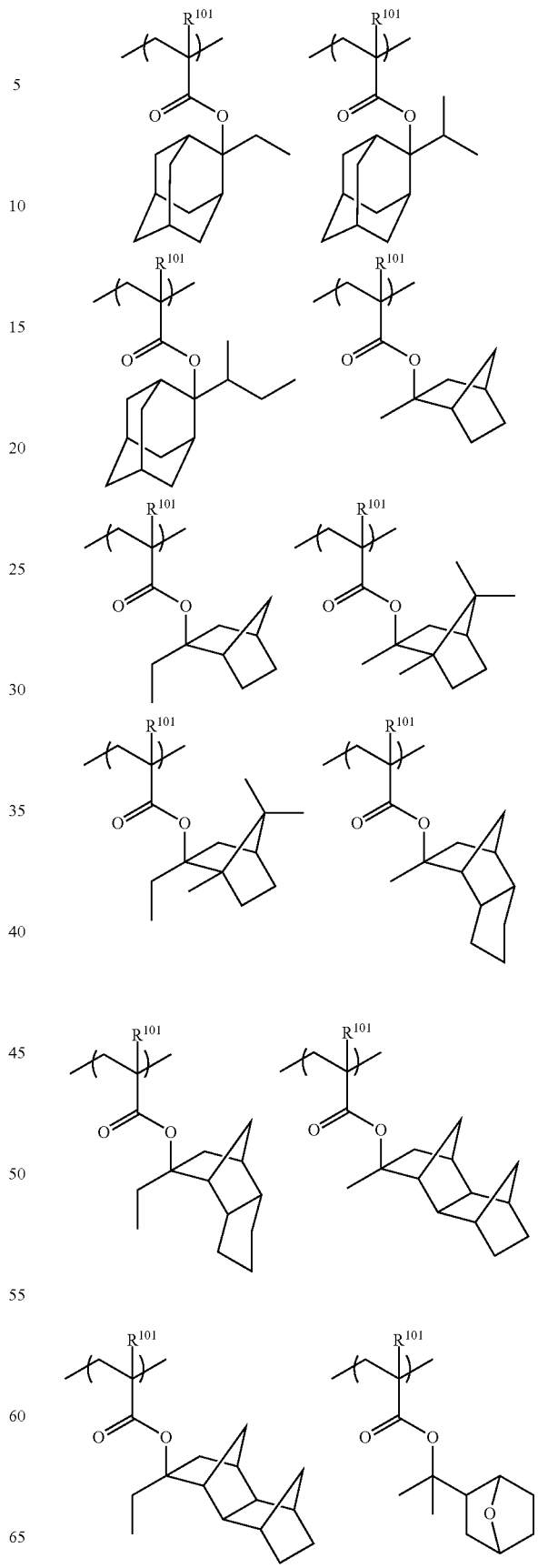

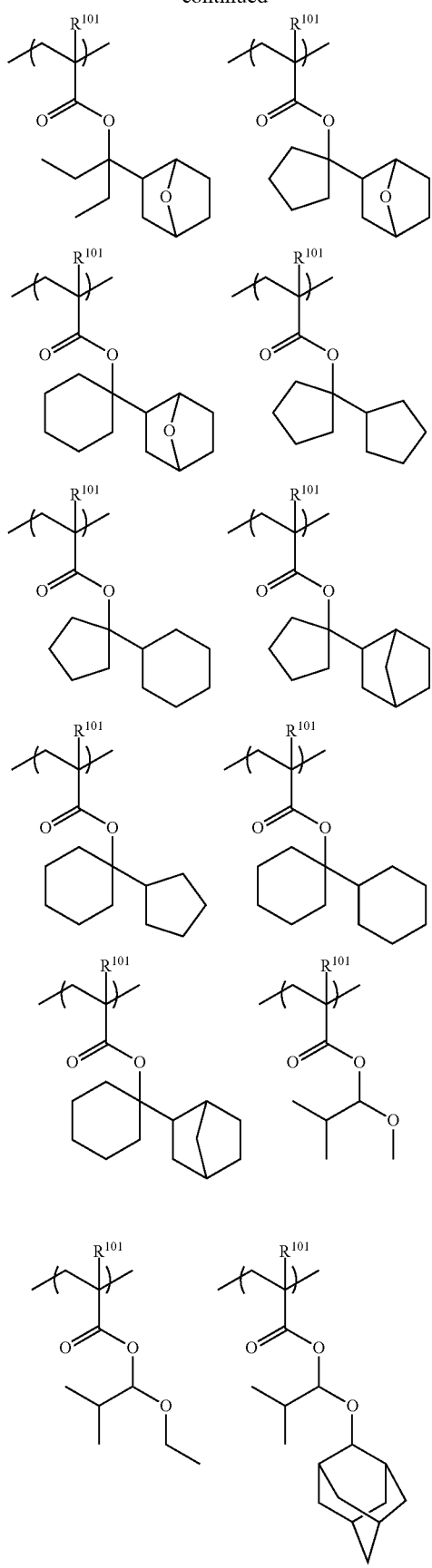
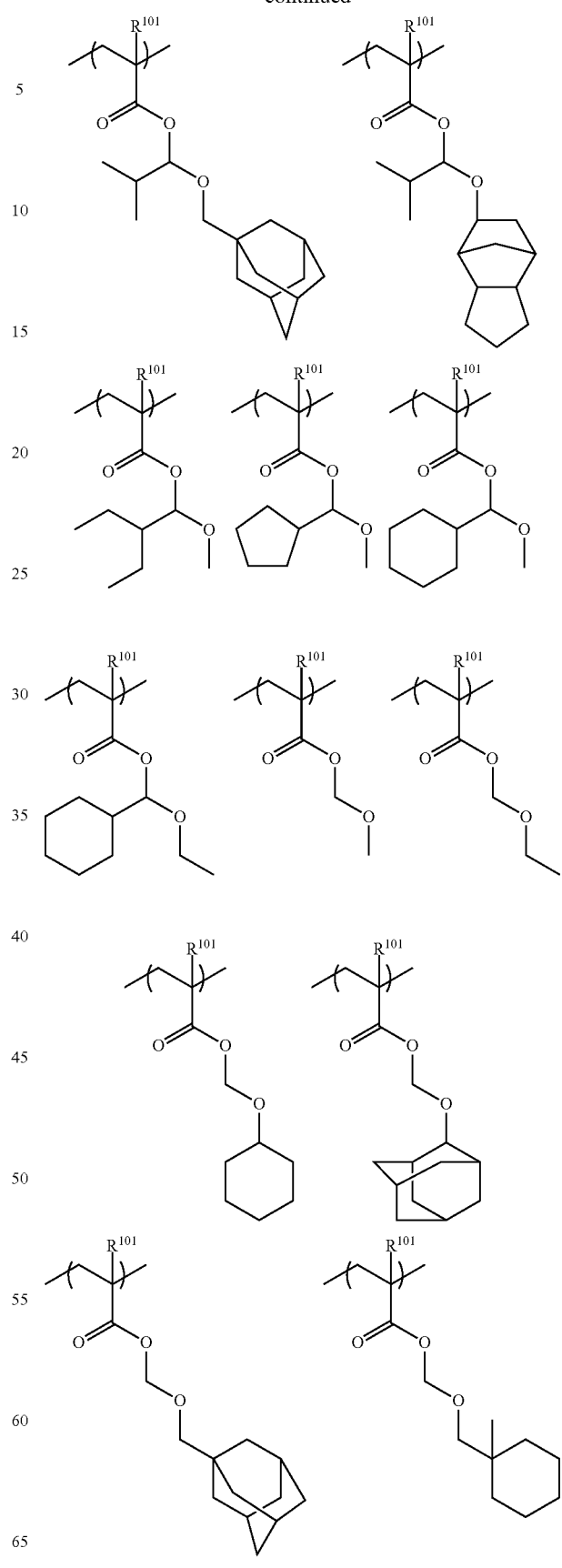

-continued
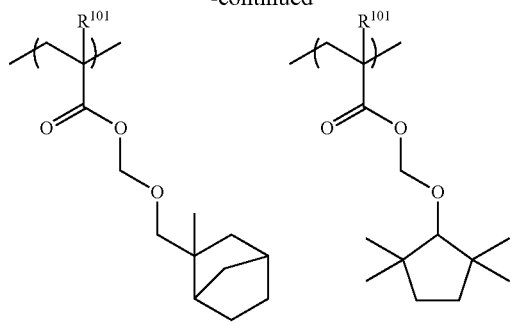
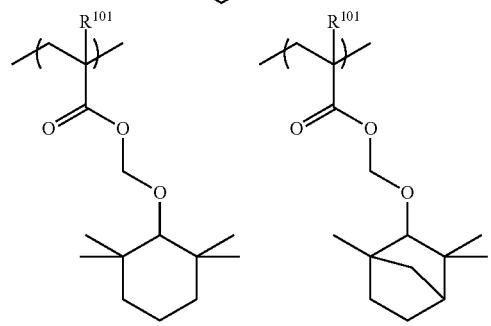
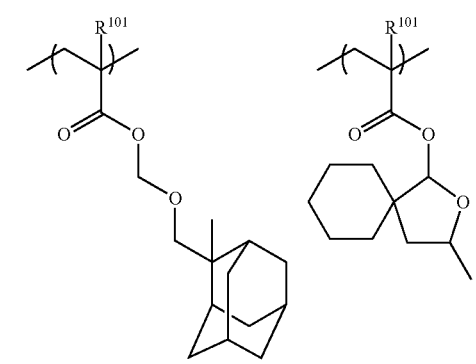
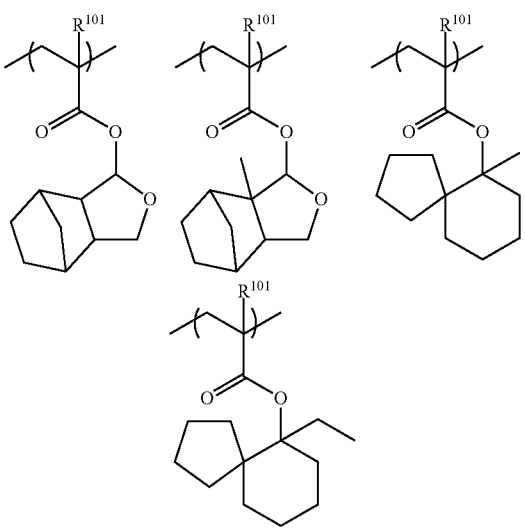
Herein R$^{101}$ is as defined above.
Examples of recurring units of formula (B)-2 are given below, but not limited thereto.
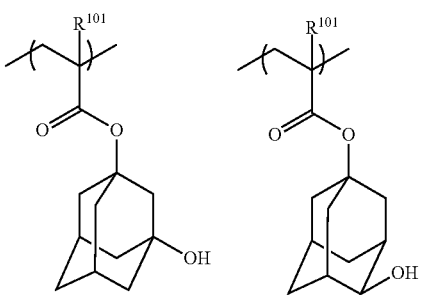
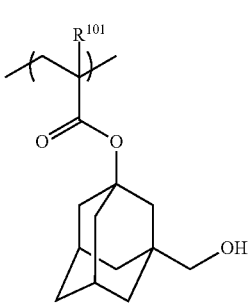
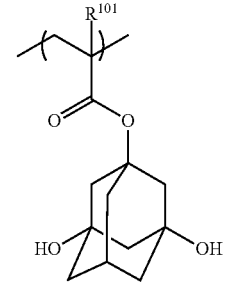
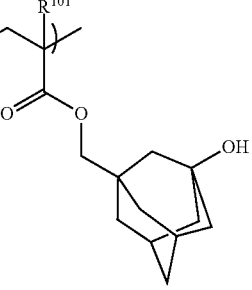
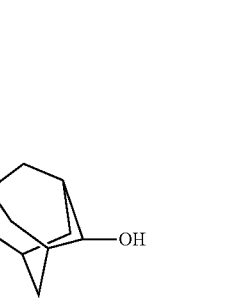

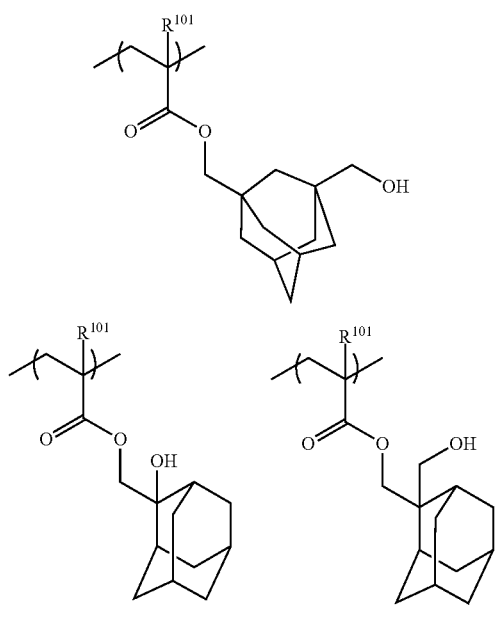
Herein R$^{101}$ is as defined above.
Examples of recurring units of formula (B)-3 are given below, but not limited thereto.
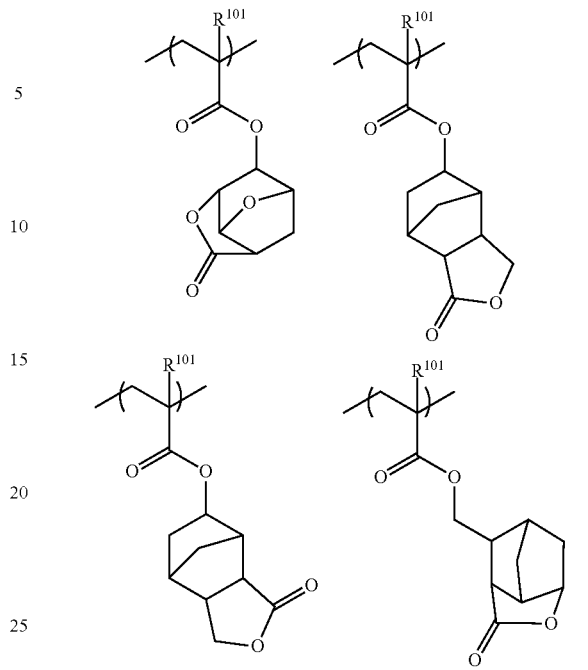
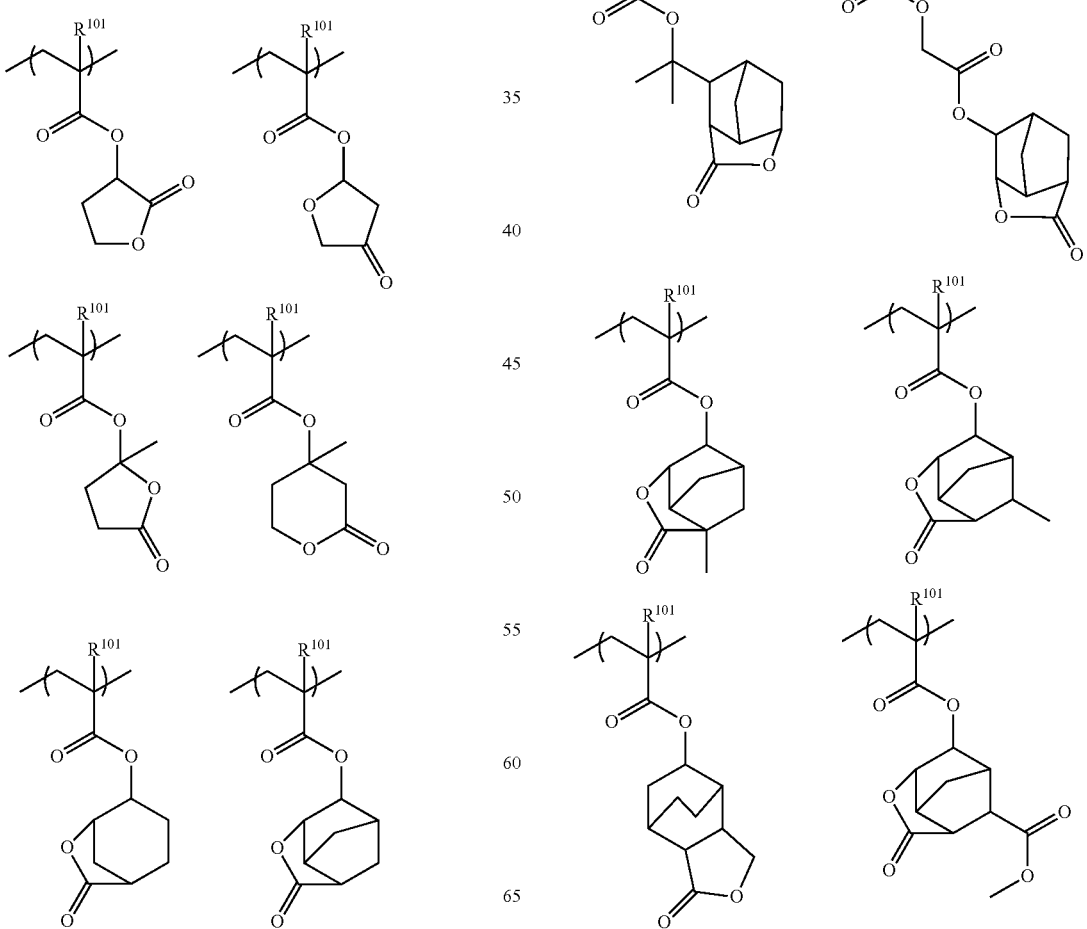

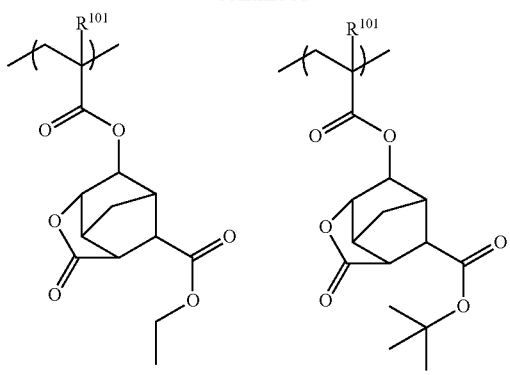
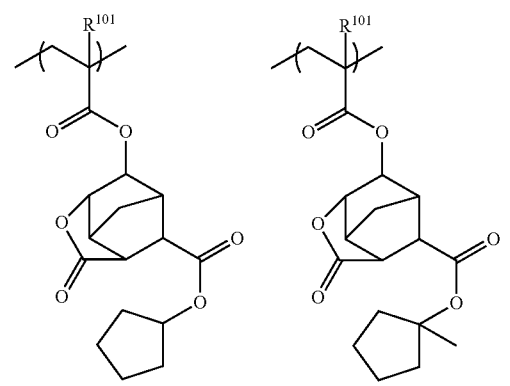
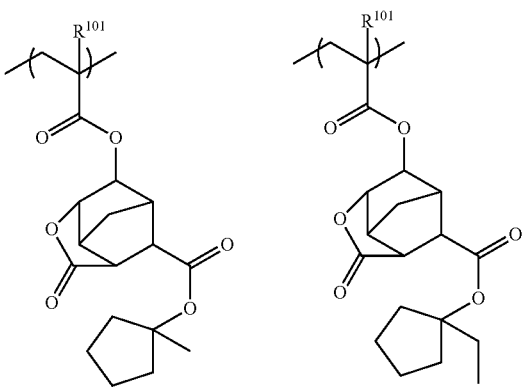
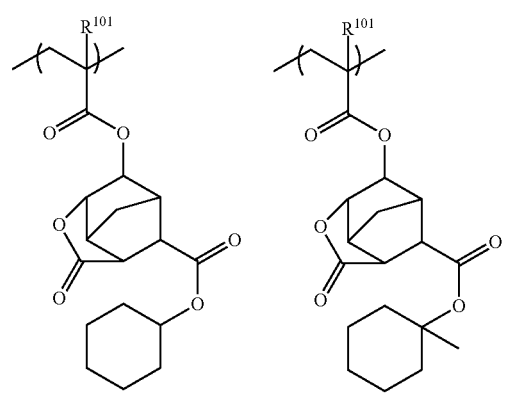
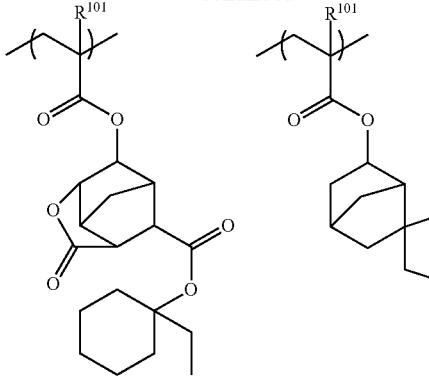
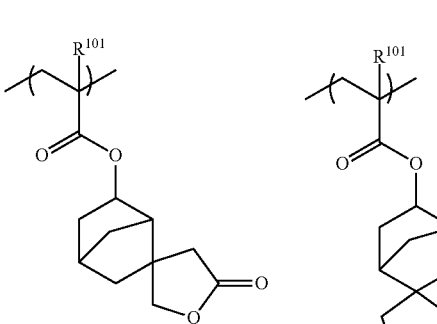
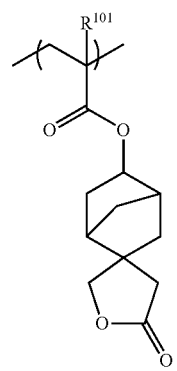
Herein $R^{101}$ is as defined above.
Examples of recurring units of formula (B)-4 are given below, but not limited thereto.
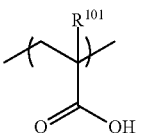
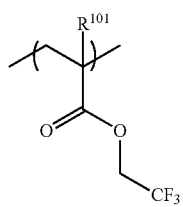

-continued
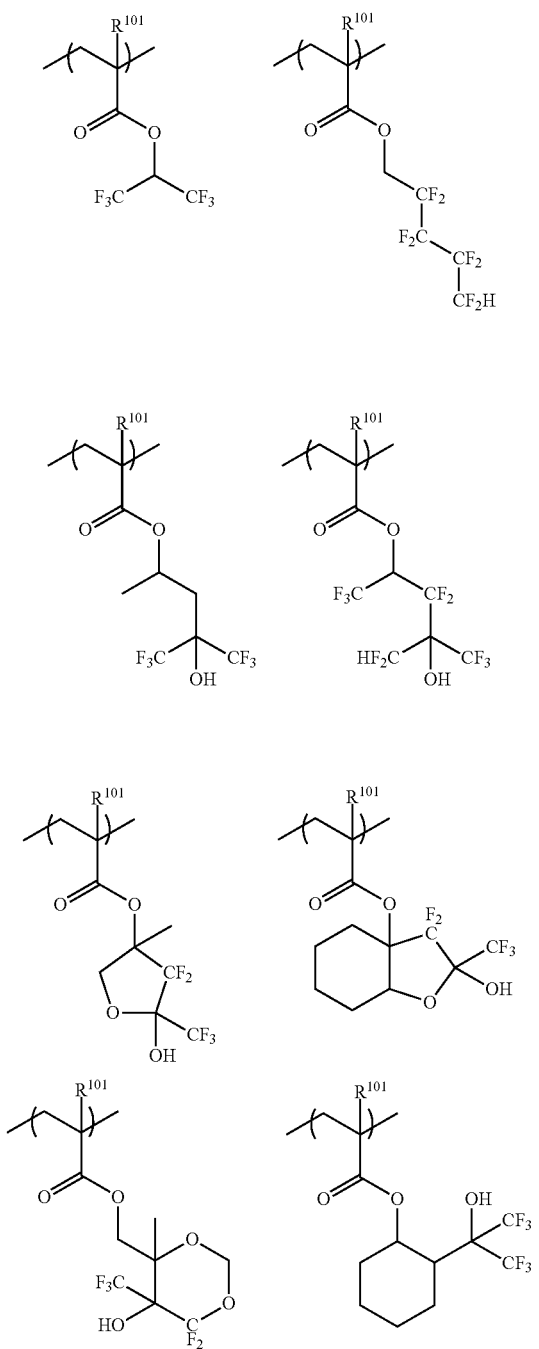
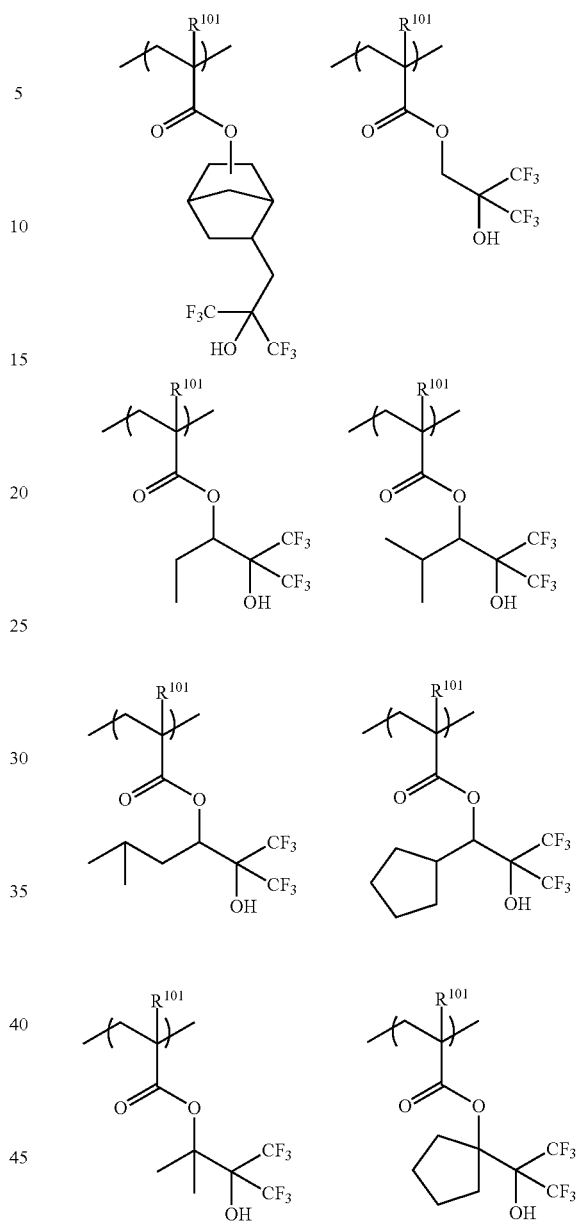
Herein $R^{101}$ is as defined above.
Examples of recurring units of formula (B)-5 are given below, but not limited thereto.
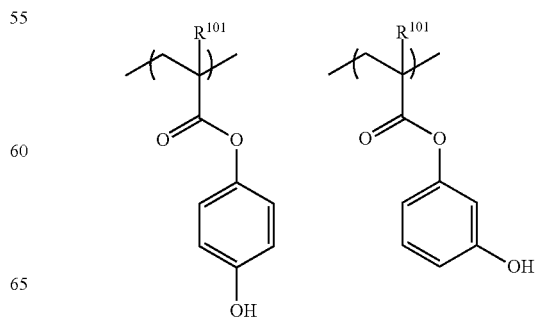

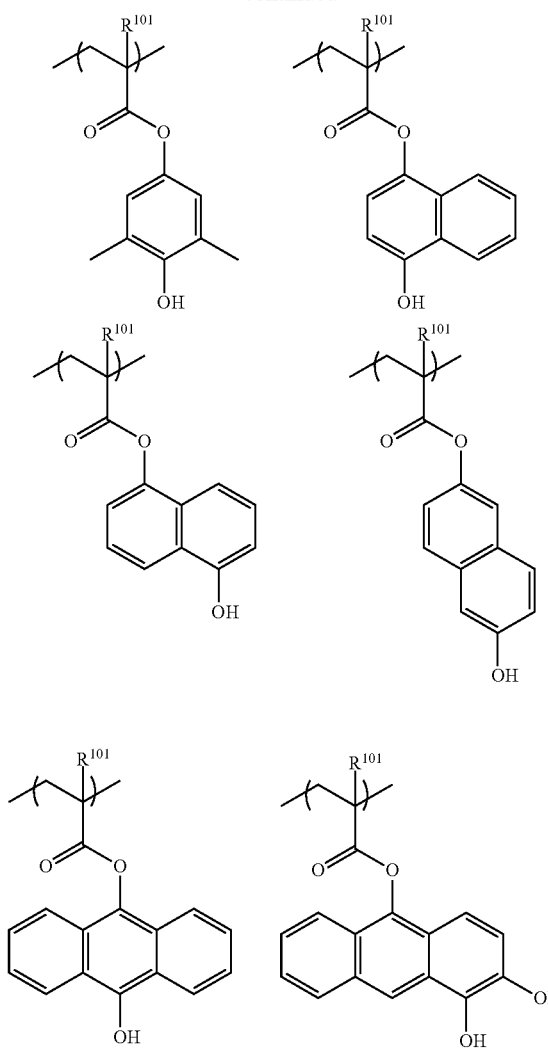
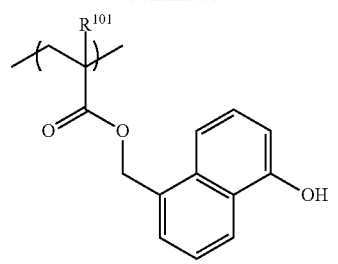
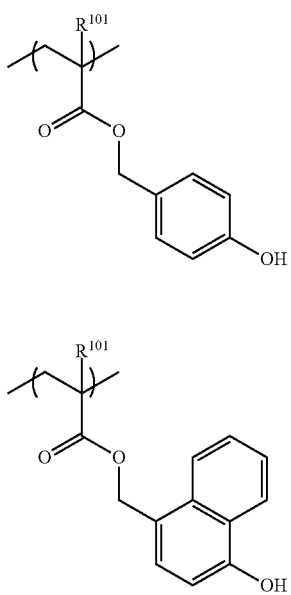
Herein $R^{101}$ is as defined above.
Examples of recurring units of formula (B)-6 are given below, but not limited thereto.
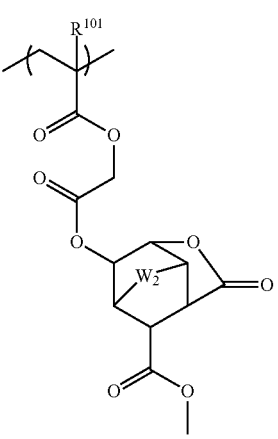
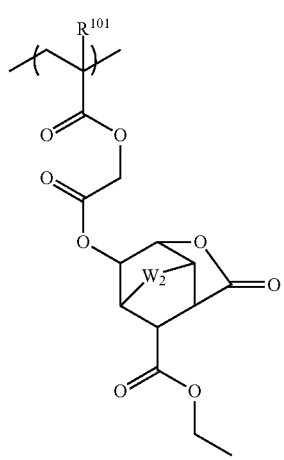
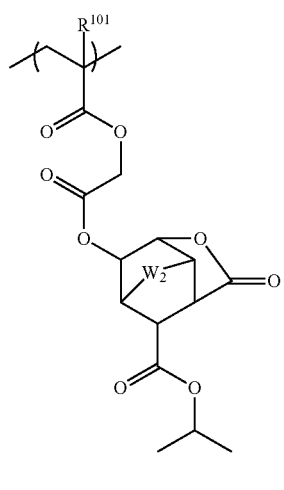

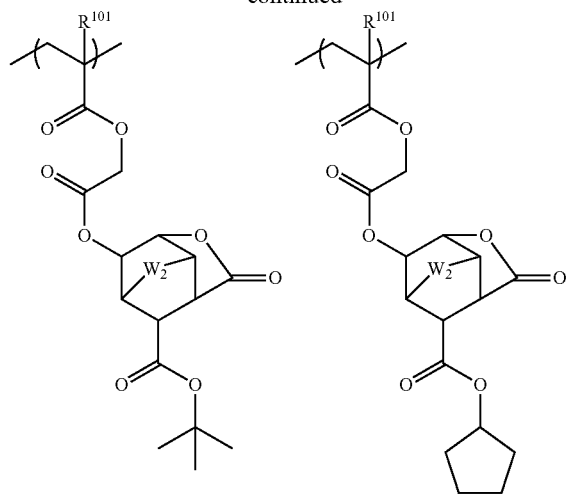
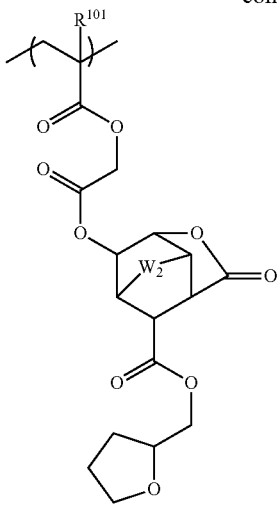
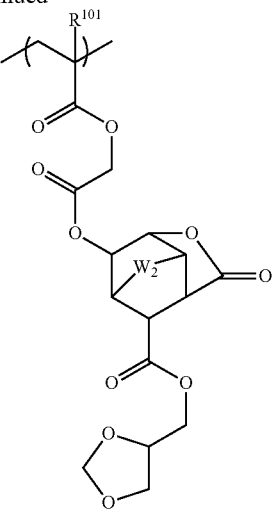
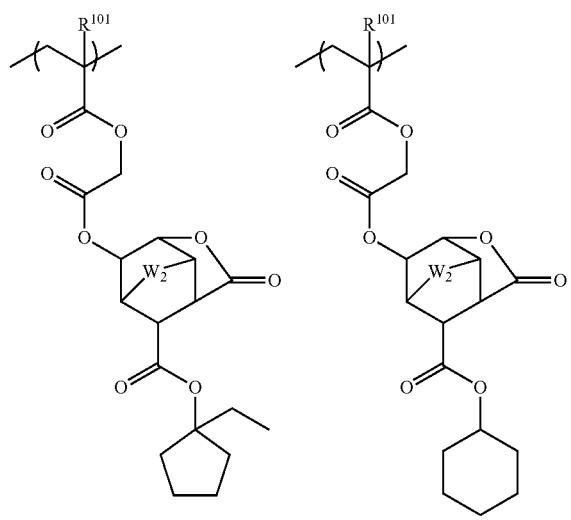
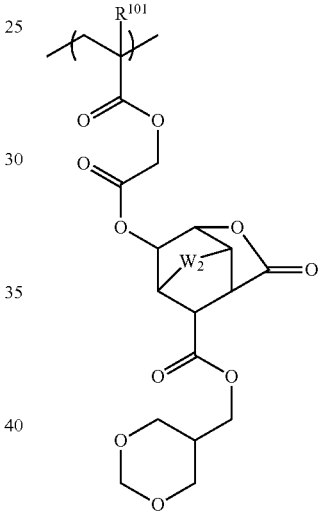
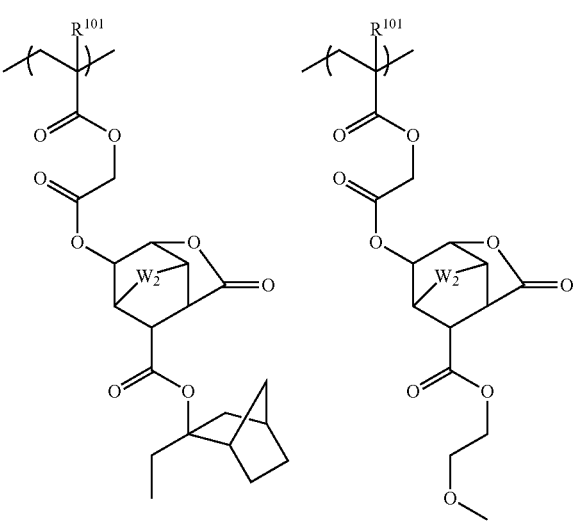
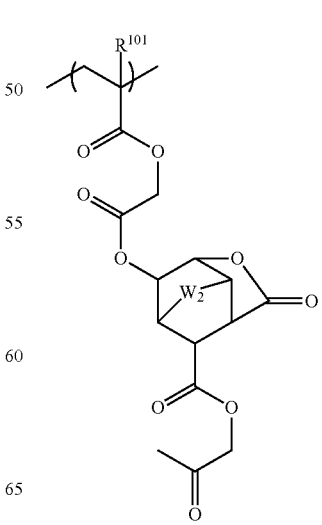
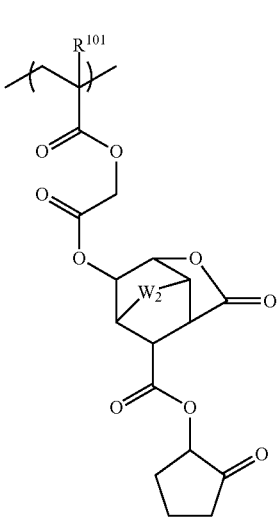

-continued

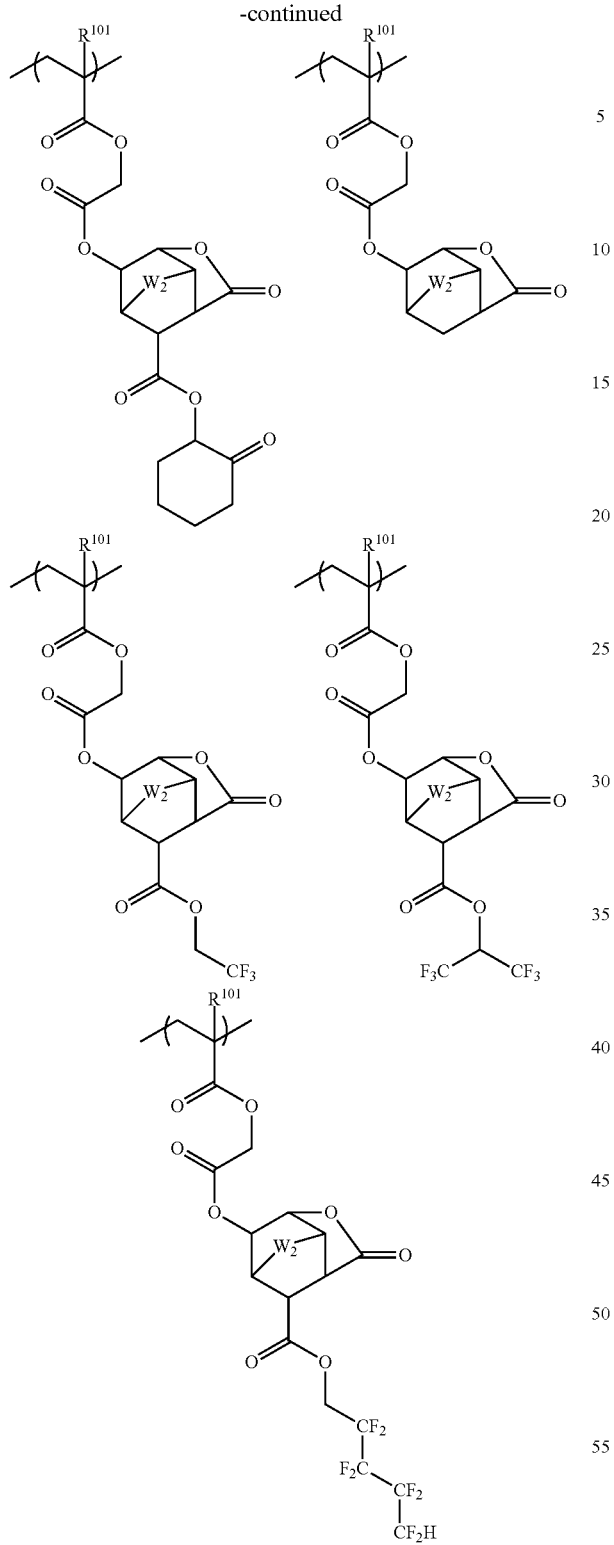

Herein $R^{101}$ and $W_2$ are as defined above.

In addition to the foregoing units of formulae (B)-1 to (B)-6, the polymers as the base resin (B) may further comprise recurring units derived from other monomers, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.1$^{3,6}$.0$^{2,7}$]dodecene derivatives, and unsaturated acid anhydrides such as itaconic anhydride.

In the embodiment wherein the resist composition is used in the EB lithography, a polymer comprising recurring units of one or more type selected from the general formulae (B)-7 to (B)-11 may preferably be used as the base resin (B).

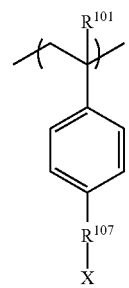

(B)-7

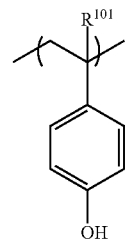

(B)-8

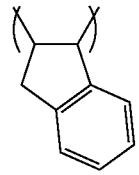

(B)-9

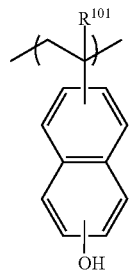

(B)-10

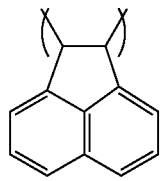

(B)-11

Herein $R^{101}$ and X are as defined above, and $R^{107}$ is an oxygen atom, —O—C(=O)O— or —O—CH$_2$—C(=O)O—.

In formula (B)-7, the acid labile group X may be selected from a variety of such groups as exemplified above for $R^{5a}$.

Examples of recurring units of formula (B)-7 are given below, but not limited thereto.

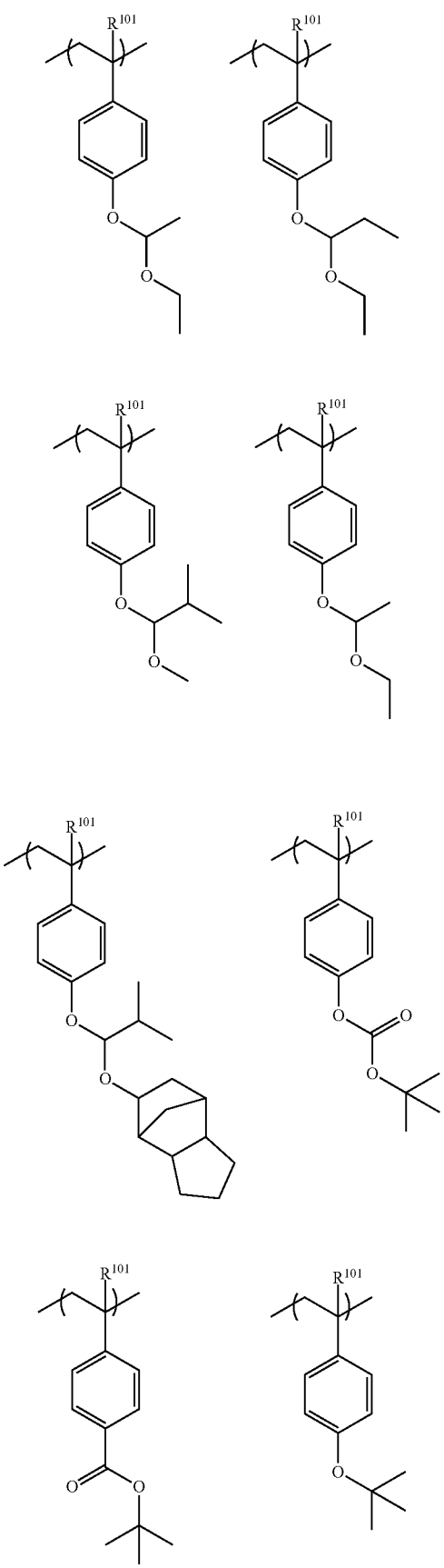
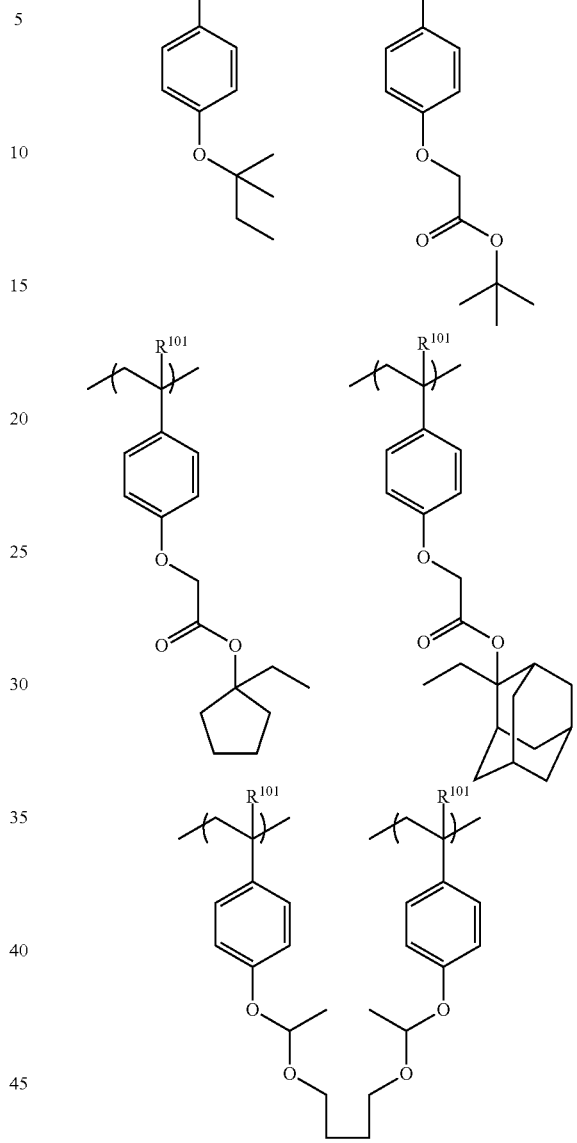

Herein $R^{101}$ is as defined above.

In the embodiment wherein the resist composition is used in the EB lithography, the polymer serving as the base resin (B) may comprise recurring units of one or more type selected from the general formulae (B)-1 to (B)-6 in addition to recurring units of one or more type selected from the general formulae (B)-7 to (B)-11. The polymer may further comprise recurring units derived from monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[$6.2.1.1^{3,6}.0^{2,7}$]dodecene derivatives, and unsaturated acid anhydrides such as itaconic anhydride.

In the polymer serving as the base resin (B), the acid labile group-bearing units, for example, units of formula (B)-1 and/or (B)-7 may be contained in a proportion of 0 to 80 mol %, preferably 1 to 50 mol %, and more preferably 10 to 40 mol %. The remaining units (other than the acid labile group-bearing units) may be contained in a proportion of 20 to 100 mol %, preferably 50 to 99 mol %, and more preferably 60 to 90 mol %.

Besides the foregoing polymers, another polymer having a dissolution rate in alkaline developer that increases under the action of acid may be added as the base resin (B). Examples of the additional polymer include (i) poly(meth)acrylic acid derivatives, (ii) norbornene derivative/maleic anhydride copolymers, (iii) hydrogenated products of ring-opening metathesis polymerization (ROMP) polymers, (iv) vinyl ether/maleic anhydride/(meth)acrylic acid derivative copolymers, and (v) polyhydroxystyrene derivatives.

Among others, the hydrogenated products of ROMP polymers are exemplified below, but not limited thereto.

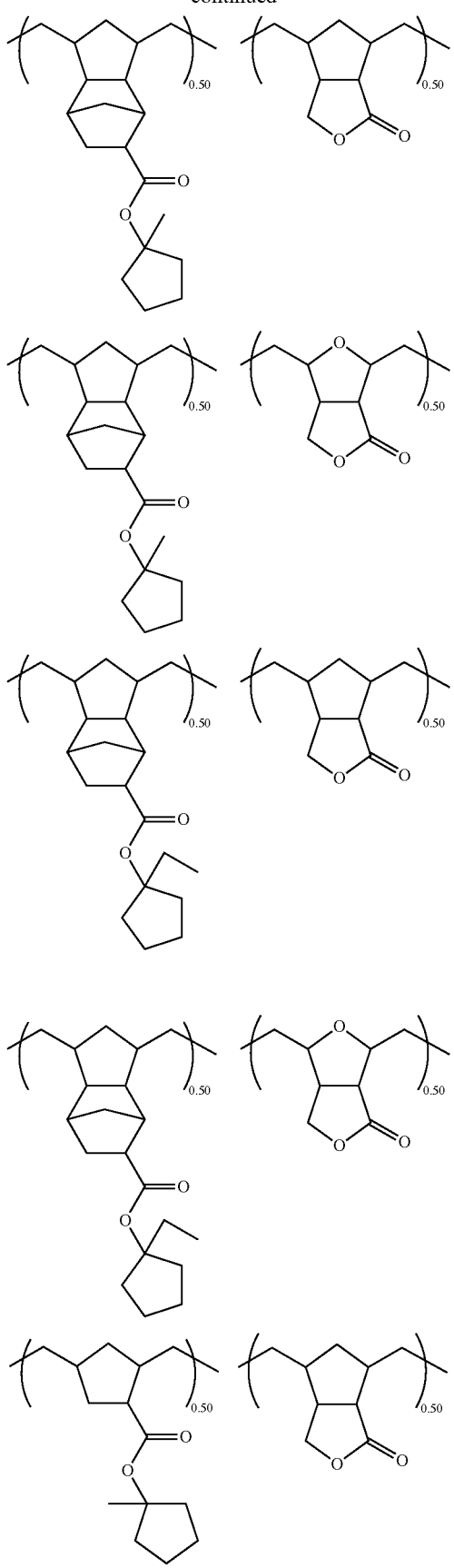

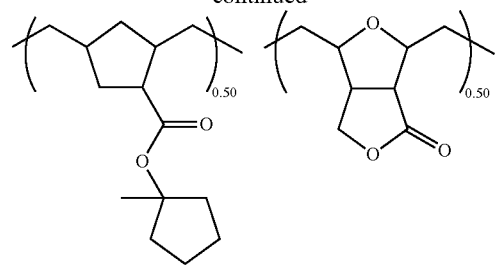
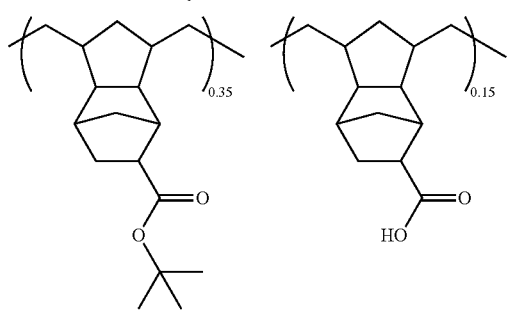
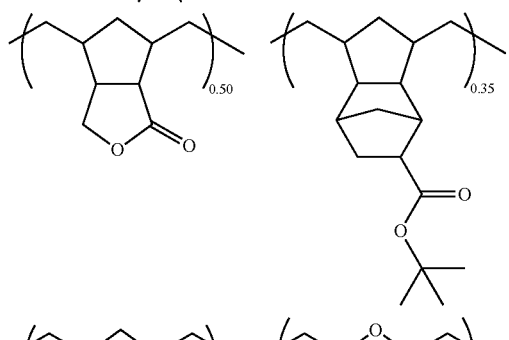
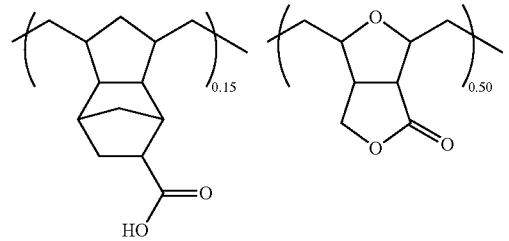
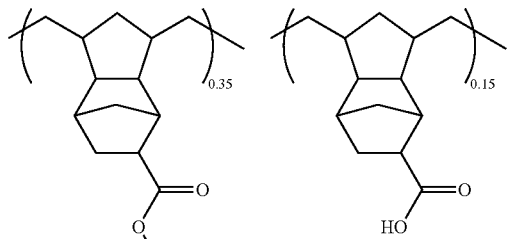
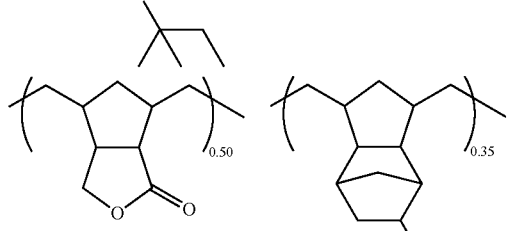
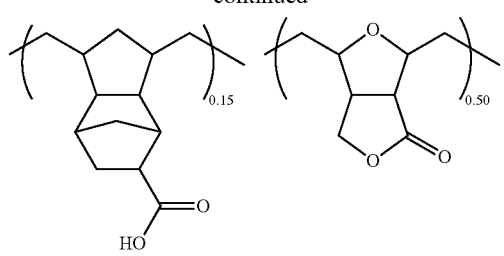
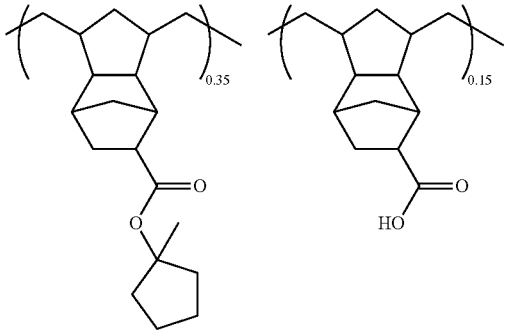
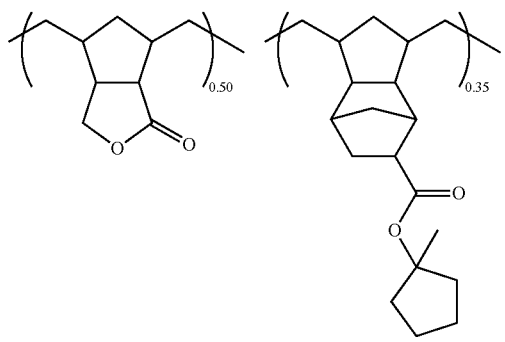
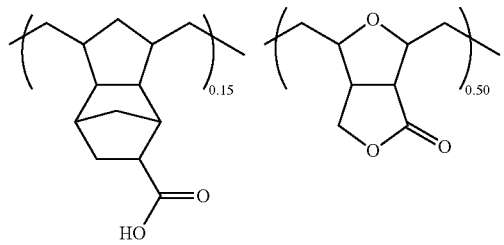
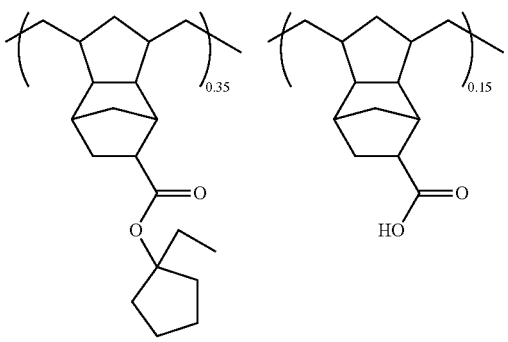

-continued

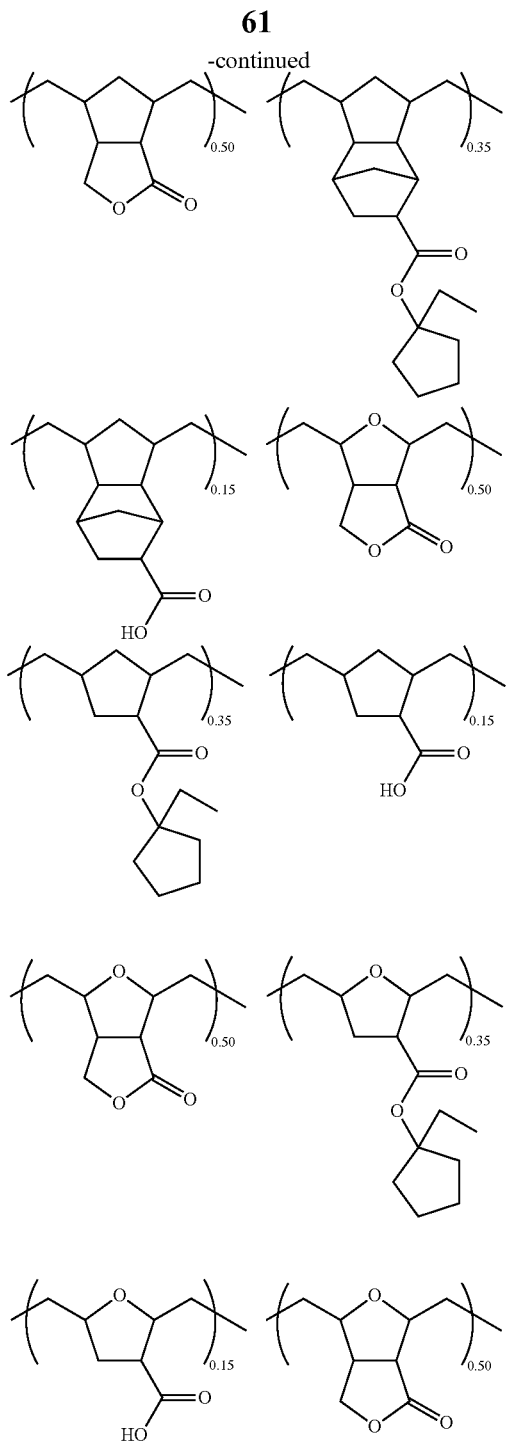

In order that the resist composition function as a chemically amplified positive resist composition, (C) a compound capable of generating an acid upon exposure to high-energy radiation, referred to as "photoacid generator" or PAG, may be compounded. The PAG may be any compound capable of generating an acid upon exposure of high-energy radiation. Suitable PAGs include sulfonium salts, iodonium salts, sulfonyldiazomethane, N-sulfonyloxyimide, and oxime-O-sulfonate acid generators. Exemplary acid generators are described in JP-A 2008-111103, paragraphs [0123] to [0138].

The preferred PAGs are those compounds of the general formula (C)-1.

(C)-1

Herein $R^{405}$, $R^{406}$ and $R^{407}$ are each independently hydrogen or a straight, branched or cyclic $C_1$-$C_{20}$ monovalent hydrocarbon group which may contain a heteroatom, typically an alkyl or alkoxy group. $R^{408}$ is a straight, branched or cyclic $C_7$-$C_{30}$ monovalent hydrocarbon group which may contain a heteroatom.

Examples of the hydrocarbon groups optionally containing a heteroatom, represented by $R^{405}$, $R^{406}$, and $R^{407}$, include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero-atomic grouping such as —O—, —S—, —SO—, —SO$_2$—, —NH—, —C(=O)—, —C(=O)O—, or —C(=O)NH—, or any hydrogen atom is replaced by a functional group such as —OH, —NH$_2$, —CHO, or —CO$_2$H. Examples of the straight, branched or cyclic $C_7$-$C_{30}$ monovalent hydrocarbon groups optionally containing a heteroatom, represented by $R^{408}$, are shown below, but not limited thereto.

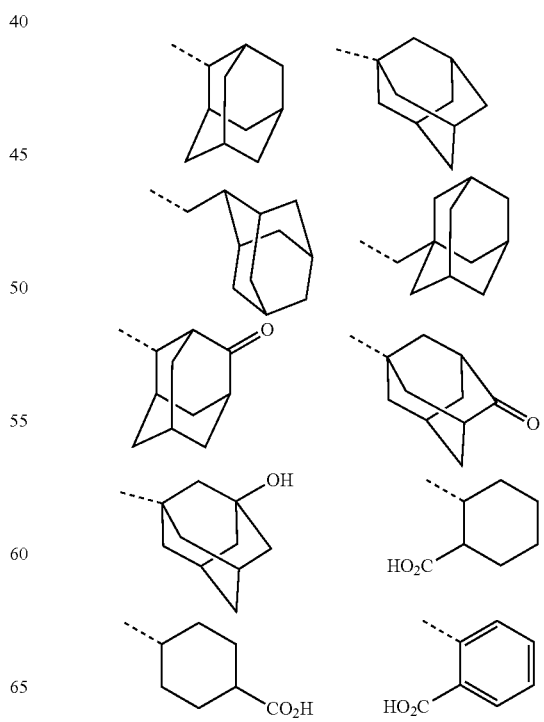

-continued
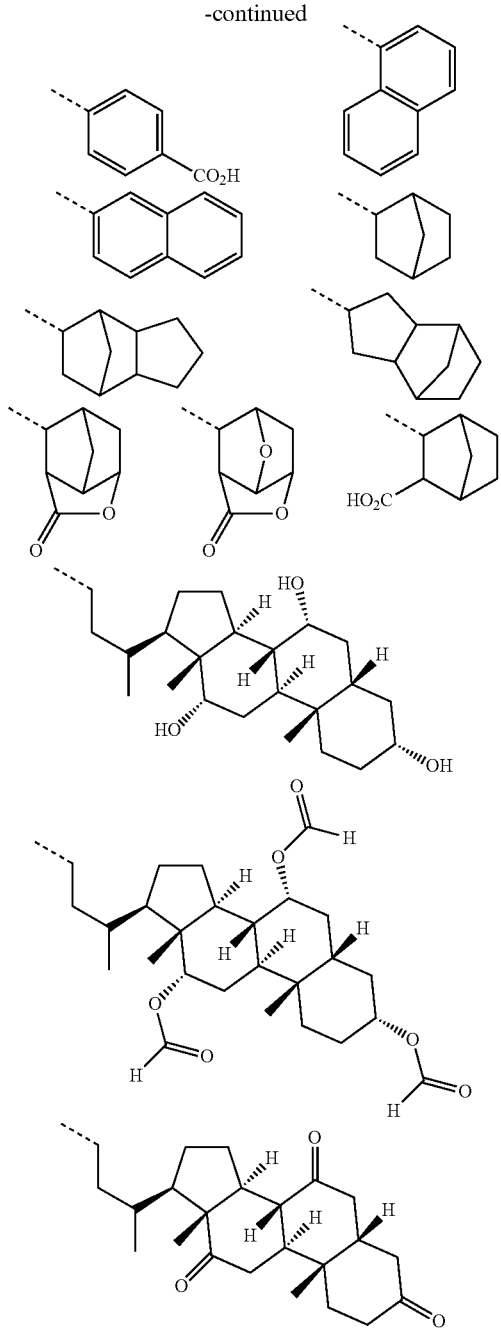
Illustrative examples of acid generators (C)-1 are shown below, but not limited thereto.
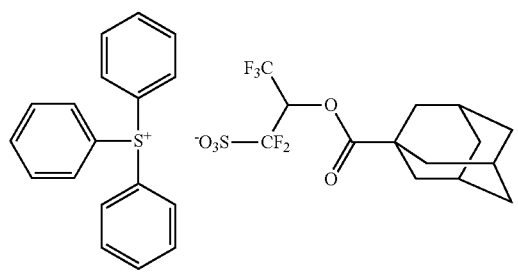
-continued
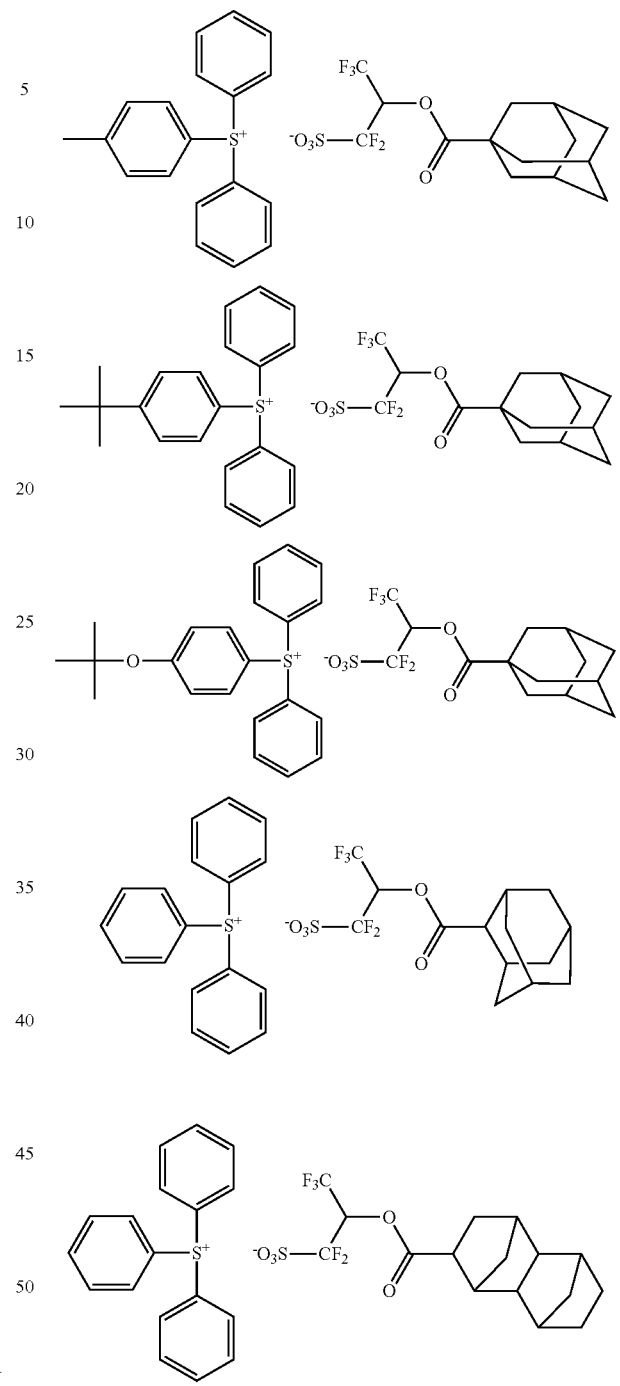
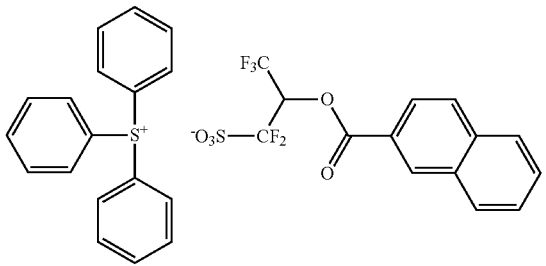

-continued

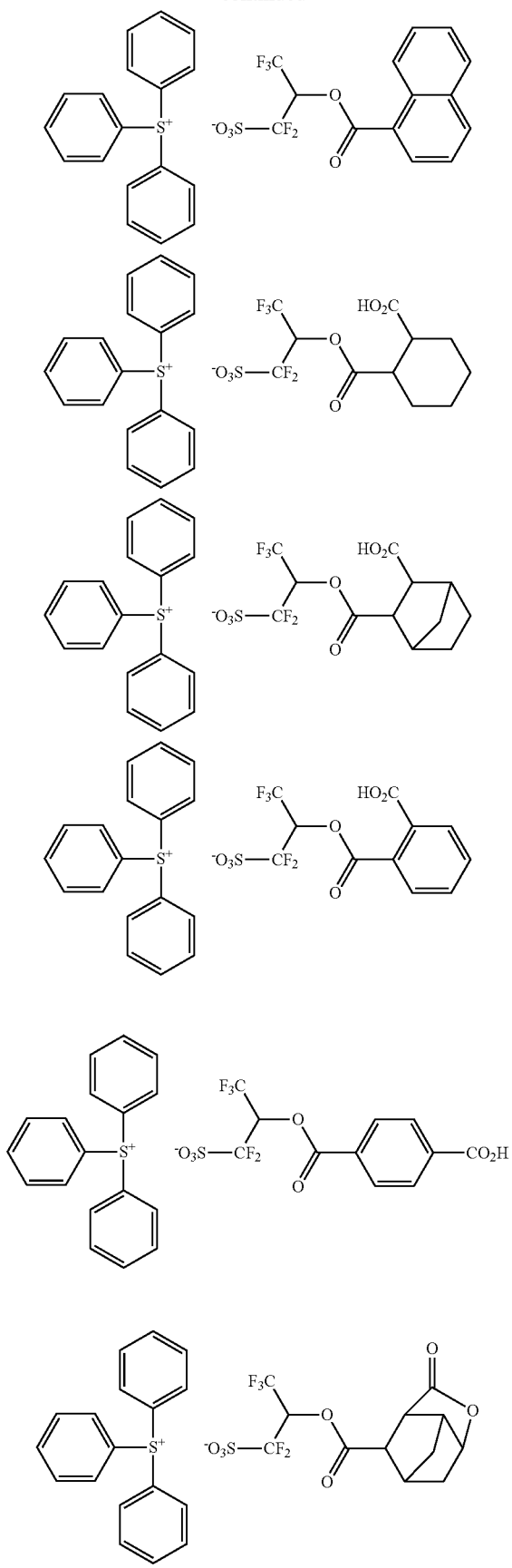

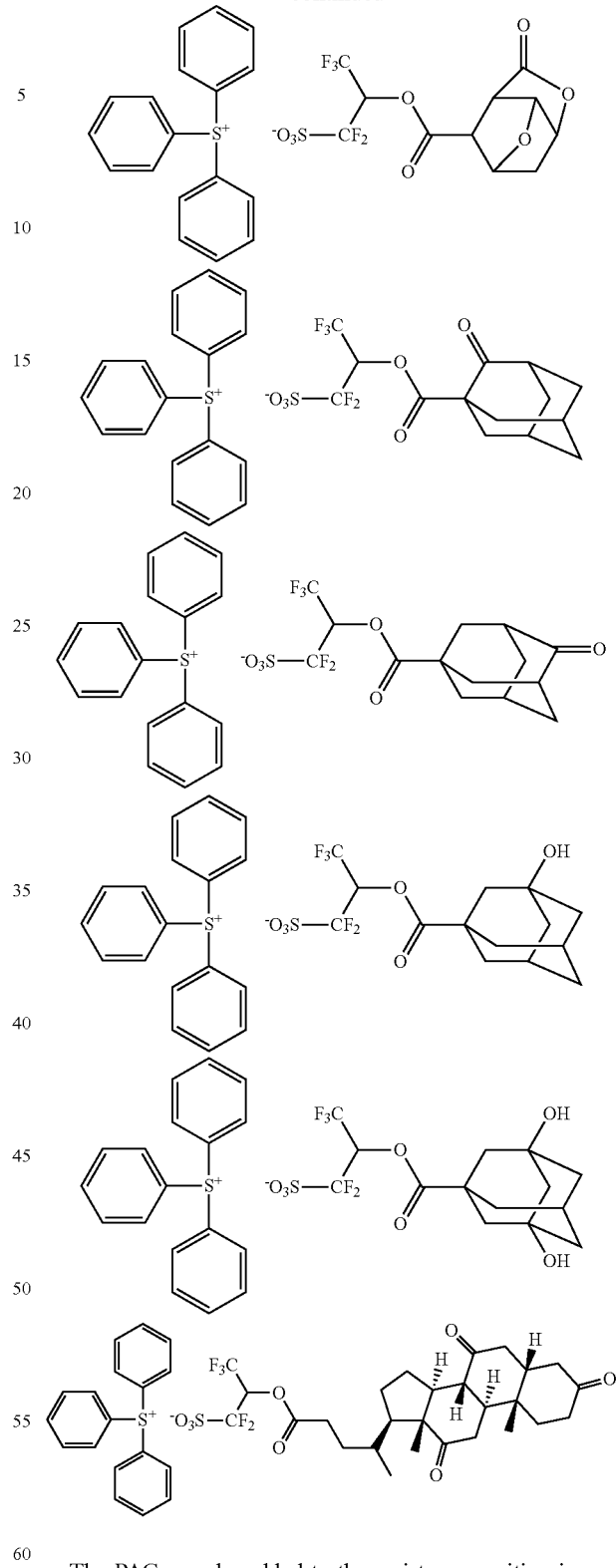

The PAG may be added to the resist composition in any desired amount as long as it does not compromise the objects of the invention. An appropriate amount of PAG added is 0.1 to 30 parts, and more preferably 0.1 to 20 parts by weight per 100 parts by weight of the base resin (B) in the composition. If the amount of PAG is too much, there may arise problems of degraded resolution and foreign particles upon development and resist stripping. The PAG may be used alone or in admixture of two or more. The transmittance of the resist film can be controlled by using a PAG having a low transmittance at the exposure wavelength and adjusting the amount of the PAG added.

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is also an onium salt, an exchange from the strong acid (generated upon exposure to high-energy radiation) to a weak acid as above can take place, but it never happens that the weak acid (generated upon exposure to high-energy radiation) collides with the unreacted onium salt capable of generating a strong acid to induce a salt exchange. This is because of a likelihood of an onium cation forming an ion pair with a stronger acid anion.

The resist composition may further comprise one or more of (D) an organic solvent, (E) a basic compound, (F) a dissolution regulator, (G) a surfactant, and (H) an acetylene alcohol derivative.

The organic solvent (D) used herein may be any organic solvent in which polymer P1, base resin (B), acid generator (C), and other components are soluble. Exemplary solvents are described in JP-A 2008-111103, paragraph [0144]. The organic solvents may be used alone or in combinations of two or more thereof. An appropriate amount of the organic solvent used is 200 to 10,000 parts, especially 400 to 7,000 parts by weight per 100 parts by weight of the base resin (B). It is recommended to use diethylene glycol dimethyl ether, 1-ethoxy-2-propanol, propylene glycol monomethyl ether acetate (PGMEA), and mixtures thereof because the acid generator is most soluble therein.

As the basic compound (E), nitrogen-containing organic compounds are preferred and may be used alone or in admixture. Those compounds capable of suppressing the rate of diffusion when the acid generated by the acid generator diffuses within the resist film are useful. The inclusion of nitrogen-containing organic compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide, imide and carbamate derivatives. Illustrative examples are described in JP-A 2008-111103, paragraphs [0149] to [0163]. The basic compound is preferably used in an amount of 0.001 to 10 parts, more preferably 0.01 to 5 part by weight per 100 parts by weight of the base resin (B). At least 0.001 phr achieves the desired addition effect whereas up to 10 phr minimizes the risk of reducing sensitivity.

Tertiary amines are especially preferred as the basic compound. Examples include tri-n-butylamine, tri-n-pentylamine, tri-n-hexylamine, tri-n-octylamine, N,N-dimethylaniline, triethanolamine, triisopropanolamine, tris(2-methoxymethoxyethyl)amine, tris(2-methoxyethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, tris(2-benzoyloxyethyl)amine, tris[2-(4-methoxybenzoyloxy)ethyl]amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Illustrative examples of the basic compounds include 1-[2-(methoxymethoxy)ethyl]pyrrolidine, 1-[2-(methoxymethoxy)ethyl]piperidine, 4-[2-(methoxymethoxy)ethyl]morpholine, 1-[2-(methoxymethoxy)ethyl]imidazole, 1-[2-(methoxymethoxy)ethyl]benzimidazole, 1-[2-(methoxymethoxy)ethyl]-2-phenylbenzimidazole, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 1-[2-[(2-methoxyethoxy)methoxy]ethyl]imidazole, 1-[2-[(2-methoxyethoxy)methoxy]ethyl]benzimidazole, 1-[2-[(2-methoxyethoxy)methoxy]ethyl]-2-phenylbenzimidazole, 1-[2-[2-(2-methoxyethoxy)ethoxy]ethyl]pyrrolidine, 1-[2-[2-(2-methoxyethoxy)ethoxy]ethyl]piperidine, 4-[2-[2-(2-methoxyethoxy)ethoxy]ethyl]morpholine, 1-[2-[2-(2-methoxyethoxy)ethoxy]ethyl]imidazole, 1-[2-[2-(2-methoxyethoxy)ethoxy]ethyl]benzimidazole, 1-[2-[2-(2-methoxyethoxy)ethoxy]ethyl]-2-phenylbenzimidazole, 1-[2-[2-(2-butoxyethoxy)ethoxy]ethyl]pyrrolidine, 1-[2-[2-(2-butoxyethoxy)ethoxy]ethyl]piperidine, 4-[2-[2-(2-butoxyethoxy)ethoxy]ethyl]morpholine, 1-[2-[2-(2-butoxyethoxy)ethoxy]ethyl]imidazole, 1-[2-[2-(2-butoxyethoxy)ethoxy]ethyl]benzimidazole, 1-[2-[2-(2-butoxyethoxy)ethoxy]ethyl]-2-phenylbenzimidazole, 1-[2-[2-[2-(2-methoxyethoxy)ethoxy]ethoxy]ethyl]pyrrolidine, 1-[2-[2-[2-(2-methoxyethoxy)ethoxy]ethoxy]ethyl]piperidine, 4-[2-[2-[2-(2-methoxyethoxy)ethoxy]ethoxy]ethyl]morpholine, 1-[2-[2-[2-(2-methoxyethoxy)ethoxy]ethoxy]ethyl]imidazole, 1-[2-[2-[2-(2-methoxyethoxy)ethoxy]ethoxy]ethyl]benzimidazole, 1-[2-[2-[2-(2-methoxyethoxy)ethoxy]ethoxy]ethyl]-2-phenylbenzimidazole, 4-[2-{2-[2-(2-butoxyethoxy)ethoxy]ethoxy}ethyl]morpholine, 2-(1-pyrrolidinyl)ethyl acetate, 2-piperidinoethyl acetate, 2-morpholinoethyl acetate, 2-(1-imidazolyl)ethyl acetate, 2-(1-benzimidazolyl)ethyl acetate, 2-(2-phenyl-1-benzimidazolyl)ethyl acetate, 2-methoxyethyl morpholinoacetate, 2-(1-pyrrolidinyl)ethyl 2-methoxyacetate, 2-piperidinoethyl 2-methoxyacetate, 2-morpholinoethyl 2-methoxyacetate, 2-(1-imidazolyl)ethyl 2-methoxyacetate, 2-(1-benzimidazolyl)ethyl 2-methoxyacetate, 2-(2-phenyl-1-benzimidazolyl)ethyl 2-methoxyacetate, 2-(1-pyrrolidinyl)ethyl 2-(2-methoxyethoxy)acetate, 2-piperidinoethyl 2-(2-methoxyethoxy)acetate, 2-morpholinoethyl 2-(2-methoxyethoxy)acetate, 2-(1-imidazolyl)ethyl 2-(2-methoxyethoxy)acetate, 2-(1-benzimidazolyl)ethyl 2-(2-methoxyethoxy)acetate, 2-(2-phenyl-1-benzimidazolyl)ethyl 2-(2-methoxyethoxy)acetate, 2-(1-pyrrolidinyl)ethyl 2-[2-(2-methoxyethoxy)ethoxy]acetate, 2-piperidinoethyl 2-[2-(2-methoxyethoxy)ethoxy]acetate, 2-morpholinoethyl 2-[2-(2-methoxyethoxy)ethoxy]acetate, 2-(1-imidazolyl)ethyl 2-[2-(2-methoxyethoxy)ethoxy]acetate, 2-(1-benzimidazolyl)ethyl 2-[2-(2-methoxyethoxy)ethoxy]acetate, 2-(2-phenyl-1-benzimidazolyl)ethyl 2-[2-(2-methoxyethoxy)ethoxy]acetate, 2-morpholinoethyl butyrate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-acetyl)cholate, 2-morpholinoethyl tris(O-formyl)cholate, 2-morpholinoethyl dehydrocholate, 2-morpholinoethyl cyclopentanecarboxylate, 2-morpholinoethyl cyclohexanecarboxylate, 2-(1-pyrrolidinyl)ethyl 7-oxanorbornane-2-carboxylate, 2-piperidinoethyl 7-oxanorbornane-2-carboxylate, 2-morpholinoethyl 7-oxanorbornane-2-carboxylate, 2-(1-imidazolyl)ethyl 7-oxanorbornane-2-carboxylate, 2-(1-benzimidazolyl)ethyl 7-oxanorbornane-2-carboxylate, 2-(2-phenyl-1-benzimidazolyl)ethyl 7-oxanorbornane-2-carboxylate, 2-morpholinoethyl adamantanecarboxylate, 2-(1-pyrrolidinyl)ethyl formate, 2-piperidinoethyl propionate, 2-morpholinoethyl acetoxyacetate, 2-(1-pyrrolidinyl)ethyl methoxyacetate, 2-(1-pyrrolidinyl)ethyl benzoate, 2-piperidinoethyl benzoate, 2-morpholinoethyl benzoate, 2-(1-imidazolyl)ethyl benzoate, 2-(1-benzimidazolyl)ethyl benzoate, 2-(2-phenyl-1-benzimidazolyl)ethyl benzoate, 2-(1-pyrrolidinyl)ethyl 4-methoxybenzoate, 2-piperidinoethyl 4-methoxybenzoate, 2-morpholinoethyl 4-methoxybenzoate, 2-(1-imidazolyl)ethyl 4-methoxybenzoate, 2-(1-benzimidazolyl)ethyl 4-methoxybenzoate, 2-(2-phenyl-1-benzimidazolyl)ethyl 4-methoxybenzoate, 2-(1-pyrrolidinyl)ethyl 4-phenylbenzoate, 2-piperidinoethyl 4-phenylbenzoate, 2-morpholinoethyl 4-phenylbenzoate, 2-(1-imidazolyl)ethyl 4-phenylbenzoate, 2-(1-benzimidazolyl)ethyl 4-phenylbenzoate, 2-(2-phenyl-1-benzimidazolyl)ethyl 4-phenylbenzoate, 2-(1-pyrrolidinyl)ethyl 1-naphthalenecarboxylate, 2-piperidinoethyl 1-naphthalenecarboxylate, 2-morpholinoethyl 1-naphthalenecarboxylate, 2-(1-imidazolyl)ethyl 1-naphthalenecarboxylate, 2-(1-benzimidazolyl)ethyl 1-naphthalenecarboxylate, 2-(2-phenyl-1-benzimidazolyl)ethyl 1-naphthalenecarboxylate, 2-(1-pyrrolidinyl)ethyl 2-naphthalenecarboxylate, 2-piperidinoethyl 2-naphthalenecarboxylate, 2-morpholinoethyl 2-naphthalenecarboxylate, 2-(1-imidazolyl)ethyl 2-naphthalenecarboxylate, 2-(1-benzimidazolyl)ethyl 2-naphthalenecarboxylate, 2-(2-phenyl-1-benzimidazolyl)ethyl 2-naphthalenecarboxylate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, etc.

The dissolution regulator or inhibitor (F) which can be added to the resist composition is a compound having on the molecule at least two phenolic hydroxyl groups which are protected with an acid labile group, or a compound having on the molecule at least one carboxyl group which is protected with an acid labile group. Exemplary regulators are described in JP-A 2008-122932, paragraphs [0155] to [0178].

Optionally, the resist composition may further comprise (G) a surfactant which is commonly used for facilitating the coating operation. Exemplary surfactants are described in JP-A 2008-111103, paragraph [0166].

Optionally, the resist composition may further comprise (H) an acetylene alcohol derivative. Exemplary compounds are described in JP-A 2008-122932, paragraphs [0180] to [0181].

Optionally, the resist composition may further comprise (I) a fluorinated alcohol. When the resist composition contains (E) a basic compound, the fluorinated ester in recurring units (1), (1-1) or (1-2) of polymer P1 may be subject to gradual hydrolysis during storage, which may lead to a decline of water repellent and water slip performance during the immersion lithography process. In such a case, (I) a fluorinated alcohol may be added to the resist composition for suppressing the hydrolysis which is otherwise promoted by the basic compound (E), thus enhancing storage stability.

Examples of the fluorinated alcohol include, but are not limited to, 2,2,2-trifluoroethanol, 2,2,3,3-tetrafluoro-1-propanol, 1,3-difluoro-2-propanol, 1,1,1,3,3,3-hexafluoro-2-propanol, 1,1,1,3,3,3-hexafluoro-2-trifluoromethyl-2-propanol, 2,2,3,4,4,4-hexafluoro-1-butanol, 2,2,2,2',2',2'-hexafluorocumylalcohol, and 2,2,3,3,4,4,5,5-octafluoro-1-pentanol.

The fluorinated alcohol (I) is preferably used in an amount of 0.01 to 10 parts, more preferably 0.01 to 5 parts by weight per part by weight of the basic compound (E).

Pattern Forming Process

It is now described how to form a pattern using the resist composition of the invention. A pattern may be formed from the resist composition using any well-known lithography process. The preferred process includes at least the steps of forming a resist coating on a substrate, exposing it to high-energy radiation, and developing it with a developer.

The resist composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.01 to 2.0 μm thick. It is noted in conjunction with spin coating that if the resist composition is coated onto the surface of a substrate which has been wetted with the resist solvent or a solution miscible with the resist solvent, then the amount of the resist composition dispensed can be reduced (see JP-A H09-246173).

A mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be dry exposure in air or nitrogen atmosphere, or immersion lithography of providing a liquid, typically water between the resist film and the projection lens. The liquid used for immersion is a liquid having a refractive index of at least 1 and high transparency at the exposure wavelength, such as water or alkane. EB or EUV exposure in vacuum is also acceptable.

The resist film formed from the resist composition has such barrier properties to water that it may inhibit resist components from being leached out in water and as a consequence, eliminate a need for a protective coating in the immersion lithography and reduce the cost associated with protective coating formation or the like. The resist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film. The resist protective coating may be either of the solvent stripping type or of the developer dissolution type. A resist protective coating of the developer dissolution type is advantageous for process simplicity because it can be stripped during development of a resist film of the resist composition. The resist protective coating used in the immersion lithography may be formed from a coating solution, for example, a topcoat solution of a polymer having acidic units such as 1,1,1,3,3,3-hexafluoro-2-hydroxy-2-propyl, carboxyl or sulfo groups which is insoluble in water and soluble in an alkaline developer liquid, in a solvent selected from alcohols of at least 4 carbon atoms, ethers of 8 to 12 carbon atoms, and mixtures thereof. The resist protective coating is not limited thereto.

The resist protective coating may be formed by spin coating a topcoat solution onto a prebaked resist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating material dispensed in forming a protective coating by spin coating may be reduced by previously wetting the resist film surface with a suitable solvent and applying the protective coating material thereto.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process.

After the exposure, development is carried out by a conventional method such as dip, puddle, or spray development with an aqueous alkaline solution such as tetramethylammonium hydroxide (TMAH) solution. The developer may have a concentration of 0.1 to 5 wt %, preferably 2 to 3 wt %. A typical developer is a 2.38 wt % TMAH aqueous solution. The development time is 10 to 300 seconds, and preferably 0.5 to 2 minutes. These steps result in the formation of the desired pattern on the substrate.

Where polymer P1 is used as an additive to a resist material for use with mask blanks, a resist solution is prepared by adding polymer P1 to a base resin and dissolving them in an organic solvent. The resist solution is coated on a mask blank substrate of SiO$_2$, Cr, CrO, CrN, MoSi or the like. A SOG film and an organic undercoat film may intervene between the resist film and the blank substrate to construct a three-layer structure which is also acceptable herein.

As the base resin of the resist composition for use with mask blanks, novolac resins and hydroxystyrene are often used. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinylnaphthalene, vinylanthracene, vinylpyrene, hydroxyvinylnaphthalene, hydroxyvinylanthracene, indene, hydroxyindene, acenaphthylene, and norbornadiene derivatives.

Once the resist coating is formed, the structure is exposed to EB in vacuum using an EB image-writing system. The exposure is followed by post-exposure baking (PEB) and development in an alkaline developer for 10 to 300 seconds, thereby forming a pattern.

EXAMPLE

Examples are given below by way of illustration and not by way of limitation. The abbreviations Mw and Mn are weight and number average molecular weights, respectively, as measured by gel permeation chromatography (GPC) versus polystyrene standards, and Mw/Mn is a polydispersity index.

Monomer Synthesis

Fluorinated monomers (Monomers 1 to 4) corresponding to recurring units of formula (1), (1-1) or (1-2) in additive polymers were synthesized according to the following formulation.

Monomer Synthesis Example 1

Synthesis of Monomer 1

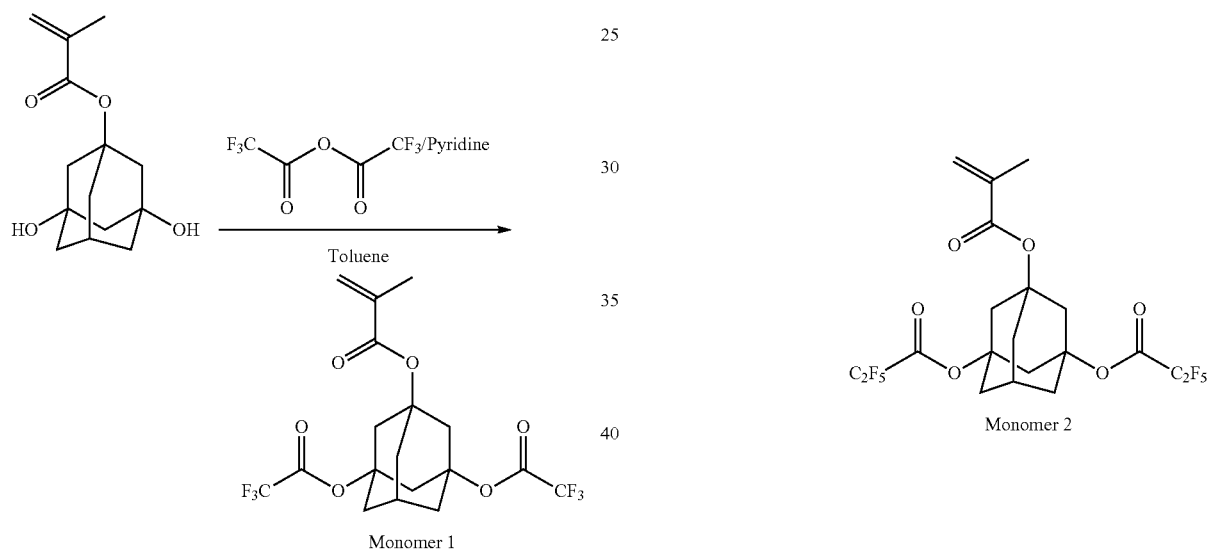

Monomer 1

A 10-L four-necked flask was charged with 800 g of 3,5-dihydroxy-1-adamantyl methacrylate and 3 L of toluene. With the flask ice cooled, 552 g of pyridine was added and the contents were thoroughly stirred. While the flask was maintained at a temperature below 15° C., 465 g of trifluoroacetic anhydride was added dropwise over 4 hours. Stirring was continued for a further 17 hours. With ice cooling, 1,000 g of water was poured into the flask. This was followed by ordinary post-treatment and vacuum distillation, obtaining 1,377 g of the target compound (yield 97.8%).

Boiling point: 108-111° C./20 Pa $^1$H-NMR (300 MHz in CDCl$_3$):

δ=1.90 (3H, m), 2.10-2.25 (6H, m), 2.55-2.75 (7H, m), 5.56 (1H, m), 6.04 (1H, m) ppm $^{13}$C-NMR (75 MHz in CDCl$_3$):

δ=18.19, 29.11, 38.25, 38.38, 43.29, 43.41, 79.00, 84.38, 114.13 (q, J=285 Hz), 125.92, 136.81, 155.68 (q, J=42 Hz), 166.05 ppm $^{19}$F-NMR (283 MHz in CDCl$_3$, trifluoroacetic acid standard):

δ=−76.9 (6F, s) ppm

Monomer Synthesis Example 2

Synthesis of Monomer 2

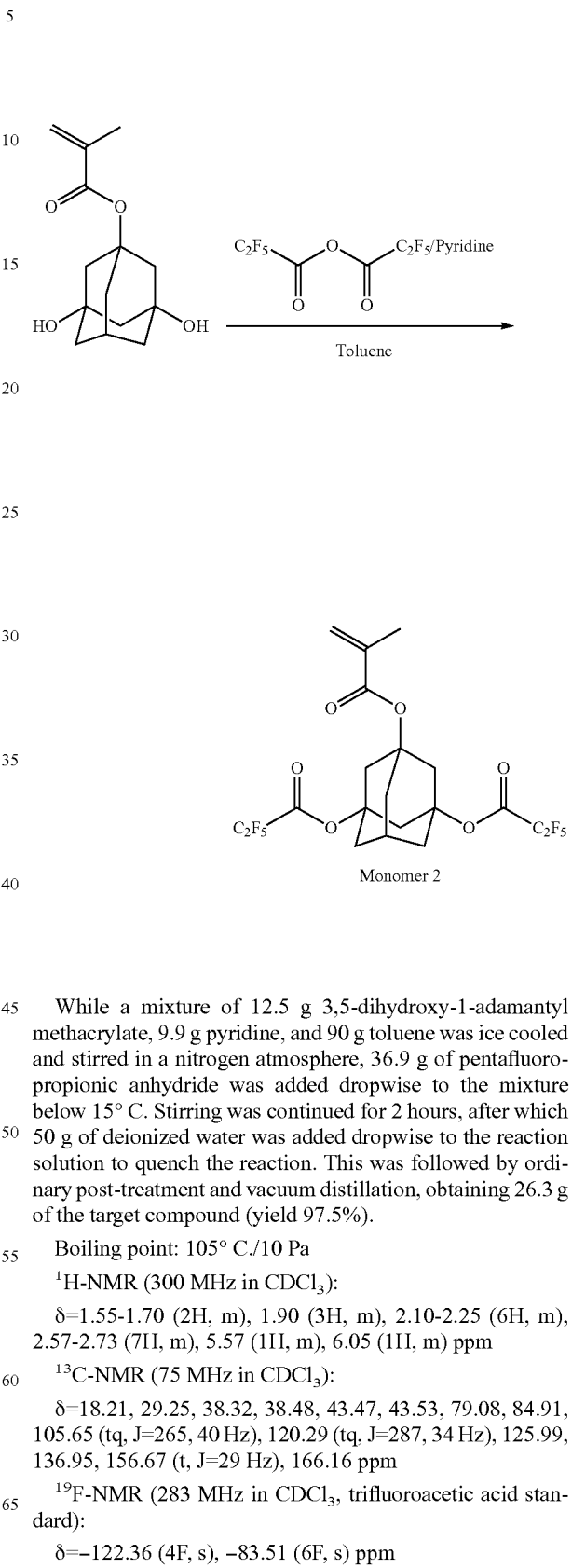

Monomer 2

While a mixture of 12.5 g 3,5-dihydroxy-1-adamantyl methacrylate, 9.9 g pyridine, and 90 g toluene was ice cooled and stirred in a nitrogen atmosphere, 36.9 g of pentafluoropropionic anhydride was added dropwise to the mixture below 15° C. Stirring was continued for 2 hours, after which 50 g of deionized water was added dropwise to the reaction solution to quench the reaction. This was followed by ordinary post-treatment and vacuum distillation, obtaining 26.3 g of the target compound (yield 97.5%).

Boiling point: 105° C./10 Pa $^1$H-NMR (300 MHz in CDCl$_3$):

δ=1.55-1.70 (2H, m), 1.90 (3H, m), 2.10-2.25 (6H, m), 2.57-2.73 (7H, m), 5.57 (1H, m), 6.05 (1H, m) ppm $^{13}$C-NMR (75 MHz in CDCl$_3$):

δ=18.21, 29.25, 38.32, 38.48, 43.47, 43.53, 79.08, 84.91, 105.65 (tq, J=265, 40 Hz), 120.29 (tq, J=287, 34 Hz), 125.99, 136.95, 156.67 (t, J=29 Hz), 166.16 ppm $^{19}$F-NMR (283 MHz in CDCl$_3$, trifluoroacetic acid standard):

δ=−122.36 (4F, s), −83.51 (6F, s) ppm

Monomer Synthesis Example 3

Synthesis of Monomer 3

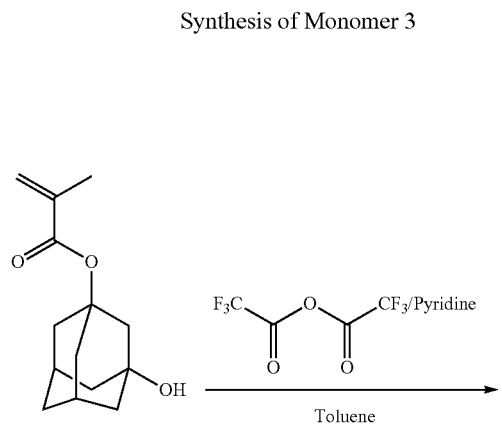

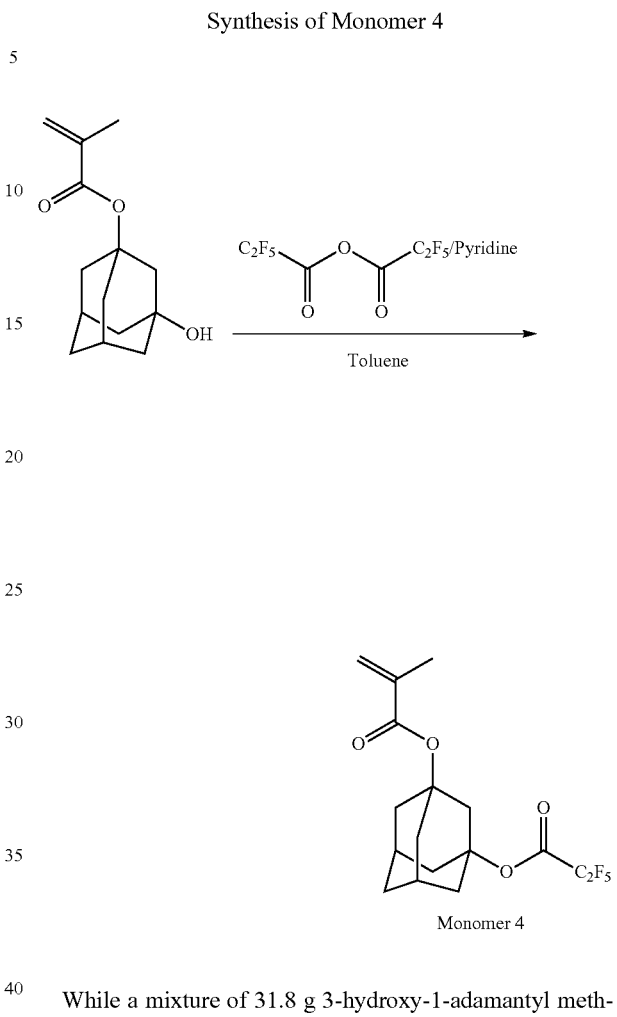

Monomer 4

While a mixture of 50.0 g 3-hydroxy-1-adamantyl methacrylate, 20.1 g pyridine, and 150 g acetonitrile was ice cooled and stirred in a nitrogen atmosphere, 53.4 g of trifluoroacetic anhydride was added dropwise to the mixture below 10° C. Stirring was continued for 1 hour, after which 200 g of hexane and 200 g of deionized water were successively added dropwise to the reaction solution to quench the reaction. This was followed by ordinary post-treatment and vacuum distillation, obtaining 67.9 g of the target compound (yield 96.4%).

Boiling point: 89° C./20 Pa $^1$H-NMR (300 MHz in CDCl$_3$):

δ=1.55-1.70 (2H, m), 1.89 (3H, m), 2.05-2.25 (8H, m), 2.44 (2H, m), 2.59 (2H, m), 5.52 (1H, m), 6.02 (1H, m) ppm $^{13}$C-NMR (75 MHz in CDCl$_3$):

δ=18.28, 31.23, 34.51, 39.61, 39.69, 44.74, 80.36, 86.49, 114.27 (q, J=285 Hz), 125.08, 137.43, 155.77 (q, J=41 Hz), 166.25 ppm $^{19}$F-NMR (283 MHz in CDCl$_3$, trifluoroacetic acid standard):

δ=−76.67 (3F, s) ppm

Monomer Synthesis Example 4

Synthesis of Monomer 4

While a mixture of 31.8 g 3-hydroxy-1-adamantyl methacrylate, 12.8 g pyridine, and 100 g toluene was ice cooled and stirred in a nitrogen atmosphere, 50.0 g of pentafluoropropionic anhydride was added dropwise to the mixture below 15° C. Stirring was continued for 3 hours, after which 100 g of deionized water was added dropwise to the reaction solution to quench the reaction. This was followed by ordinary post-treatment and vacuum distillation, obtaining 50.7 g of the target compound (yield 97.4%).

Boiling point: 90° C./13 Pa $^1$H-NMR (300 MHz in DMSO-d6):

δ=1.53-1.59 (2H, m), 1.83 (3H, m), 2.05-2.15 (8H, m), 2.35-2.43 (2H, m), 2.54 (2H, s), 5.52 (1H, m), 5.97 (1H, m) ppm $^{13}$C-NMR (75 MHz in DMSO-d6):

δ=17.98, 30.91, 33.90, 39.16, 39.24, 44.09, 80.19, 87.81, 105.25 (tq, J=265, 39 Hz), 117.62 (tq, J=287, 34 Hz), 125.33, 137.13, 155.73 (t, J=28 Hz), 165.55 ppm $^{19}$F-NMR (283 MHz in DMSO-d6, trifluoroacetic acid standard):

δ=−122.60 (2F, s), −83.59 (3F, s) ppm

Polymer Synthesis

Monomers 1 to 11 used in Polymer Synthesis Examples are identified below by their structural formula.

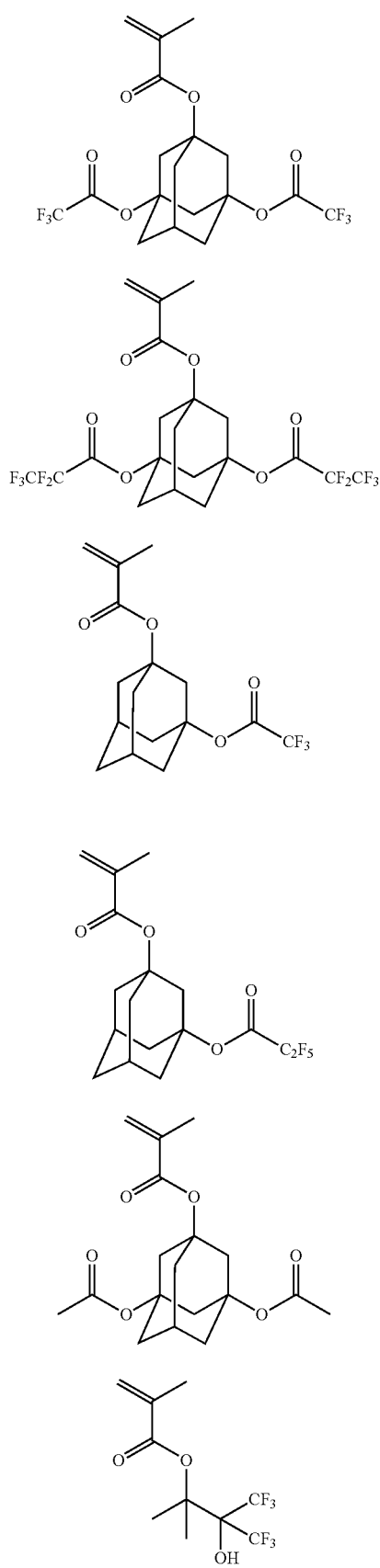
Monomer 1
Monomer 2
Monomer 3
Monomer 4
Monomer 5
Monomer 6
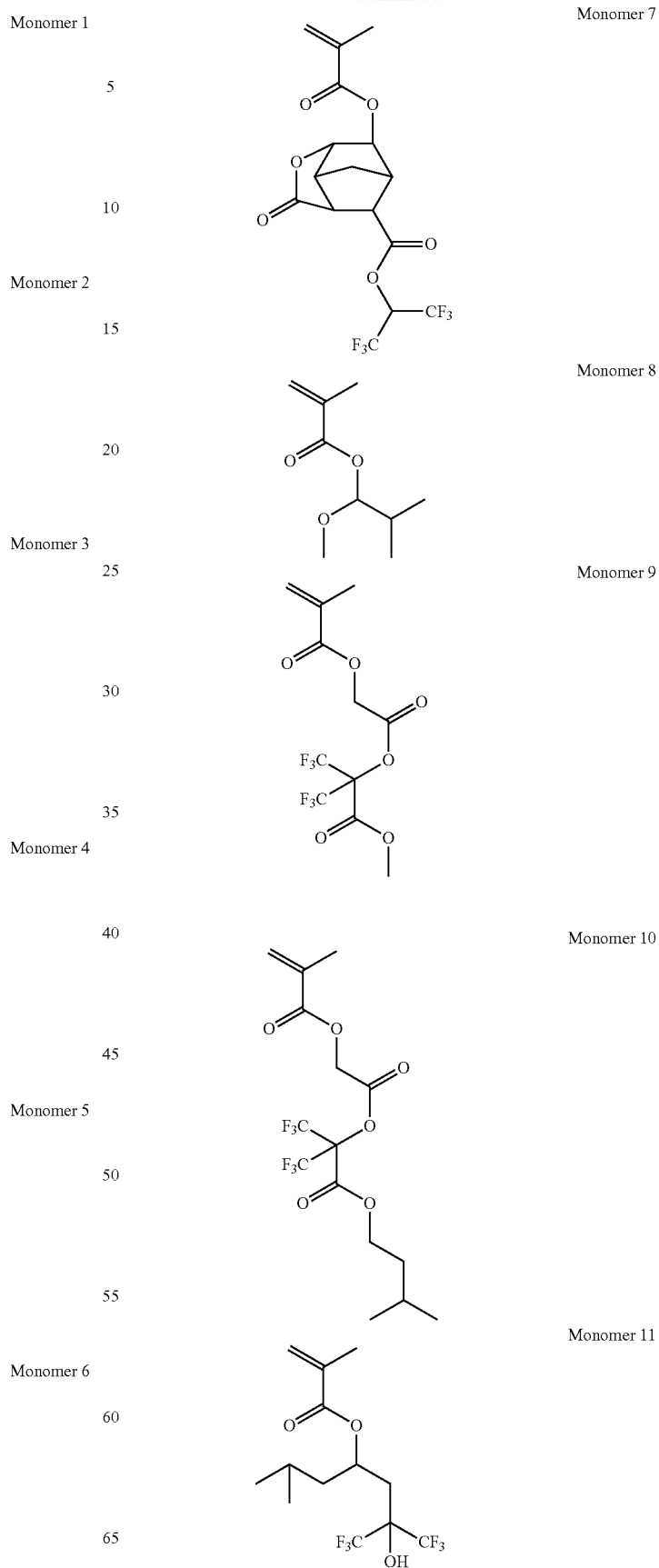
Monomer 7
Monomer 8
Monomer 9
Monomer 10
Monomer 11

Polymer Synthesis Example 1

Polymer 1 from Copolymerization (60/40) of Monomers 1 and 6

In a nitrogen atmosphere, a flask was charged with 104.1 g of Monomer 1, 46.0 g of Monomer 6, 4.5 g of dimethyl 2,2'-azobis(isobutyrate), and 150.0 g of methyl ethyl ketone to form a monomer solution at a temperature of 20-25° C. In a nitrogen atmosphere, another flask was charged with 50.0 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. The polymerization solution was transferred to an eggplant-shape flask and concentrated using an evaporator. Then toluene was added to the flask so as to eventually form a 40 wt % solution of toluene/methyl ethyl ketone (mix ratio 9/1). The solution was added dropwise to 1,500 g of hexane whereupon a copolymer precipitated. The copolymer was collected by filtration, washed with 900 g of hexane, and separated as a white solid. The white solid was vacuum dried at 50° C. for 20 hours, yielding 135.2 g of the target copolymer, designated Polymer 1. The copolymer was analyzed for composition by $^1$H-NMR, finding that it consisted of 38/62 mol % of Monomers 1 and 6. The copolymer was also analyzed by GPC, finding Mw=11,200 and Mw/Mn=1.6.

Polymer Synthesis Examples 2 to 16

Polymers 2 to 16 and Comparative Polymers 1 to 3 were synthesized as in Synthesis Example 1, aside from using different monomers (Monomers 1 to 11) in accordance with the formulation shown in Tables 1 to 3. It is noted that the values of formulation in Tables 1 to 3 are molar ratios of monomers charged. In the following formulae representative of polymers, the numerical value affixed to each recurring unit is a compositional ratio as analyzed by $^1$H-NMR.

TABLE 1

| Formulation | Monomer 1 | 6 | 7 | 8 | 9 | 10 | 11 | Yield, % | Mw | Mw/Mn |
|---|---|---|---|---|---|---|---|---|---|---|
| Polymer 1 | 60 | 40 | | | | | | 90.0 | 11,200 | 1.5 |
| Polymer 2 | 50 | 50 | | | | | | 90.6 | 10,800 | 1.6 |
| Polymer 3 | 40 | 60 | | | | | | 77.6 | 9,600 | 1.8 |
| Polymer 4 | 40 | 40 | 20 | | | | | 83.8 | 12,200 | 1.6 |
| Polymer 5 | 40 | 50 | | 10 | | | | 86.0 | 11,600 | 1.6 |
| Polymer 6 | 60 | 10 | | 30 | | | | 83.3 | 12,700 | 1.6 |
| Polymer 7 | 20 | 40 | | | 40 | | | 75.7 | 10,200 | 1.5 |
| Polymer 8 | 30 | 40 | | 30 | | | | 68.8 | 8,600 | 1.4 |
| Polymer 9 | 30 | 40 | | | 30 | | | 68.0 | 8,500 | 1.4 |
| Polymer 10 | 25 | 30 | 20 | 25 | | | | 84.0 | 10,000 | 1.5 |
| Polymer 11 | 30 | 30 | 10 | 30 | | | | 84.6 | 12,300 | 1.5 |
| Polymer 12 | 30 | 30 | 10 | | 30 | | | 84.0 | 12,000 | 1.5 |
| Polymer 13 | 40 | 40 | | | | | 20 | 87.2 | 11,300 | 1.5 |

TABLE 2

| Formulation | Monomer 2 | 3 | 4 | 6 | Yield, % | Mw | Mw/Mn |
|---|---|---|---|---|---|---|---|
| Polymer 14 | 60 | | | 40 | 81.2 | 12,600 | 1.5 |
| Polymer 15 | | 60 | | 40 | 83.5 | 10,000 | 1.6 |
| Polymer 16 | | | 60 | 40 | 81.4 | 12,400 | 1.5 |

TABLE 3

| Formulation | Monomer 5 | 6 | 11 | Yield, % | Mw | Mw/Mn |
|---|---|---|---|---|---|---|
| Comparative Polymer 1 | | 100 | | 88.2 | 8,500 | 1.5 |
| Comparative Polymer 2 | 60 | 40 | | 78.6 | 9,200 | 1.6 |
| Comparative Polymer 3 | | 50 | 50 | 86.0 | 6,600 | 1.5 |

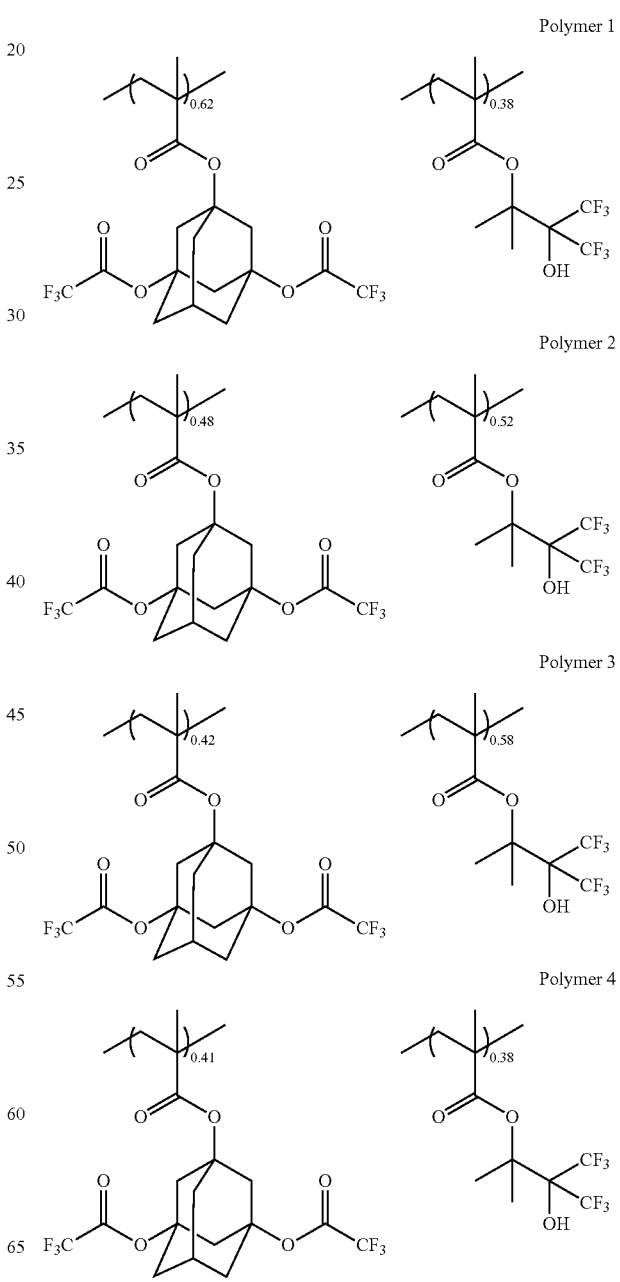

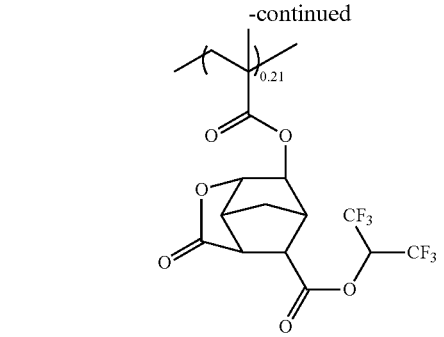
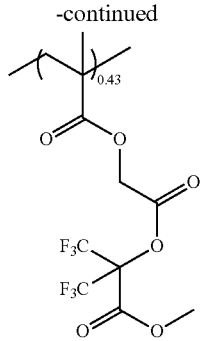
Polymer 5
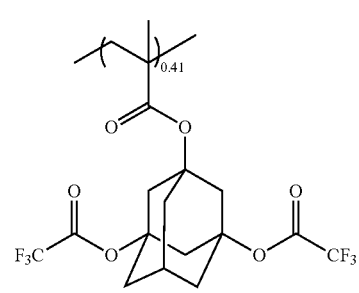
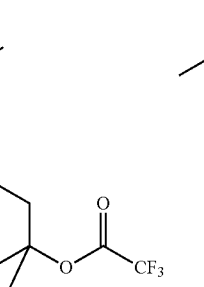
Polymer 8
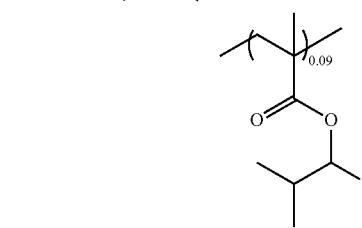
Polymer 6
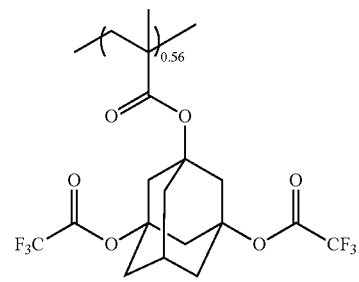
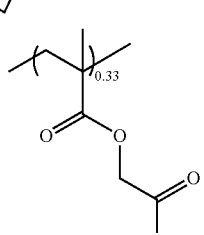
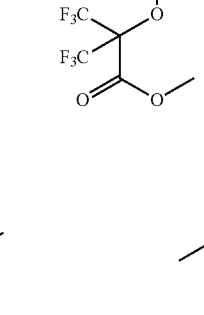
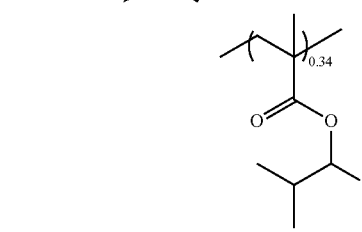
Polymer 9
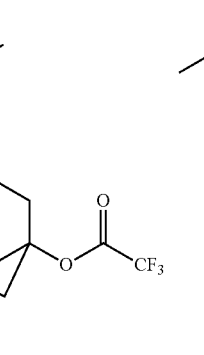
Polymer 7
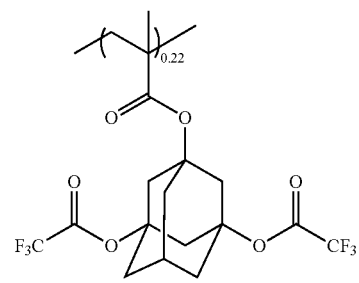
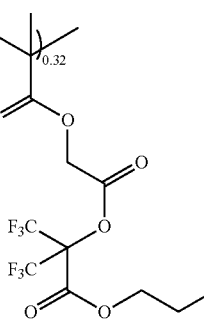

Polymer 10
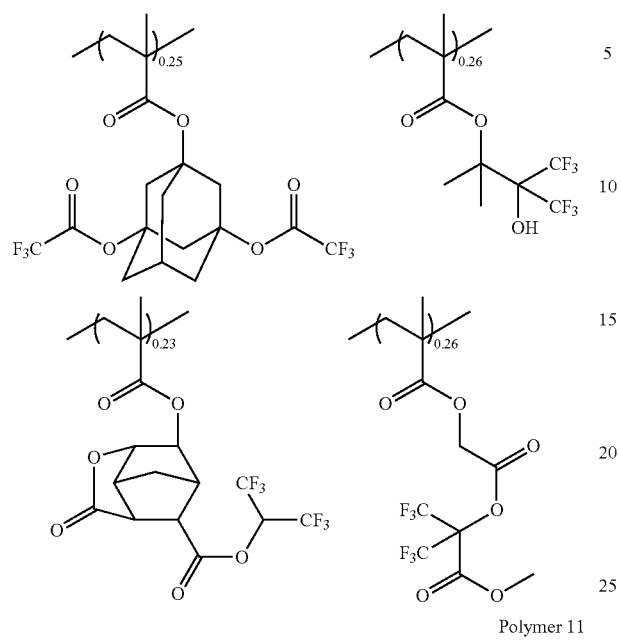
Polymer 11
Polymer 12
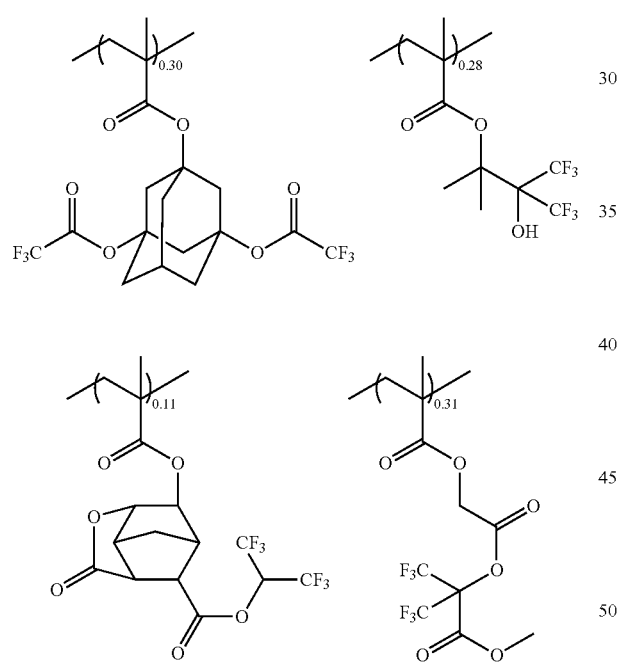
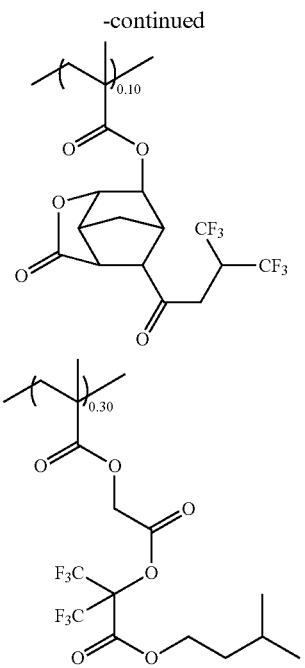
Polymer 13
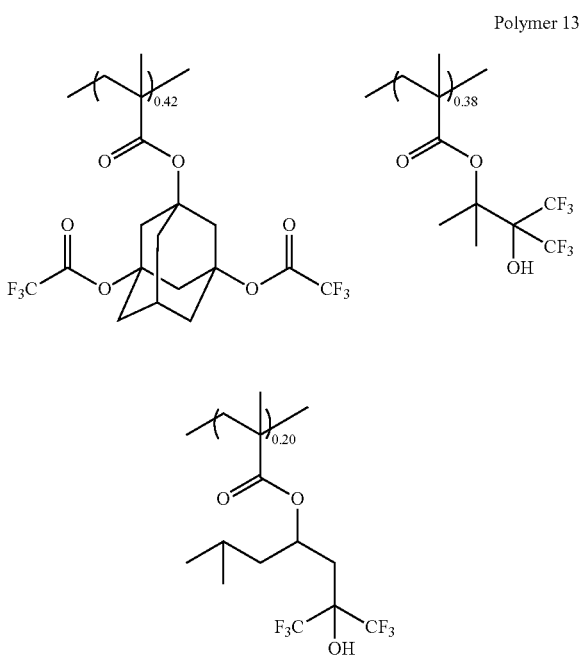
Polymer 14
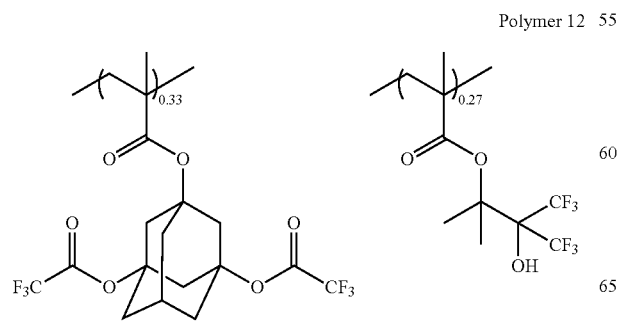
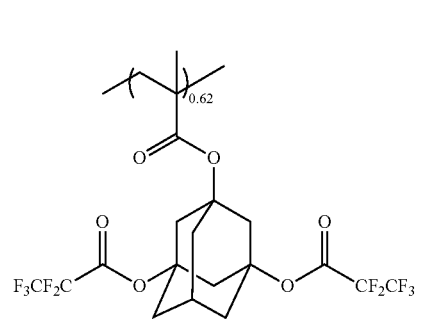

-continued

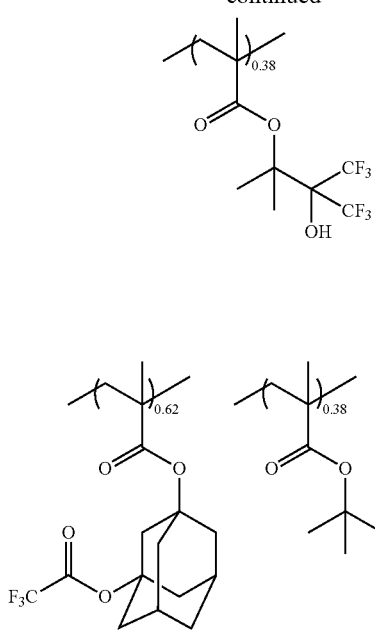

Polymer 15

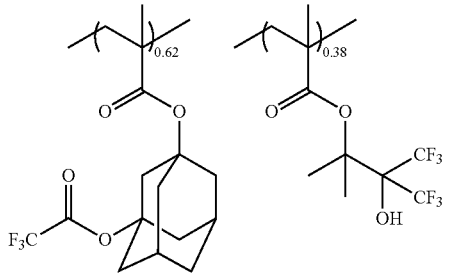

Polymer 16

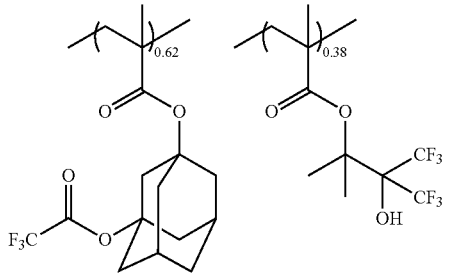

Comparative Polymer 1

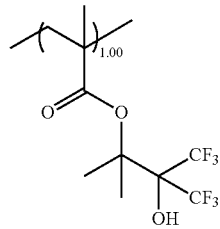

Comparative Polymer 2

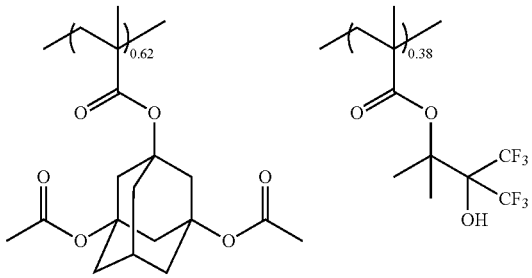

-continued

Comparative Polymer 3

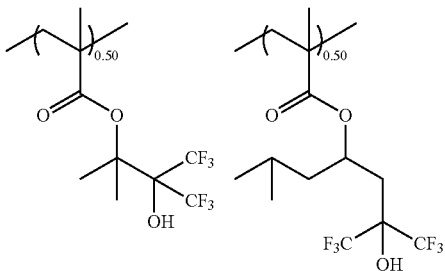

Evaluation of Resist

A resist solution was prepared by dissolving 5 g of Resist Polymer (shown below), 0.25 g of an additive polymer selected from Polymers 1 to 16 and Comparative Polymers 1 to 3, 0.25 g of PAG1 (shown below), and 0.05 g of Quencher 1 (shown below) in 75 g of PGMEA and filtering through a polypropylene filter having a pore size of 0.2 μm. In Comparative Example, a resist solution was similarly prepared aside from omitting the additive polymer.

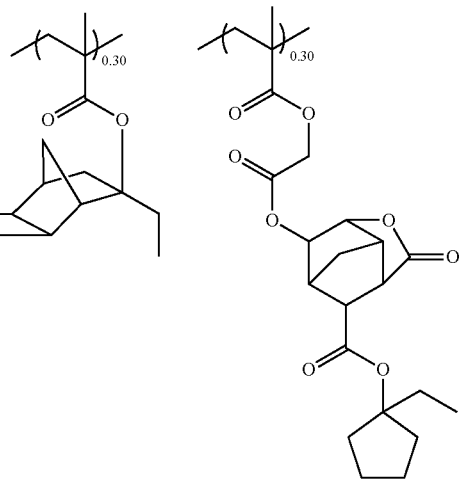

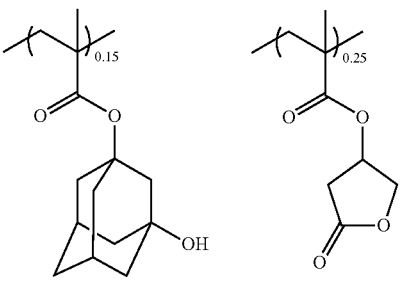

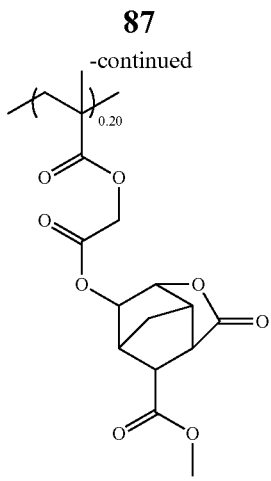

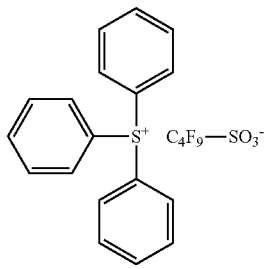

PAG 1

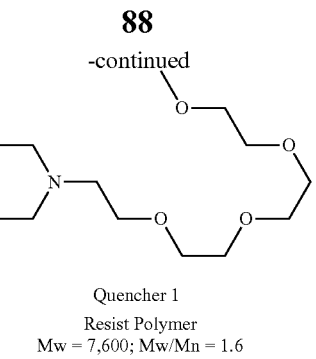

Quencher 1

Resist Polymer
Mw = 7,600; Mw/Mn = 1.6

An antireflective coating ARC-29A (Nissan Chemical Co., Ltd.) was deposited on a silicon substrate to a thickness of 87 nm. The resist solution was applied onto the ARC and baked at 120° C. for 60 seconds to form a resist film of 150 nm thick.

A contact angle with water of the resist film was measured, using an inclination contact angle meter prop Master 500 by Kyowa Interface Science Co., Ltd. Specifically, the wafer covered with the resist film was kept horizontal, and 50 µL of pure water was dropped on the resist film to form a droplet. While the wafer was gradually inclined, the angle (sliding angle) at which the droplet started sliding down was determined as well as receding contact angle. Also a contact angle with water of resist film after development was determined by preparing a resist film as above, dipping the resist film in an alkaline developer, 2.38 wt % TMAH aqueous solution for 60 seconds, washing with pure water, spin drying, dropping 5 µL of pure water on the resist film, and measuring a contact angle in zero inclination (or horizontal) state by the contact angle meter. The results are shown in Table 4.

TABLE 4

| Additive Polymer | Sliding angle (°) | Receding contact angle (°) | Anion leach-out (ppb) | Sensitivity (mJ/cm$^2$) | 75-nm pattern profile | Contact angle with water after development (°) |
|---|---|---|---|---|---|---|
| Polymer 1 | 9 | 82 | 6 | 31 | rectangular | 64 |
| Polymer 2 | 10 | 80 | 6 | 32 | rectangular | 63 |
| Polymer 3 | 11 | 77 | 6 | 32 | rectangular | 64 |
| Polymer 4 | 12 | 78 | 6 | 31 | rectangular | 61 |
| Polymer 5 | 11 | 79 | 7 | 32 | rectangular | 66 |
| Polymer 6 | 8 | 85 | 7 | 31 | rectangular | 52 |
| Polymer 7 | 10 | 83 | 6 | 31 | rectangular | 59 |
| Polymer 8 | 9 | 83 | 6 | 31 | rectangular | 59 |
| Polymer 9 | 10 | 85 | 6 | 32 | rectangular | 61 |
| Polymer 10 | 10 | 82 | 7 | 32 | rectangular | 61 |
| Polymer 11 | 10 | 82 | 7 | 31 | rectangular | 61 |
| Polymer 12 | 9 | 84 | 6 | 31 | rectangular | 63 |
| Polymer 13 | 11 | 84 | 6 | 31 | rectangular | 61 |
| Polymer 14 | 9 | 92 | 7 | 32 | rectangular | 64 |
| Polymer 15 | 11 | 78 | 7 | 34 | rectangular | 66 |
| Polymer 16 | 10 | 85 | 6 | 32 | rectangular | 71 |
| Comparative Polymer 1 | 21 | 60 | 6 | 31 | rectangular | 73 |
| Comparative Polymer 2 | 20 | 58 | 7 | 33 | rectangular | 75 |
| Comparative Polymer 3 | 16 | 73 | 6 | 33 | rectangular | 74 |
| not added | 28 | 40 | 60 | 31 | T-top | 75 |

As seen from Table 4, the resist films formed from the resist solutions containing the additive polymers according to the invention display an outstandingly improved receding contact angle and a reduced sliding angle as compared with those free of the additive polymers. In general, a smaller sliding angle indicates an easier flow of water on the resist film, and a larger receding contact angle indicates that fewer liquid droplets are left during high-speed scan exposure. From a resist solution having the additive polymer added thereto, a resist film having high water repellency and water slip enough to withstand the high-speed scanning immersion lithography can be formed, eliminating a need for a resist protective coating.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of pure water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The results are also shown in Table 4.

It is evident from Table 4 that the resist films formed from the resist solutions containing the additive polymers according to the invention are effective in inhibiting the PAG from being leached out of the films in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing pure water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are also shown in Table 4.

As seen from Table 4, when exposure was followed by water rinsing, the resist film having the additive polymer according to the invention formulated therein formed a pattern of rectangular profile, in stark contrast with the resist film free of the additive polymer forming a pattern of T-top profile.

Evaluation of Development Defects

Some resist solutions used in the patterning experiment were precision filtered through a high-density polyethylene filter with a pore size of 0.02 μm. An antireflective coating ARC-29A (Nissan Chemical Co., Ltd.) of 87 nm thick was deposited on a 8-inch silicon substrate. The resist solution was applied onto the ARC and baked at 120° C. for 60 seconds to form a resist film of 150 nm thick. Using an ArF scanner model S307E (Nikon Corp., NA 0.85, σ 0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds. Using a flaw detector Win-Win 50-1200 (Tokyo Seimitsu Co., Ltd.), the number of blob defects in the unexposed portion of the checkered-flag was counted at the pixel size of 0.125 μm. The results are shown in Table 5.

TABLE 5

| Additive polymer | Number of defects |
|---|---|
| Polymer 1 | 10 |
| Polymer 2 | 15 |
| Polymer 4 | 10 |
| Polymer 7 | 10 |
| Polymer 8 | 15 |
| Polymer 9 | 10 |
| Polymer 10 | 10 |
| Polymer 11 | 15 |
| Polymer 12 | 20 |
| Polymer 13 | 15 |
| Polymer 14 | 10 |
| Polymer 15 | <200 |
| Polymer 16 | <200 |
| Comparative Polymer 1 | >10,000 |
| Comparative Polymer 2 | >10,000 |
| Comparative Polymer 3 | >1,000 |
| not added | >10,000 |

It is evident from Table 5 that in the resist film from the resist solution free of the additive polymer, numerous development defects were observed after the immersion lithography. The defects could not be obviated by adding Comparative Polymers 1 to 3. The resist solution containing the additive polymer (Polymer 1, 2, 4, 7 to 14) according to the invention was effective in minimizing such defects.

It is presumed from the results of Table 4 that since the resist films from the resist compositions containing Polymers 1, 2, 4, 7 to 14 have a lower contact angle with water after development than the resist films from the resist compositions containing Comparative Polymers 1 to 3, the resist film surface is rendered hydrophilic by hydrolysis with the developer, and as a result, defects are controlled. A comparison in structure of Polymer 1 with Comparative Polymer 2 reveals that the presence of fluorine atoms in the alkylcarbonyloxy group is essential for defect control. The correlation of the structure of Polymer 1 and Polymers 15 and 16 to the number of defects reveals that less satisfactory results are obtained when the number of fluorinated alkylcarbonyloxy groups within the recurring unit is 1, and at least 2 fluorinated alkylcarbonyloxy groups are necessary.

Japanese Patent Application No. 2010-007945 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formula (1):

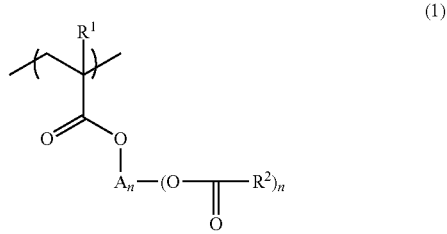

(1)

wherein $R^1$ is hydrogen, fluorine, methyl, or trifluoromethyl, $R^2$ is a straight, branched or cyclic $C_1$-$C_{10}$ monovalent fluorinated hydrocarbon group, $A_n$ is a straight or branched $C_1$-$C_{15}$ (n+1)-valent hydrocarbon or fluorinated hydrocarbon group, or

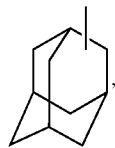

and n is an integer of 1 to 3, said polymer having a solubility in alkaline developer which increases under the action of an alkaline developer.

2. The polymer of claim 1, comprising recurring units having the general formula (1-1):

(1-1)

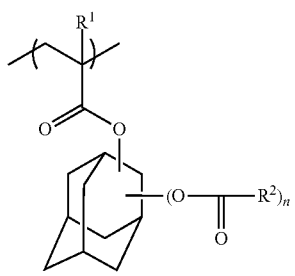

wherein $R^1$, $R^2$ and n are as defined above.

3. The polymer of claim 2, comprising recurring units having the general form (1-2):

(1-2)

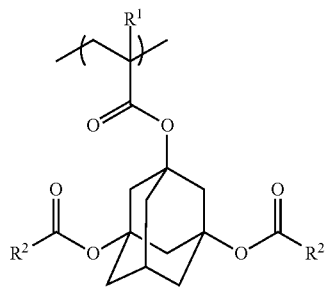

wherein $R^1$ and $R^2$ are as defined above.

4. A polymer comprising recurring units having the general formula (1) as set forth in claim 1 and recurring units of one or more type selected from the general formulae (2a) to (2h):

(2a)

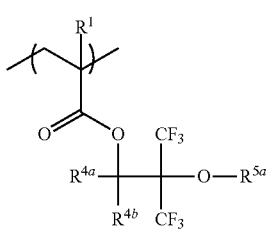

(2b)

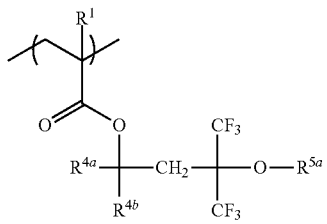

(2c)

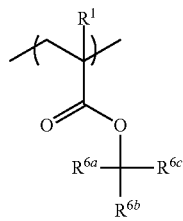

(2d)

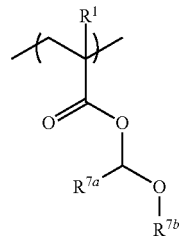

(2e)

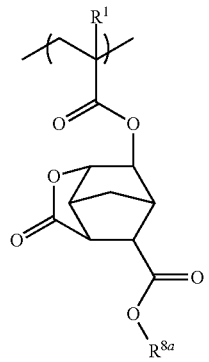

(2f)

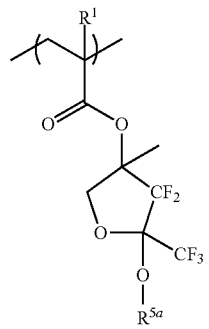

(2g)

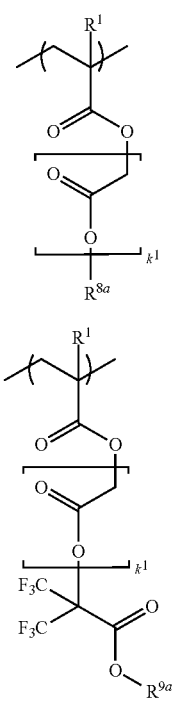

(2h)

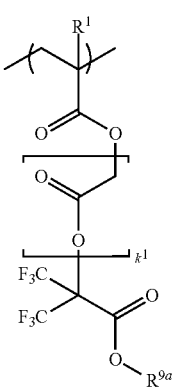

wherein $R^1$ is as defined above, $R^{4a}$ and $R^{4b}$ each are hydrogen or a straight, branched or cyclic $C_1$-$C_{15}$ monovalent hydrocarbon group, $R^{4a}$ and $R^{4b}$ may bond together to form a $C_3$-$C_8$ non-aromatic ring with the carbon atom to which they are attached, $R^{5a}$ is hydrogen, a straight, branched or cyclic $C_1$-$C_{15}$ monovalent hydrocarbon or fluorinated hydrocarbon group in which a —$CH_2$— moiety may be replaced by —O— or —C(=O)—, or an acid labile group, $R^{6a}$, $R^{6b}$ and $R^{6c}$ each are hydrogen or a straight, branched or cyclic $C_1$-$C_{15}$ monovalent hydrocarbon group, $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached, $R^{7a}$ is hydrogen or a straight, branched or cyclic $C_1$-$C_{15}$ monovalent hydrocarbon group, $R^{7b}$ is a straight, branched or cyclic $C_1$-$C_{15}$ monovalent hydrocarbon group, $R^{7a}$ and $R^{7b}$ may bond together to form a $C_3$-$C_8$ non-aromatic ring with the carbon atom to which they are attached, $R^{8a}$ is a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^1$ is an integer of 0 to 6.

5. A resist composition comprising
(A) the polymer of claim 1,
(B) a polymer having a lactone ring-derived structure, hydroxyl-containing structure and/or maleic anhydride-derived structure as a base resin, said polymer becoming soluble in alkaline developer under the action of acid,
(C) a compound capable of generating an acid upon exposure to high-energy radiation, and
(D) an organic solvent.

6. The resist composition of claim 5 wherein the polymer (B) is selected from the group consisting of (meth)acrylate polymers, (α-trifluoromethyl)acrylate-maleic anhydride copolymers, cycloolefin-maleic anhydride copolymers, polynorbonene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

7. The resist composition of claim 5 wherein the polymer (B) comprises recurring units of one or more type selected from the general formulae (B)-1 to (B)-6:

(B)-1

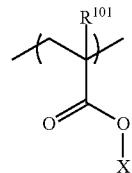

(B)-2

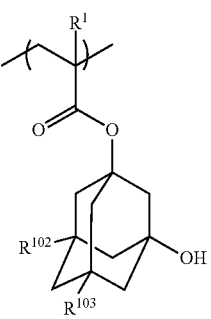

(B)-3

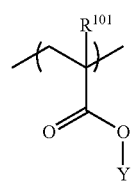

(B)-4

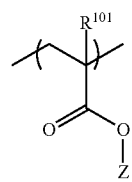

(B)-5

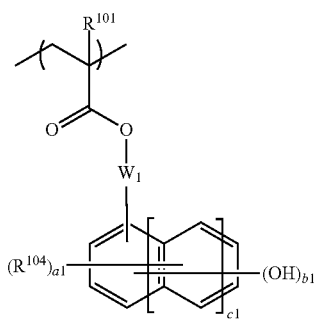

-continued (B)-6

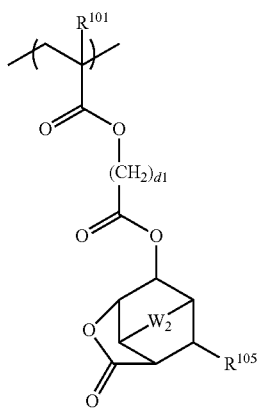

wherein $R^{101}$ is hydrogen, fluorine, methyl or trifluoromethyl, $R^{102}$ and $R^{103}$ are each independently hydrogen or hydroxyl, $R^{104}$ is hydrogen or a straight, branched or cyclic $C_1$-$C_{10}$ monovalent hydrocarbon group, $R^{105}$ is hydrogen or $CO_2R^{106}$, $R^{106}$ is hydrogen or a straight, branched or cyclic $C_1$-$C_{15}$ monovalent hydrocarbon group which may have a halogen or oxygen atom, X is an acid labile group, Y is a substituent group having a lactone structure, Z is hydrogen or a $C_1$-$C_{15}$ monovalent fluorinated hydrocarbon group, or a $C_1$-$C_{15}$ fluoroalcohol-containing substituent group, $W_1$ is a $C_1$-$C_{10}$ divalent organic group which may be substituted with oxygen, $W_2$ is $CH_2$, $CH_2CH_2$, or oxygen, a1 is an integer of 0 to 3, b1 is an integer of 1 to 3, c1 is an integer of 0 to 2, and d1 is an integer of 1 to 3.

8. The resist composition of claim 5 wherein the polymer (A) is added in an amount of 0.1 to 50 parts by weight per 100 part weight per 100 parts by weight of the polymer (B).

9. The resist composition of claim 5, further comprising (E) a basic compound.

10. The resist composition of claim 5, further comprising (F) a dissolution regulator.

11. A pattern forming process comprising the steps of (1) applying the resist composition of claim 5 onto a substrate to form a resist coating, (2) heat treating the resist coating and exposing it to high-energy radiation through a photomask, and (3) developing the exposed coating with a developer.

12. The process of claim 11 wherein the high-energy radiation has a wavelength in the range of 180 to 250 mm.

13. A pattern forming process comprising the steps of (1) applying the resist composition of claim 5 onto a substrate to form a resist coating, (2) heat treating the resist coating and exposing it to high-energy radiation from a projection lens through a photomask while holding a liquid between the substrate and the projection lens, and (3) developing the exposed coating with a developer.

14. The process of claim 13 wherein the liquid is water.

15. A pattern forming process comprising the steps of (1) applying the resist composition of claim 5 onto a substrate to form a resist coating, (2) forming a protective coating on the resist coating, (3) heat treating the resist coating and exposing it to high-energy radiation from a projection lens through a photomask while holding a liquid between the substrate and the projection lens, and (4) developing with a developer.

16. A pattern forming process comprising the steps of (1) applying the resist composition of claim 5 onto a mask blank to form a resist coating, (2) heat treating the resist coating and exposing it in vacuum to electron beam, and (3) developing with a developer.

17. A polymer comprising recurring units having the general formula (1):

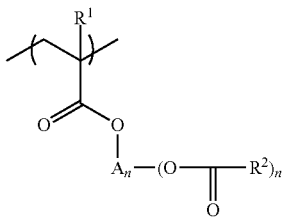

(1)

wherein $R^1$ is hydrogen, fluorine, methyl, or trifluoromethyl, $R^2$ is a straight, branched or cyclic $C_1$-$C_{10}$ monovalent fluorinated hydrocarbon group, $A_n$ is a straight or branched $C_1$-$C_{15}$ (n+1)-valent hydrocarbon or fluorinated hydrocarbon group, or

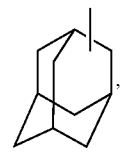

and n is an integer of 1 to 3, said polymer having a solubility in alkaline developer which increases under the action of an alkaline developer, and recurring units of one or more type selected from the general formulae (2a), (2b) and (2e) to (2h):

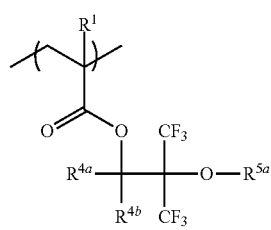

(2a)

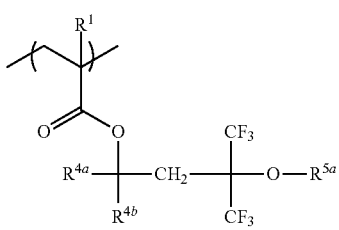

(2b)

(2e)

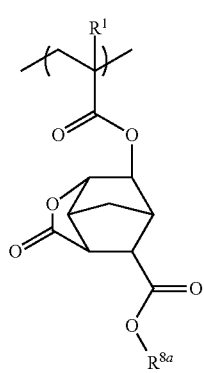

(2f)

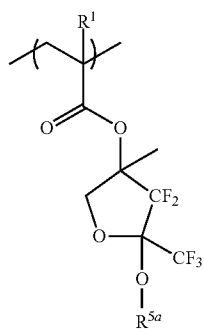

(2g)

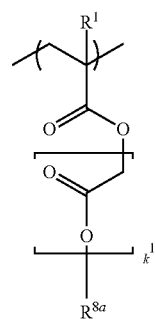

(2h)

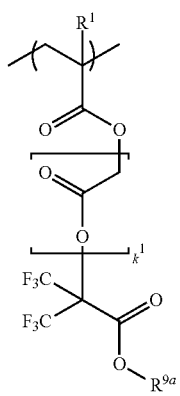

wherein $R^1$ is as defined above, $R^{4a}$ and $R^{4b}$ each are hydrogen or a straight, branched or cyclic $C_1$-$C_{15}$ monovalent hydrocarbon group, $R^{4a}$ and $R^{4b}$ may bond together to form a $C_3$-$C_8$ non-aromatic ring with the carbon atom to which they are attached, $R^{5a}$ is hydrogen, a straight, branched or cyclic $C_1$-$C_{15}$ monovalent hydrocarbon or fluorinated hydrocarbon group in which a —$CH_2$— moiety may be replaced by —O— or —C(=O)—, or an acid labile group, $R^{8a}$ is a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^1$ is an integer of 0 to 6.

18. A resist composition comprising
(A) the polymer of claim 17,
(B) a polymer having a lactone ring-derived structure, hydroxyl-containing structure and/or maleic anhydride-derived structure as a base resin, said polymer becoming soluble in alkaline developer under the action of acid,
(C) a compound capable of generating an acid upon exposure to high-energy radiation, and
(D) an organic solvent.

19. A pattern forming process comprising the steps of (1) applying the resist composition of claim 18 onto a substrate to form a resist coating, (2) heat treating the resist coating and exposing it to high-energy radiation from a projection lens through a photomask while holding a liquid between the substrate and the projection lens, and (3) developing the exposed coating with a developer.

20. The resist composition of claim 17, wherein the polymer (B) comprises recurring units of one or more type selected from the general formulae (B)-1 to (B)-6:

(B)-1

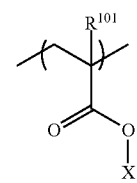

(B)-2

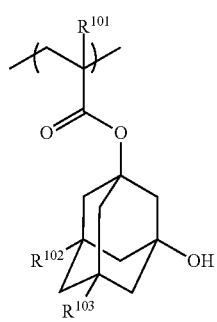

(B)-3

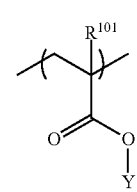

(B)-4

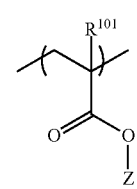

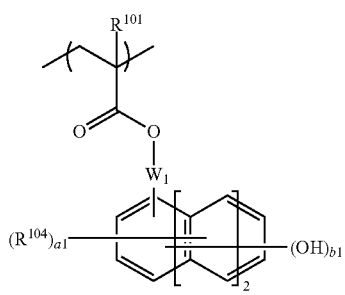

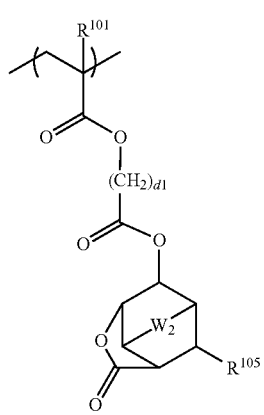

wherein $R^{101}$ is hydrogen, fluorine, methyl or trifluoromethyl, $R^{102}$ and $R^{103}$ are each independently hydrogen or hydroxyl, $R^{104}$ is hydrogen or a straight, branched or cyclic $C_1$-$C_{10}$ monovalent hydrocarbon group, $R^{105}$ is hydrogen or $CO_2R^{106}$, $R^{106}$ is hydrogen or a straight, branched or cyclic $C_1$-$C_{15}$ monovalent hydrocarbon group which may have a halogen or oxygen atom, X is an acid labile group, Y is a substituent group having a lactone structure, Z is hydrogen or a $C_1$-$C_{15}$ monovalent fluorinated hydrocarbon group, or a $C_1$-$C_{15}$ fluoroalcohol-containing substituent group, $W_1$ is a $C_1$-$C_{10}$ divalent organic group which may be substituted with oxygen, $W_2$ is $CH_2$, $CH_2CH_2$, or oxygen, a1 is an integer of 0 to 3, b1 is an integer of 1 to 3, c1 is an integer of 0 to 2, and d1 is an integer of 1 to 3.

21. A polymer comprising recurring units having the general formula (1-1):

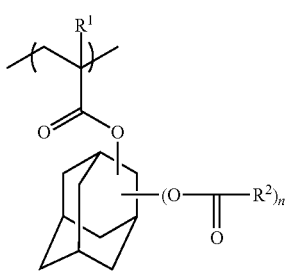

wherein $R^1$ is hydrogen, fluorine, methyl, or trifluoromethyl, $R^2$ is a straight, branched or cyclic $C_1$-$C_{10}$ monovalent fluorinated hydrocarbon group, and n is an integer of 1 to 3, and recurring units having any one of the following formulae:

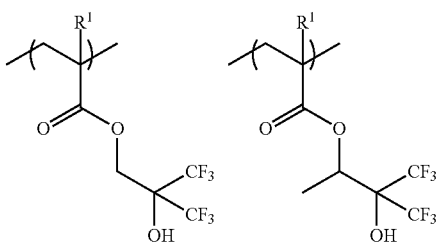

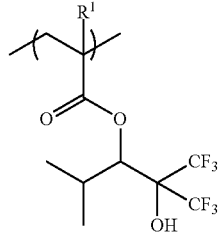

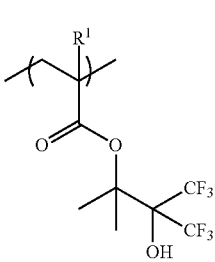

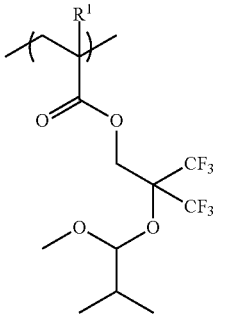

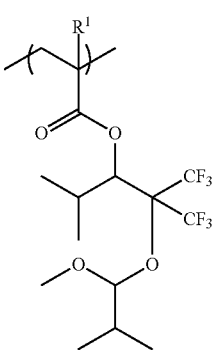

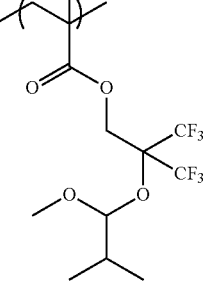

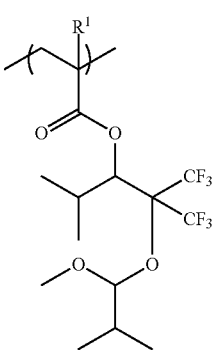

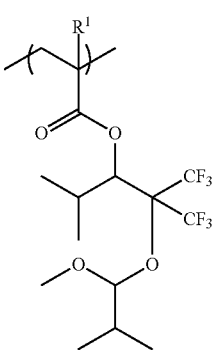

-continued

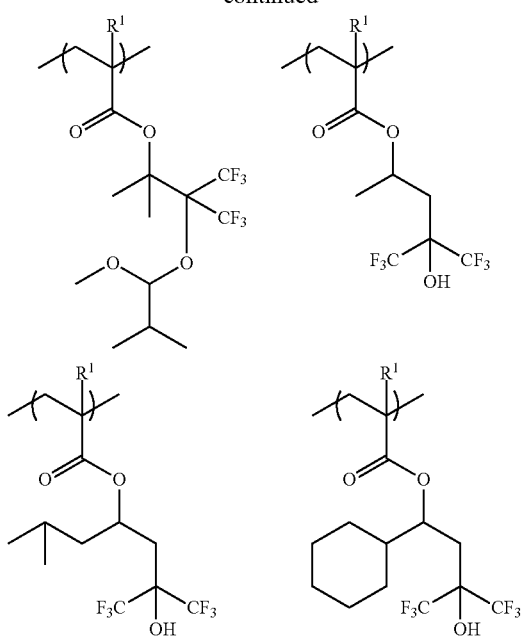
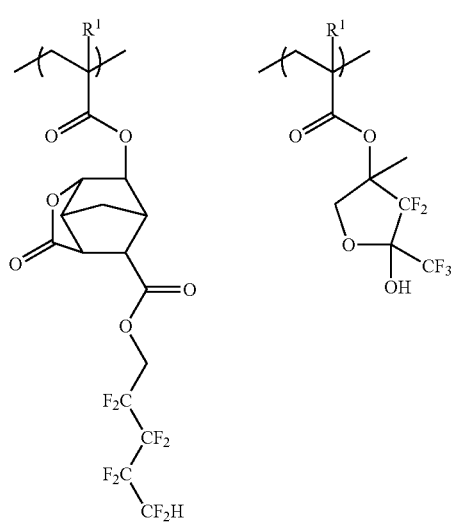
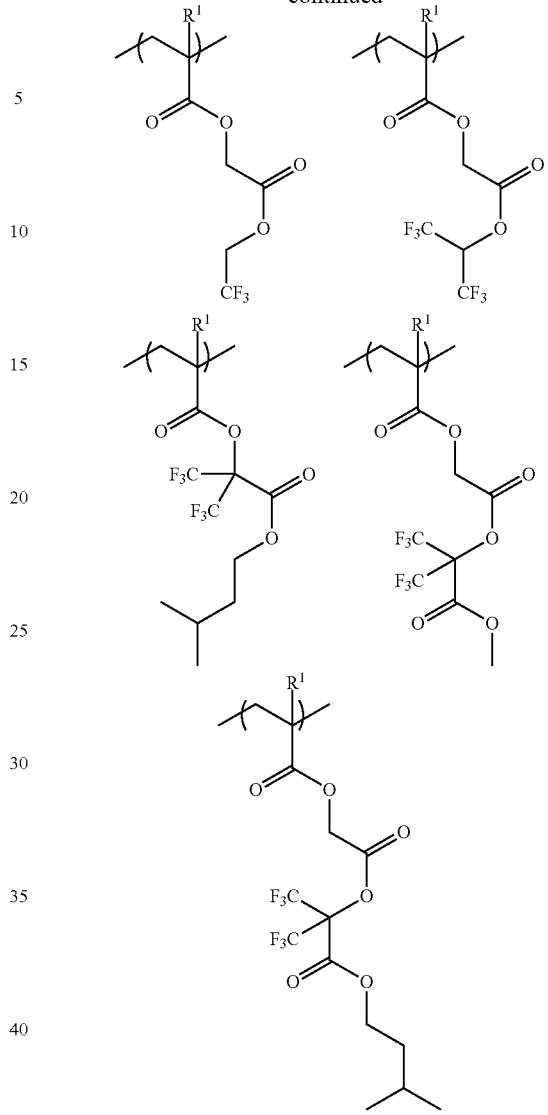

wherein $R^1$ is as defined above.

22. A resist composition comprising
(A) the polymer of claim 21,
(B) a polymer having a lactone ring-derived structure, hydroxyl-containing structure and/or maleic anhydride-derived structure as a base resin, said polymer becoming soluble in alkaline developer under the action of acid,
(C) a compound capable of generating an acid upon exposure to high-energy radiation, and
(D) an organic solvent.

23. A pattern forming process comprising the steps of (1) applying the resist composition of claim 22 onto a substrate to form a resist coating, (2) heat treating the resist coating and exposing it to high-energy radiation from a projection lens through a photomask while holding a liquid between the substrate and the projection lens, and (3) developing the exposed coating with a developer.

24. The resist composition of claim 21, wherein the polymer (B) comprises recurring units of one or more type selected from the general formulae (B)-1 to (B)-6:

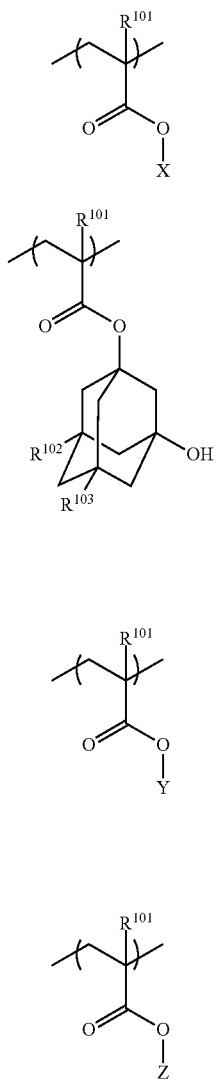

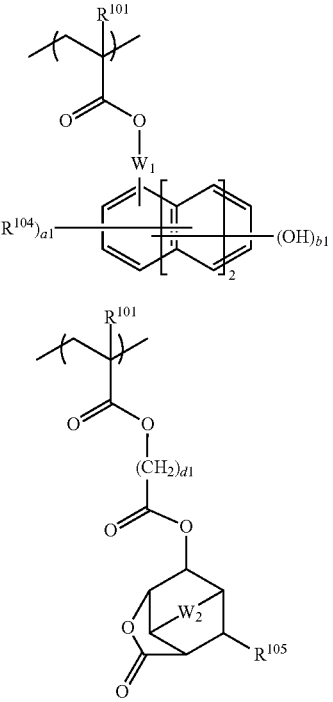

wherein $R^{101}$ is hydrogen, fluorine, methyl or trifluoromethyl, $R^{102}$ and $R^{103}$ are each independently hydrogen or hydroxyl, $R^{104}$ is hydrogen or a straight, branched or cyclic $C_1$-$C_{10}$ monovalent hydrocarbon group, $R^{105}$ is hydrogen or $CO_2R^{106}$, $R^{106}$ is hydrogen or a straight, branched or cyclic $C_1$-$C_{15}$ monovalent hydrocarbon group which may have a halogen or oxygen atom, X is an acid labile group, Y is a substituent group having a lactone structure, Z is hydrogen or a $C_1$-$C_{15}$ monovalent fluorinated hydrocarbon group, or a $C_1$-$C_{15}$ fluoroalcohol-containing substituent group, $W_1$ is a $C_1$-$C_{10}$ divalent organic group which may be substituted with oxygen, $W_2$ is $CH_2$, $CH_2CH_2$, or oxygen, a1 is an integer of 0 to 3, b1 is an integer of 1 to 3, c1 is an integer of 0 to 2, and d1 is an integer of 1 to 3.

* * * * *